United States Patent
Misaki

(10) Patent No.: US 11,387,260 B2
(45) Date of Patent: Jul. 12, 2022

(54) TFT SUBSTRATE, SCANNING ANTENNA PROVIDED WITH TFT SUBSTRATE, AND MANUFACTURING METHOD OF TFT SUBSTRATE

(71) Applicant: Sharp Kabushiki Kaisha, Sakai (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 334 days.

(21) Appl. No.: 16/628,277

(22) PCT Filed: Jul. 9, 2018

(86) PCT No.: PCT/JP2018/025918
§ 371 (c)(1),
(2) Date: Jan. 3, 2020

(87) PCT Pub. No.: WO2019/013175
PCT Pub. Date: Jan. 17, 2019

(65) Prior Publication Data
US 2020/0161342 A1    May 21, 2020

(30) Foreign Application Priority Data

Jul. 12, 2017  (JP) .............................. JP2017-136357

(51) Int. Cl.
*H01L 21/00* (2006.01)
*H01L 27/00* (2006.01)
(Continued)

(52) U.S. Cl.
CPC ........ *H01L 27/1225* (2013.01); *G02F 1/1368* (2013.01); *H01L 21/31116* (2013.01);
(Continued)

(58) Field of Classification Search
CPC ......... H01L 21/31116; H01L 21/31051; H01L 21/3212; H01L 21/2532; H01L 27/1255;
(Continued)

(56) References Cited

U.S. PATENT DOCUMENTS 7,466,269 B2 * 12/2008 Haziza ..................... H01Q 3/36
343/700 MS
8,791,459 B2 * 7/2014 Moon ............... H01L 29/66742
257/59
(Continued)

FOREIGN PATENT DOCUMENTS

JP    2007-116573 A    5/2007
JP    2007-295044 A    11/2007
(Continued)

OTHER PUBLICATIONS

Stevenson et al., "Rethinking Wireless Communications: Advanced Antenna Design using LCD Technology", SID 2015 Digest, 55.2, 2015, pp. 827-830.
(Continued)

*Primary Examiner* — Nikolay K Yushin
(74) *Attorney, Agent, or Firm* — Keating & Bennett, LLP

(57) ABSTRACT

A manufacturing method of a TFT substrate is a manufacturing method of a TFT substrate in which each of a source electrode and a drain electrode includes a lower source metal layer and an upper source metal layer. The manufacturing method of the TFT substrate includes the steps of: forming an upper source metal layer by etching an upper conductive film with the first resist layer as an etching mask; forming a lower source metal layer by etching a lower conductive film; removing the first resist layer and forming a second resist layer covering the upper source metal layer; and forming a
(Continued)

source contact portion and a drain contact portion by etching a contact layer by dry etching with the second resist layer as an etching mask.

18 Claims, 31 Drawing Sheets

(51) Int. Cl.
| | |
|---|---|
| *H01L 29/00* | (2006.01) |
| *H01Q 13/22* | (2006.01) |
| *H01Q 21/06* | (2006.01) |
| *H01Q 3/34* | (2006.01) |
| *G02F 1/1368* | (2006.01) |
| *H01L 27/12* | (2006.01) |
| *H01L 21/311* | (2006.01) |
| *H01L 29/786* | (2006.01) |
| *H01Q 3/44* | (2006.01) |
| *H01Q 21/00* | (2006.01) |

(52) U.S. Cl.
CPC ...... *H01L 27/1255* (2013.01); *H01L 29/7869* (2013.01); *H01L 29/78663* (2013.01); *H01Q 3/34* (2013.01); *H01Q 3/44* (2013.01); *H01Q 13/22* (2013.01); *H01Q 21/0087* (2013.01); *H01Q 21/06* (2013.01)

(58) Field of Classification Search
CPC ............... H01L 27/1225; H01L 27/124; H01L 27/1259; H01L 29/7869; H01L 29/78663; H01L 29/78645; H01L 29/42384; H01Q 3/34; H01Q 3/44; H01Q 3/46; H01Q 13/22; H01Q 13/10; H01Q 13/103; H01Q 21/0012; H01Q 21/06; H01Q 21/064; H01Q 21/0087; H01Q 3/443; G02F 1/1368; G02F 1/13; G02F 1/136227; G02F 1/1362; G02F 1/133345; G02F 1/136226

See application file for complete search history.

(56) References Cited

U.S. PATENT DOCUMENTS

| | | |
|---|---|---|
| 2008/0036664 A1 | 2/2008 | Haziza |
| 2012/0194399 A1 | 8/2012 | Bily et al. |
| 2014/0021475 A1* | 1/2014 | Moon .................. H01L 29/786 257/59 |
| 2018/0337446 A1 | 11/2018 | Nakazawa et al. |

FOREIGN PATENT DOCUMENTS

| | | |
|---|---|---|
| JP | 2009-538565 A | 11/2009 |
| JP | 2013-539949 A | 10/2013 |
| WO | 2015/126550 A1 | 8/2015 |
| WO | 2017/061527 A1 | 4/2017 |

OTHER PUBLICATIONS

Ando et al., "A Radial Line Slot Antenna for 12 GHz Satellite TV Reception", IEEE Transactions on Antennas and Propagation, vol. AP-33, No. 12, Dec. 1985, pp. 1347-1353.

* cited by examiner

TFT SUBSTRATE, SCANNING ANTENNA PROVIDED WITH TFT SUBSTRATE, AND MANUFACTURING METHOD OF TFT SUBSTRATE

TECHNICAL FIELD

The disclosure relates to a scanning antenna, and more particularly relates to a scanning antenna in which an antenna unit (also referred to as an "element antenna") has a liquid crystal capacitance (also referred to as a "liquid crystal array antenna"), a TFT substrate used for such a scanning antenna, and a manufacturing method of such a TFT substrate.

BACKGROUND ART

Antennas for mobile communication and satellite broadcasting require functions that can change the beam direction (referred to as "beam scanning" or "beam steering"). As an example of an antenna (hereinafter referred to as a "scanning antenna" (scanned antenna) having such functionality, phased array antennas equipped with antenna units are known. However, known phased array antennas are expensive, which is an obstacle for popularization as a consumer product. In particular, as the number of antenna units increases, the cost rises considerably.

Therefore, scanning antennas that utilize the high dielectric anisotropy (birefringence index) of liquid crystal materials (including nematic liquid crystals and polymer dispersed liquid crystals) have been proposed (PTL 1 to PTL 5 and NPL 1). Since the dielectric constant of liquid crystal materials has a frequency dispersion, in the present specification, the dielectric constant in a frequency band for microwaves (also referred to as the "dielectric constant for microwaves") is particularly denoted as "dielectric constant $M(\varepsilon_M)$".

PTL 3 and NPL 1 describe how an inexpensive scanning antenna can be obtained by using liquid crystal display (hereinafter referred to as "LCD") device technology.

The present inventors have developed a scanning antenna which can be mass-manufactured by utilizing known manufacturing techniques of LCDs. PTL 6 by the present inventors discloses a scanning antenna which can be mass-manufactured by utilizing the known manufacturing techniques of LCDs, a TFT substrate used for such a scanning antenna, and a manufacturing method and a driving method of such a scanning antenna. For reference, the entire contents disclosed in PTL 6 are incorporated herein.

CITATION LIST

Patent Literature

PTL 1: JP 2007-116573 A
PTL 2: JP 2007-295044 A
PTL 3: JP 2009-538565 A
PTL 4: JP 2013-539949 A
PTL 5: WO 2015/126550
PTL 6: WO 2017/061527

Non-Patent Literature

NPL 1: R. A. Stevenson et al., "Rethinking Wireless Communications: Advanced Antenna Design using LCD Technology", SID 2015 DIGEST, pp. 827-830.

NPL 2: M. ANDO et al., "A Radial Line Slot Antenna for 12 GHz Satellite TV Reception", IEEE Transactions of Antennas and Propagation, Vol. AP-33, No. 12, pp. 1347-1353 (1985).

SUMMARY

Technical Problem

In the course of studying various structures in order to further improve antenna performance and mass manufacturability of the scanning antenna described in PTL 6, antenna characteristics of the manufactured scanning antenna deteriorated in some cases. As described below, in the scanning antenna with deteriorated antenna characteristics, it was found that the metal was dissolved in the liquid crystal layer from the source metal layer. An object of the disclosure is to provide a scanning antenna capable of suppressing a deterioration in antenna characteristics, a TFT substrate used in such a scanning antenna, and a manufacturing method of such a TFT substrate.

Solution to Problem

A manufacturing method of a TFT substrate according to an embodiment of the disclosure is a manufacturing method of a TFT substrate, the TFT substrate including a dielectric substrate, and a plurality of antenna unit regions arrayed on the dielectric substrate, each of the plurality of antenna unit regions including a TFT and a patch electrode electrically connected to a drain electrode of the TFT, each of a source electrode and the drain electrode of the TFT including a lower source metal layer including at least one element selected from the group consisting of Ti, Ta, and W, and an upper source metal layer formed on the lower source metal layer and including Cu or Al, the manufacturing method of the TFT substrate including the steps of: (a) forming a semiconductor layer of the TFT and a contact layer in contact with a top surface of the semiconductor layer on the dielectric substrate; (b) forming a lower conductive film including at least one element selected from the group consisting of Ti, Ta, and W on the contact layer; (c) forming an upper conductive film including Cu or Al on the lower conductive film; (d) forming a first resist layer on the upper conductive film; (e) forming the upper source metal layer by etching the upper conductive film with the first resist layer as an etching mask; (f) forming the lower source metal layer by etching the lower conductive film; (g) removing the first resist layer and forming a second resist layer covering the upper source metal layer after the step (e); and (h) forming a source contact portion connecting the semiconductor layer and the source electrode, and a drain contact portion connecting the semiconductor layer and the drain electrode by etching the contact layer by dry etching with the second resist layer as an etching mask.

In an embodiment, the step (f) includes the step of forming the lower source metal layer by etching the lower conductive film with the second resist layer as an etching mask after the step (g).

In an embodiment, the step (g) includes the step of forming the second resist layer such that an edge of the second resist layer is outside an edge of the upper source metal layer when viewed from a normal direction of the dielectric substrate, and a distance of the edge of the second resist layer from the edge of the upper source metal layer is not less than five times a thickness of the lower conductive film.

In an embodiment, the step (f) includes the step of forming the lower source metal layer by etching the lower conductive film with the first resist layer as an etching mask prior to the step (g), and the step (g) includes the step of forming the second resist layer covering the upper source metal layer and the lower source metal layer after the step (e) and the step (f).

In an embodiment, an etching rate of the lower conductive film in the step (f) is less than or equal to an etching rate of the upper conductive film in the step (e).

In an embodiment, the step (e) and the step (f) include the step of forming the upper source metal layer and the lower source metal layer such that the edge of the lower source metal layer does not enter inside the edge of the upper source metal layer when viewed from the normal direction of the dielectric substrate.

A manufacturing method of a TFT substrate according to another embodiment of the disclosure is a manufacturing method of a TFT substrate, the TFT substrate including a dielectric substrate, and a plurality of antenna unit regions arrayed on the dielectric substrate, each of the plurality of antenna unit regions including a TFT and a patch electrode electrically connected to a drain electrode of the TFT, each of a source electrode and the drain electrode of the TFT including a lower source metal layer including at least one element selected from the group consisting of Ti, Ta, and W, and an upper source metal layer formed on the lower source metal layer and including Cu or Al, the manufacturing method of the TFT substrate including the steps of: (a) forming a semiconductor layer of the TFT and a contact layer in contact with a top surface of the semiconductor layer on the dielectric substrate; (b) forming a lower conductive film including at least one element selected from the group consisting of Ti, Ta, and W on the contact layer; (c) forming an upper conductive film including Cu or Al on the lower conductive film; (d) forming a resist layer on the upper conductive film; (e) forming the upper source metal layer by etching the upper conductive film with the resist layer as an etching mask such that an edge of the upper source metal layer is inside an edge of the resist layer when viewed from a normal direction of the dielectric substrate, and a distance of the edge of the upper source metal layer from the edge of the resist layer is not less than 1.2 times a thickness of the upper source metal layer; (f) forming the lower source metal layer by etching the lower conductive film with the resist layer as an etching mask; and (g) forming a source contact portion connecting the semiconductor layer and the source electrode, and a drain contact portion connecting the semiconductor layer and the drain electrode by etching the contact layer by dry etching with the resist layer as an etching mask after the step (e).

In an embodiment, the step (f) includes the step of etching the lower conductive film by using a same etchant as an etchant of the contact layer in the step (g).

In an embodiment, an etching rate of the lower conductive film in the step (f) is less than or equal to an etching rate of the upper conductive film in the step (e).

In an embodiment, the step (f) includes the step of forming the lower source metal layer such that the edge of the lower source metal layer is inside the edge of the resist layer when viewed from the normal direction of the dielectric substrate the distance of the edge of the lower source metal layer from the edge of the resist layer is not less than 1.8 times a thickness of the upper source metal layer.

In an embodiment, the step (f) includes the step of etching the lower conductive film by using a same etchant as an etchant of the upper conductive film in the step (e).

In an embodiment, the step (e) and the step (f) include the step of forming the upper source metal layer and the lower source metal layer such that the edge of the lower source metal layer does not enter inside the edge of the upper source metal layer when viewed from the normal direction of the dielectric substrate.

In an embodiment, the patch electrode includes the lower source metal layer and the upper source metal layer.

A TFT substrate according to an embodiment of the disclosure is a TFT substrate including: a dielectric substrate; and a plurality of antenna unit regions arrayed on the dielectric substrate, each of the plurality of antenna unit regions including a TFT and a patch electrode electrically connected to a drain electrode of the TFT, the TFT including: a semiconductor layer; a gate electrode; a gate insulating layer formed between the gate electrode and the semiconductor layer; a source electrode and the drain electrode formed on the semiconductor layer and electrically connected to the semiconductor layer; a source contact portion formed between the semiconductor layer and the source electrode; and a drain contact portion formed between the semiconductor layer and the drain electrode, wherein each of the source electrode and the drain electrode includes a lower source metal layer including at least one element selected from the group consisting of Ti, Ta, and W, and an upper source metal layer formed on the lower source metal layer and including Cu or Al, and an edge of the lower source metal layer is not inside an edge of the upper source metal layer when viewed from a normal direction of the dielectric substrate.

In an embodiment, a distance in a channel length direction between the source contact portion and the drain contact portion is less than a distance in a channel length direction between the upper source metal layer of the source electrode and the upper source metal layer of the drain electrode.

In an embodiment, a distance in a channel length direction between the source contact portion and the drain contact portion is less than a distance in a channel length direction between the lower source metal layer of the source electrode and the lower source metal layer of the drain electrode.

In an embodiment, the patch electrode includes the lower source metal layer and the upper source metal layer.

In an embodiment, the TFT substrate further includes an interlayer insulating layer covering the TFT. The semiconductor layer is located on the gate electrode, and the patch electrode is covered by the interlayer insulating layer.

In an embodiment, the TFT substrate further includes an interlayer insulating layer covering the TFT. The gate electrode is located on the source electrode and the drain electrode, and the gate insulating layer and/or the interlayer insulating layer have an opening overlapping the patch electrode when viewed from the normal direction of the dielectric substrate.

In an embodiment, the TFT substrate further includes an upper conductive layer formed on the interlayer insulating layer. The gate insulating layer has a first opening at least reaching the patch electrode, the interlayer insulating layer includes a second opening overlapping the first opening when viewed from the normal direction of the dielectric substrate, and the upper conductive layer includes a patch conductive portion covering the patch electrode exposed in the first opening.

A scanning antenna according to an embodiment of the disclosure includes the TFT substrate according to any one of those describe above, a slot substrate disposed to face the TFT substrate, a liquid crystal layer provided between the TFT substrate and the slot substrate, and a reflective conductive plate disposed to face a surface of the slot substrate on a side opposite to the liquid crystal layer with a dielectric layer interposed between the reflective conductive plate and the surface, wherein the slot substrate includes another dielectric substrate and a slot electrode formed on a surface of the another dielectric substrate on a side of the liquid crystal layer, and the slot electrode includes a plurality of slots, each of the plurality of slots being arranged corresponding to the patch electrode of each of the plurality of antenna unit regions of the TFT substrate.

Advantageous Effects of Disclosure

According to embodiments of the disclosure, a scanning antenna capable of suppressing a deterioration in antenna characteristics, a TFT substrate used for such a scanning antenna, and a manufacturing method of such a TFT substrate are provided.

DESCRIPTION OF EMBODIMENTS

Figure 1:
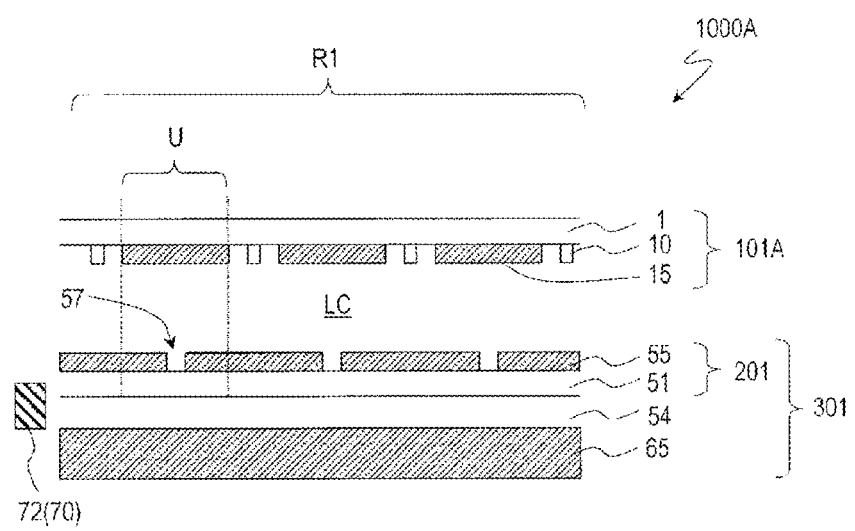
FIG. 1 is a cross-sectional view schematically illustrating a portion of a scanning antenna 1000A according to a first embodiment of the disclosure.

Hereinafter, a scanning antenna, a manufacturing method of the scanning antenna, and a TFT substrate used for the scanning antenna according to embodiments of the disclosure will be described with reference to the drawings. Note that the disclosure is not limited to the embodiments illustrated below. The embodiments of the disclosure are not limited to the drawings. For example, a thickness of a layer in a cross-sectional view, sizes of a conductive portion and an opening in the plan view, and the like are exemplary.

Basic Structure of Scanning Antenna

By controlling the voltage applied to each liquid crystal layer of each antenna unit corresponding to the pixels of the LCD panel and changing the effective dielectric constant M ($\varepsilon_M$) of the liquid crystal layer for each antenna unit, a scanning antenna equipped with an antenna unit that uses the anisotropy (birefringence index) of a large dielectric constant M ($\varepsilon_M$) of a liquid crystal material forms a two-dimensional pattern by antenna units with different electrostatic capacitances (corresponding to displaying of an image by an LCD). An electromagnetic wave (for example, a microwave) emitted from an antenna or received by an antenna is given a phase difference depending on the electrostatic capacitance of each antenna unit, and gains a strong directivity in a particular direction depending on the two-dimensional pattern formed by the antenna units having different electrostatic capacitances (beam scanning). For example, an electromagnetic wave emitted from an antenna is obtained by integrating, with consideration for the phase difference provided by each antenna unit, spherical waves obtained as a result of input electromagnetic waves entering each antenna unit and being scattered by each antenna unit. It can be considered that each antenna unit functions as a "phase shifter." For a description of the basic structure and operating principles of a scanning antenna that uses a liquid crystal material, refer to PTL 1 to PTL 4 as well as NPL 1 and NPL 2. NPL 2 discloses the basic structure of a scanning antenna in which spiral slots are arranged. For reference, the entire contents of the disclosures of PTL 1 to PTL 4 as well as NPL 1 and NPL 2 are incorporated herein.

Note that although the antenna units in the scanning antenna according to the embodiments of the disclosure are similar to the pixels of the LCD panel, a structure of the antenna units is different from the structure of the pixel of the LCD panel, and an array of the plurality of antenna units is also different from an array of the pixels in the LCD panel. A basic structure of the scanning antenna according to the embodiments of the disclosure will be described with reference to FIG. 1, which illustrates a scanning antenna 1000A of a first embodiment to be described in detail later. Although the scanning antenna 1000A is a radial in-line slot antenna in which slots are concentrically arrayed, the scanning antennas according to the embodiments of the disclosure are not limited to this. For example, the array of the slots may be any of various known arrays. In particular, with respect to the slot and/or antenna unit arrangements, the entire disclosure of PTL 5 is incorporated herein by reference.

FIG. 1 is a cross-sectional view schematically illustrating a portion of the scanning antenna 1000A of the present embodiment, and schematically illustrates a part of the cross-section along a radial direction from a power feed pin 72 (see FIG. 2(b)) provided near the center of the concentrically arrayed slots.

The scanning antenna 1000A includes a TFT substrate 101A, a slot substrate 201, a liquid crystal layer LC provided therebetween, and a reflective conductive plate 65 opposing the slot substrate 201 with an air layer 54 interposed between the slot substrate 201 and the reflective conductive plate 65. The scanning antenna 1000A transmits and/or receives microwaves to and/or from a TFT substrate 101A side.

The TFT substrate 101A includes a dielectric substrate 1 such as a glass substrate, and a plurality of patch electrodes 15 and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on a side of the dielectric substrate 51 closer to the liquid crystal layer LC. The slot electrode 55 includes a plurality of slots 57.

The reflective conductive plate 65 is disposed opposing the slot substrate 201 with the air layer 54 interposed between the reflective conductive plate 65 and the slot substrate 201. In place of the air layer 54, a layer formed of a dielectric (for example, a fluorine resin such as PTFE) having a small dielectric constant M for microwaves can be used. The slot electrode 55, the reflective conductive plate 65, and the dielectric substrate 51 and the air layer 54 therebetween function as a waveguide 301.

The patch electrode 15, the portion of the slot electrode 55 including the slot 57, and the liquid crystal layer LC therebetween constitute an antenna unit U. In each antenna unit U, one patch electrode 15 is opposed to a portion of the slot electrode 55 including one slot 57 with a liquid crystal layer LC interposed therebetween, thereby constituting the liquid crystal capacitance. Each antenna unit U includes an auxiliary capacitance electrically connected in parallel with the liquid crystal capacitance (see FIG. 3). The antenna unit U of the scanning antenna 1000A and a pixel of the LCD panel have a similar configuration. However, the scanning antenna 1000A has many differences from the LCD panel.

First, the performance required for the dielectric substrates 1 and 51 of the scanning antenna 1000A is different from the performance required for the substrate of the LCD panel.

Generally, transparent substrates that are transparent to visible light are used for LCD panels. For example, glass substrates or plastic substrates are used. In reflective LCD panels, since the substrate on the back side does not need transparency, a semiconductor substrate may be used in some cases. In contrast to this, it is preferable for the dielectric substrates 1 and 51 used for the antennas to have small dielectric losses with respect to microwaves (where the dielectric tangent with respect to microwaves is denoted as tan $\delta_M$). The tan $\delta_M$ of each of the dielectric substrates 1 and 51 is preferably approximately less than or equal to 0.03, and more preferably less than or equal to 0.01. Specifically, a glass substrate or a plastic substrate can be used. Glass substrates are superior to plastic substrates with respect to dimensional stability and heat resistance, and are suitable for forming circuit elements such as TFTs, a wiring line, and electrodes using LCD technology. For example, in a case where the materials forming the waveguide are air and glass, as the dielectric loss of glass is greater, from the viewpoint that thinner glass can reduce the waveguide loss, it is preferable for the thickness to be less than or equal to 400 µm, and more preferably less than or equal to 300 µm. There is no particular lower limit, provided that the glass can be handled such that it does not break in the manufacturing process.

The conductive material used for the electrode is also different. In many cases, an ITO film is used as a transparent conductive film for pixel electrodes and counter electrodes of LCD panels. However, ITO has a large tan $\delta_M$ with respect to microwaves, and as such cannot be used as the conductive layer in an antenna. The slot electrode 55 functions as a wall for the waveguide 301 together with the reflective conductive plate 65. Accordingly, to suppress the transmission of microwaves in the wall of the waveguide 301, it is preferable that the thickness of the wall of the waveguide 301, that is, the thickness of the metal layer (Cu layer or Al layer) be large. It is known that in a case where the thickness of the metal layer is three times the skin depth, electromagnetic waves are attenuated to 1/20 (−26 dB), and in a case where the thickness is five times the skin depth, electromagnetic waves are attenuated to about 1/150 (−43 dB). Accordingly, in a case where the thickness of the metal layer is five times the skin depth, the transmittance of electromagnetic waves can be reduced to 1%. For example, for a microwave of 10 GHz, in a case where a Cu layer having a thickness of greater than or equal to 3.3 µm and an Al layer having a thickness of greater than or equal to 4.0 µm are used, microwaves can be reduced to $1/150$. In addition, for a microwave of 30 GHz, in a case where a Cu layer having a thickness of greater than or equal to 1.9 µm and an Al layer having a thickness of greater than or equal to 2.3 m are used, microwaves can be reduced to $1/150$. In this way, the slot electrode 55 is preferably formed of a relatively thick Cu layer or Al layer. There is no particular upper limit for the thickness of the Cu layer or the Al layer, and the thicknesses can be set appropriately in consideration of the time and cost of film formation. The usage of a Cu layer provides the advantage of being thinner than the case of using an Al layer. Relatively thick Cu layers or Al layers can be formed not only by the thin film deposition method used in LCD manufacturing processes, but also by other methods such as bonding Cu foil or Al foil to the substrate. The thickness of the metal layer, for example, ranges from 2 µm to 30 µm. In a case where the thin film deposition methods are used, the thickness of the metal layer is preferably less than or equal to 5 µm. Note that aluminum plates, copper plates, or the like having a thickness of several mm can be used as the reflective conductive plate 65, for example.

Since the patch electrode 15 does not configure the waveguide 301 like the slot electrode 55, a Cu layer or an Al layer can be used that has a smaller thickness than that of the slot electrode 55. However, to avoid losses caused by heat when the oscillation of free electrons near the slot 57 of the slot electrode 55 induces the oscillation of the free electrons in the patch electrode 15, it is preferable that the resistance be low. From the viewpoint of mass production, it is preferable to use an Al layer rather than a Cu layer, and the thickness of the Al layer is preferably greater than or equal to 0.3 µm and less than or equal to 2 µm, for example.

In addition, an arrangement pitch of the antenna units U is considerably different from that of a pixel pitch. For example, considering an antenna for microwaves of 12 GHz (Ku band), the wavelength λ is 25 mm, for example. Then, as described in PTL 4, since the pitch of the antenna unit U is less than or equal to λ/4 and/or less than or equal to λ/5, the pitch becomes less than or equal to 6.25 mm and/or less than or equal to 5 mm. This is ten times greater than the pixel pitch of the LCD panel. Accordingly, the length and width of the antenna unit U are also roughly ten times greater than the pixel length and width of the LCD panel.

Of course, the array of the antenna units U may be different from the array of the pixels in the LCD panel. Herein, although an example is illustrated in which the antenna units U are arrayed in concentric circles (for example, refer to JP 2002-217640 A), the present disclosure is not limited thereto, and the antenna units may be arrayed in a spiral shape as described in NPL 2, for example. Furthermore, the antenna units may be arrayed in a matrix as described in PTL 4.

The properties required for the liquid crystal material of the liquid crystal layer LC of the scanning antenna 1000A are different from the properties required for the liquid crystal material of the LCD panel. In the LCD panel, a change in a refractive index of the liquid crystal layer of the pixels allows a phase difference to be provided to the polarized visible light (wavelength of from 380 nm to 830 nm) such that the polarization state is changed (for example, the change in the refractive index allows the polarization axis direction of linearly polarized light to be rotated or the degree of circular polarization of circularly polarized light to be changed), whereby display is performed. In contrast, in the scanning antenna 1000A according to the embodiment, the phase of the microwave excited (re-radiated) from each patch electrode is changed by changing the electrostatic capacitance value of the liquid crystal capacitance of the antenna unit U. Accordingly, the liquid crystal layer preferably has a large anisotropy ($\Delta\varepsilon_M$) of the dielectric constant M ($\varepsilon_M$) for microwaves, and tan $\delta_M$ is preferably small. For example, the $\Delta\varepsilon_M$ of greater than or equal to 4 and tan $\delta_M$ of less than or equal to 0.02 (values of 19 GHz in both cases) described in SID 2015 DIGEST pp. 824-826 written by M. Wittek et al, can be suitably used. In addition, it is possible to use a liquid crystal material having a $\Delta\varepsilon_M$ of greater than or equal to 0.4 and tan $\delta_M$ of less than or equal to 0.04 as described in POLYMERS 55 vol. August issue pp. 599-602 (2006), written by Kuki.

In general, the dielectric constant of a liquid crystal material has a frequency dispersion, but the dielectric anisotropy $\Delta\varepsilon_M$ for microwaves has a positive correlation with the refractive index anisotropy Δn with respect to visible light. Accordingly, it can be said that a material having a large refractive index anisotropy Δn with respect to visible light is preferable as a liquid crystal material for an antenna unit for microwaves. The refractive index anisotropy Δn of the liquid crystal material for LCDs is evaluated by the refractive index anisotropy for light having a wavelength of 550 nm. Here again, when a Δn (birefringence index) is used as an index for light having a wavelength of 550 nm, a nematic liquid crystal having a Δn of greater than or equal to 0.3, preferably greater than or equal to 0.4, can be used for an antenna unit for microwaves. Δn has no particular upper limit. However, since liquid crystal materials having a large Δn tend to have a strong polarity, there is a possibility that reliability may decrease. From the viewpoint of reliability, Δn is preferably less than or equal to 0.4. The thickness of the liquid crystal layer is, for example, from 1 µm to 500 µm.

Hereinafter, the structure and manufacturing method of the scanning antenna according to the embodiments of the disclosure will be described in more detail.

First Embodiment

Figure 2:
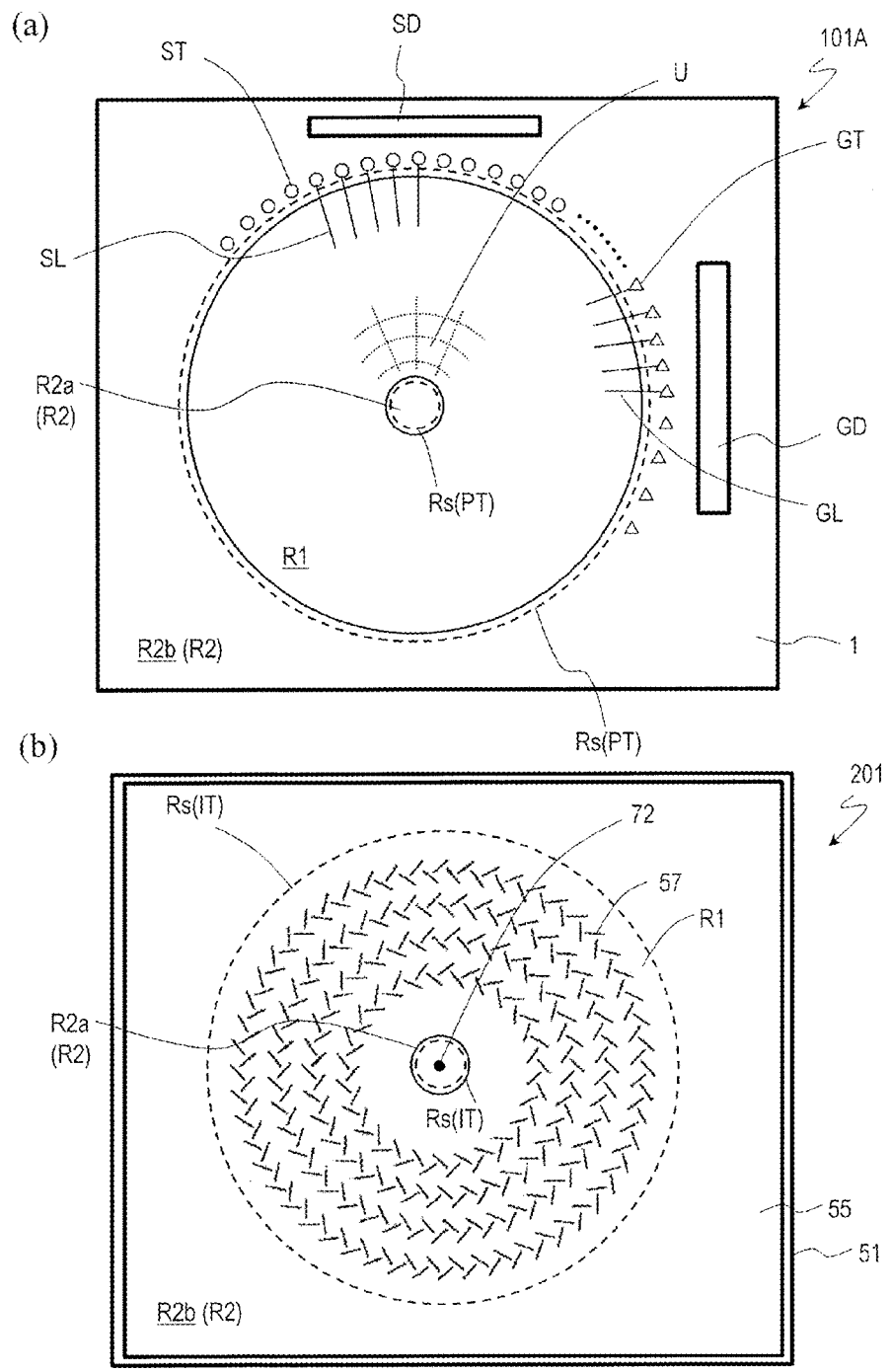
FIGS. 2(a) and 2(b) are schematic plan views illustrating a TFT substrate 101A and a slot substrate 201 included in the scanning antenna 1000A, respectively.

First, a description is given with reference to FIG. 1 and FIG. 2. FIG. 1 is a schematic partial cross-sectional view of the scanning antenna 1000A near the center thereof as described above in detail, and FIGS. 2(a) and 2(b) are schematic plan views illustrating the TFT substrate 101A and the slot substrate 201 included in the scanning antenna 1000A, respectively.

The scanning antenna 1000A includes a plurality of antenna units U arrayed two-dimensionally. In the scanning antenna 1000A exemplified here, the plurality of antenna units are arrayed concentrically. In the following description, the region of the TFT substrate 101A and the region of the slot substrate 201 corresponding to the antenna unit U will be referred to as "antenna unit region," and be denoted with the same reference numeral U as the antenna unit. In addition, as illustrated in FIGS. 2(a) and 2(b), in the TFT substrate 101A and the slot substrate 201, a region defined by the plurality of two-dimensionally arranged antenna unit regions is referred to as a "transmission and/or reception region R1," and a region other than the transmission and/or reception region R1 is referred to as a "non-transmission and/or reception region R2." A terminal section, a driving circuit, and the like are provided in the non-transmission and/or reception region R2.

FIG. 2(a) is a schematic plan view illustrating the TFT substrate 101A included in the scanning antenna 1000A.

In the illustrated example, the transmission and/or reception region R1 has a donut-shape when viewed from a normal direction of the TFT substrate 101A. The non-transmission and/or reception region R2 includes a first non-transmission and/or reception region R2a located at the center of the transmission and/or reception region R1 and a second non-transmission and/or reception region R2b located at the periphery of the transmission and/or reception region R1. An outer diameter of the transmission and/or reception region R1, for example, is from 200 mm to 1500 mm, and is configured according to a communication traffic volume or the like.

A plurality of gate bus lines GL and a plurality of source bus lines SL supported by the dielectric substrate 1 are provided in the transmission and/or reception region R1 of the TFT substrate 101A, and the antenna unit regions U are defined by these wiring lines. The antenna unit regions U are, for example, arranged concentrically in the transmission and/or reception region R1. Each of the antenna unit regions U includes a TFT and a patch electrode electrically connected to the TFT. The source electrode of the TFT is electrically connected to the source bus line SL, and the gate electrode is electrically connected to the gate bus line GL. In addition, the drain electrode is electrically connected to the patch electrode.

In the non-transmission and/or reception region R2 (R2a, R2b), a seal region Rs is disposed surrounding the transmission and/or reception region R1. A sealing member (not illustrated) is applied to the seal region Rs. The sealing member bonds the TFT substrate 101A and the slot substrate 201 to each other, and also encloses liquid crystals between these substrates 101A and 201.

A gate terminal section GT, the gate driver GD, a source terminal section ST, and the source driver SD are provided outside the seal region Rs in the non-transmission and/or reception region R2. Each of the gate bus lines GL is connected to the gate driver GD with the gate terminal section GT therebetween. Each of the source bus lines SL is connected to the source driver SD with the source terminal section ST therebetween. Note that, in this example, although the source driver SD and the gate driver GD are formed on the dielectric substrate 1, one or both of these drivers may be provided on another dielectric substrate.

Also, a plurality of transfer terminal sections PT are provided in the non-transmission and/or reception region R2. The transfer terminal section PT is electrically connected to the slot electrode 55 (FIG. 2(b)) of the slot substrate 201. In the present specification, the connection section between the transfer terminal section PT and the slot electrode 55 is referred to as a "transfer section." As illustrated in drawings, the transfer terminal section PT (transfer section) may be disposed in the seal region Rs. In this case, a resin containing conductive particles may be used as the sealing member. In this way, liquid crystals are sealed between the TFT substrate 101A and the slot substrate 201, and an electrical connection can be secured between the transfer terminal section PT and the slot electrode 55 of the slot substrate 201. In this example, although a transfer terminal section PT is disposed in both the first non-transmission and/or reception region R2a and the second non-transmission and/or reception region R2b, the transfer terminal section PT may be disposed in only one of them.

Note that the transfer terminal section PT (transfer section) need not be disposed in the seal region Rs. For example, the transfer terminal section PT may be disposed outside the seal region Rs in the non-transmission and/or reception region R2.

FIG. 2(b) is a schematic plan view illustrating the slot substrate 201 in the scanning antenna 1000A, and illustrates the surface of the slot substrate 201 closer to the liquid crystal layer LC.

In the slot substrate 201, the slot electrode 55 is formed on the dielectric substrate 51 extending across the transmission and/or reception region R1 and the non-transmission and/or reception region R2.

In the transmission and/or reception region R1 of the slot substrate 201, a plurality of slots 57 are formed in the slot electrode 55. The slots 57 are formed corresponding to the antenna unit region U on the TFT substrate 101A. For the plurality of slots 57 in the illustrated example, a pair of slots 57 extending in directions substantially orthogonal to each other are concentrically arrayed so that a radial in-line slot antenna is configured. Since the scanning antenna 1000A includes slots that are substantially orthogonal to each other, the scanning antenna 1000A can transmit and/or receive circularly polarized waves.

A plurality of terminal sections IT of the slot electrode 55 are provided in the non-transmission and/or reception region R2. The terminal section IT is electrically connected to the transfer terminal section PT (FIG. 2(a)) of the TFT substrate 101A. In this example, the terminal section IT is disposed within the seal region Rs, and is electrically connected to a corresponding transfer terminal section PT by a sealing member containing conductive particles.

In addition, the power feed pin 72 is disposed on a rear surface side of the slot substrate 201 in the first non-transmission and/or reception region R2a. The power feed pin 72 allows microwaves to be inserted into the waveguide 301 constituted by the slot electrode 55, the reflective conductive plate 65, and the dielectric substrate 51. The power feed pin 72 is connected to a power feed device 70. Power feeding is performed from the center of the concentric circle in which the slots 57 are arrayed. The power feed method may be either a direct coupling power feed method or an electromagnetic coupling method, and a known power feed structure can be utilized.

In FIGS. 2(a) and 2(b), an example is illustrated in which the seal region Rs is provided so as to surround a relatively narrow region including the transmission and/or reception region R1, but the arrangement of the seal region Rs is not limited to this. In particular, the seal region Rs provided outside the transmission and/or reception region R1 may be provided nearby the side of the dielectric substrate 1 and/or the dielectric substrate 51, for example, so as to maintain a certain distance or more from the transmission and/or reception region R1. Of course, the terminal section and the driving circuit, for example, that are provided in the non-transmission and/or reception region R2 may be formed outside the seal region Rs (that is, the side where the liquid crystal layer is not present). By forming the seal region Rs at a position separated from the transmission and/or reception region R1 by a certain distance or more, it is possible to prevent the antenna characteristics from deteriorating due to the influence of impurities (in particular, ionic impurities) contained in the sealing member (in particular, a curable resin).

TFT Substrate 101R of Reference Example 1
(Antenna Unit Region U)

Prior to describing the detailed structure of the TFT substrate 101A of the present embodiment, first, the TFT substrate 101R of Reference Example 1 will be described. In a case where the inventors prototyped and drove a scanning antenna equipped with the TFT substrate 101R of Reference Example 1, the antenna characteristics were deteriorated in some cases. Note that, in the following description, descriptions of configurations that are common to the TFT substrate 101A of the present embodiment may be omitted.

Figure 3:
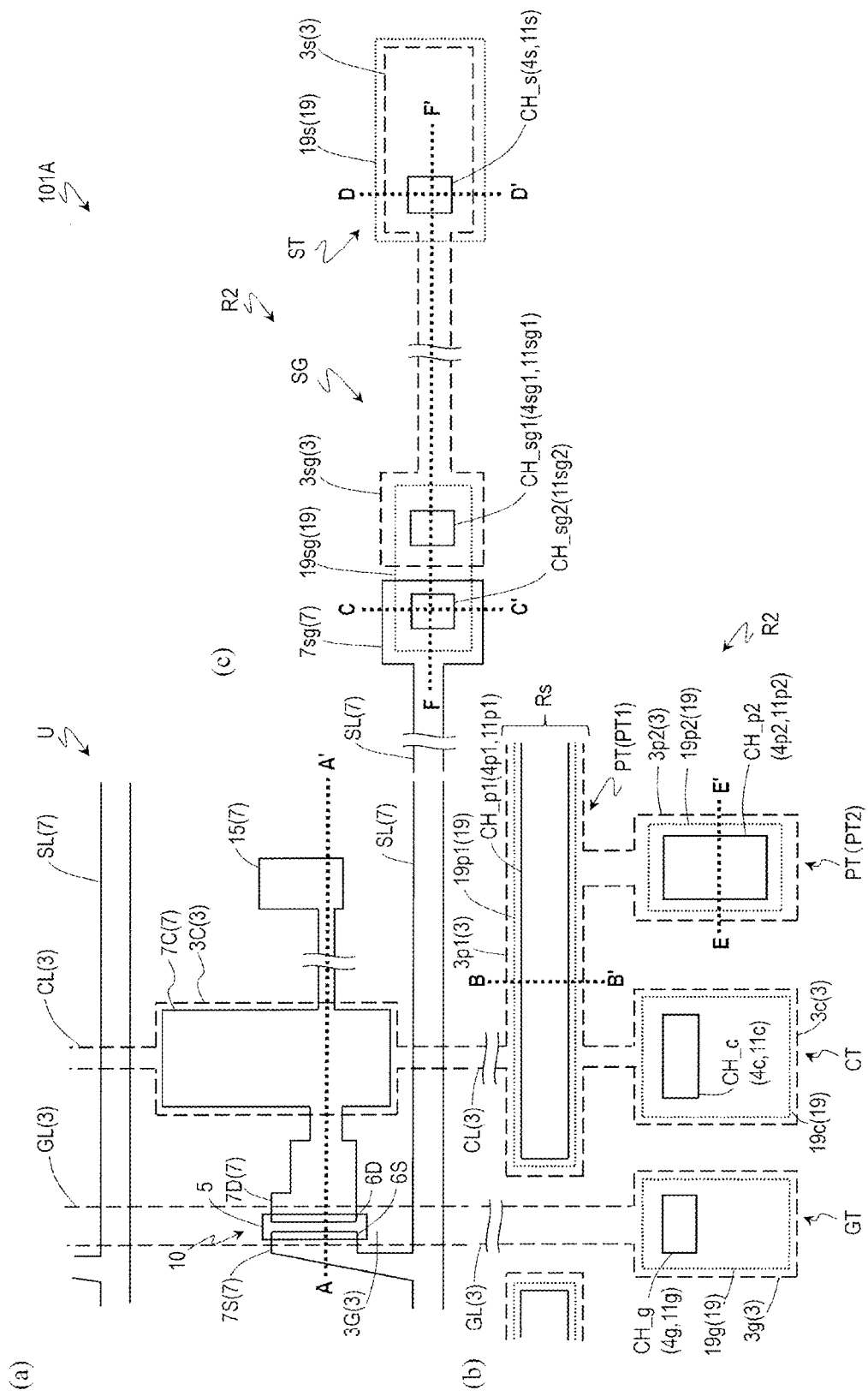
FIG. 3(a) is a schematic plan view of an antenna unit region U of a transmission and/or reception region R1 of the TFT substrate 101A.
FIGS. 3(b) and 3(c) are schematic plan views of a non-transmission and/or reception region R2 of the TFT substrate 101A.
Figure 6:
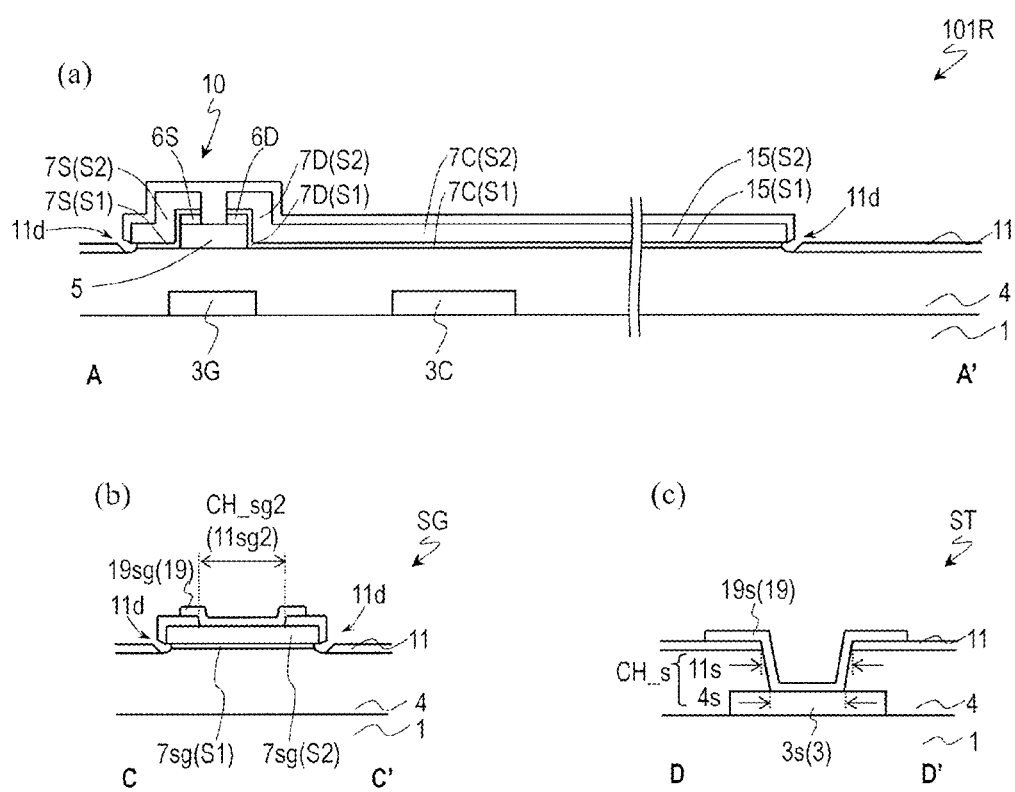
FIGS. 6(a) to 6(c) are schematic cross-sectional views of a TFT substrate 101R of Reference Example 1.

Referring to FIG. 3(a) and FIG. 6(a), the TFT substrate 101R of Reference Example 1 will be described. FIG. 3(a) is a schematic plan view of the antenna unit region U of the transmission and/or reception region R1 of the TFT substrate 101A. Here, a case in which the plan view of the TFT substrate 101R of Reference Example 1 is the same as the plan view of the TFT substrate 101A illustrated in FIG. 3 will be described as an example, so reference may be also made to FIG. 3 in the description of the TFT substrate 101R of Reference Example 1. FIG. 6(a) is a schematic cross-sectional view of the antenna unit region U of the TFT substrate 101R of Reference Example 1, and illustrates a cross-sectional view along the line A-A' in FIG. 3. In FIG. 6, common reference numerals may be denoted to components common to the TFT substrate 101A of the present embodiment.

As illustrated in FIG. 3(a) and FIG. 6(a), the TFT substrate 101R of Reference Example 1 includes a dielectric substrate 1 and a plurality of antenna unit regions U arrayed on the dielectric substrate 1 and each including TFT 10 and a patch electrode 15 electrically connected to a drain electrode 7D of the TFT 10. The TFT 10 includes a semiconductor layer 5, a gate electrode 3G, a gate insulating layer 4 formed between the gate electrode 3G and the semiconductor layer 5, a source electrode 7S and a drain electrode 7D formed on the semiconductor layer 5 and electrically connected to the semiconductor layer 5, a source contact portion 6S formed between the semiconductor layer 5 and the source electrode 7S, and a drain contact portion 6D formed between the semiconductor layer 5 and the drain electrode 7D. As illustrated in FIG. 6(a), each of the source electrode 7S and the drain electrode 7D includes a lower source metal layer S1 that includes at least one element selected from the group consisting of Ti, Ta, and W, and an upper source metal layer S2 formed on the lower source metal layer S1 and including Cu or Al. The source metal layer 7 including the source electrode 7S and the drain electrode 7D includes a lower source metal layer S1 and an upper source metal layer S2. When viewed from the normal direction of the dielectric substrate 1, the edge of the lower source metal layer S1 is inside the edge of the upper source metal layer S2.

Note that in the plan view, for simplicity, the edges of the lower source metal layer S1 and the edges of the upper source metal layer S2 may not be distinguished. Similarly, the edges of the source contact portion 6S and the drain contact portion 6D may not be distinguished from the edges of the lower source metal layer S1 and/or the edges of the upper source metal layer S2.

As illustrated in FIG. 6(a), in the TFT substrate 101R of Reference Example 1, when viewed from the normal direction of the dielectric substrate 1, the edge of the lower source metal layer S1 is inside the edge of the upper source metal layer S2. In other words, the source metal layer 7 includes a reverse tapered side surface. In the present specification, when viewed from the normal direction of the dielectric substrate 1, a structure in which the edge of the lower source metal layer S1 is inside the edge of the upper source metal layer S2 may be referred to as "reverse tapered" or a "reverse tapered side surface". By the side surface of the source metal layer 7 being reverse tapered, defects 11d are generated in the inorganic layer formed on the source metal layer 7 (here, the interlayer insulating layer 11 formed to cover the TFT 10). In the present specification, points where the source metal layer 7 is not completely covered by the inorganic layer (an inorganic insulating layer or an oxide conductive layer (for example, ITO)) formed on the source metal layer 7 are referred to as defects of the inorganic layer. In the defect 11d of the interlayer insulating layer 11, for example, the interlayer insulating layer 11 is discontinuous.

Note that, in the cross-sectional view, for simplicity, the gate insulating layer 4 and/or the interlayer insulating layer 11 may be represented as a flattened layer, but in general, a layer formed by a thin film deposition method (for example, a CVD, a sputtering, or a vacuum vapor deposition method) has a surface that reflects the step of the underlayer.

It was found the liquid crystal material deteriorates and the antenna characteristics are deteriorated by dissolving metal ions (Cu ions or Al ions) from the source metal layer 7 into the liquid crystal layer in the scanning antenna equipped with the TFT substrate 101R of Reference Example 1 since the interlayer insulating layer 11 of the TFT substrate 101R of Reference Example 1 includes defects 11d.

In this example, among the electrodes and the conductive portions included in the source metal layer 7, metal ions are dissolved from any electrode or conductive portion including the upper source metal layer S2. For example, in the illustrated example, the source metal layer 7 includes the source electrode 7S, the drain electrode 7D, and the patch electrode 15, and each of the source electrode 7S, the drain electrode 7D, and the patch electrode 15 includes the lower source metal layer S1 and the upper source metal layer S2. Therefore, metal ions are dissolved from any of these electrodes.

As described above, the scanning antenna controls the voltage applied to each liquid crystal layer of each antenna unit to change the effective dielectric constant M ($\varepsilon_M$) of the liquid crystal layer for each antenna unit, and thereby, forms a two-dimensional pattern by antenna units with different electrostatic capacitances. The specific resistance of a liquid crystal material having large dielectric anisotropy $\Delta\varepsilon_M$ (birefringence index $\Delta n$ with respect to visible light) in the microwave region is low, and therefore, the retention rate of the voltage applied to the liquid crystal capacitance is low. In a case where the voltage holding rate of the liquid crystal capacitance decreases, the effective voltage applied to the liquid crystal layer decreases, and the target voltage is not applied to the liquid crystal layer. As a result, the phase difference given by the liquid crystal layer of the antenna unit to the microwave deviates from a predetermined value. In a case where the phase difference deviates from a predetermined value, the antenna characteristics are deteriorated. In practice, since the scanning antenna is designed to have a maximum gain at a predetermined resonant frequency, the decrease in voltage holding rate appears as, for example, a decrease in gain.

Liquid crystal materials having a large dielectric anisotropy $\Delta\varepsilon_M$ in the microwave region include, for example, an isothiocyanate group (—NCS) or a thiocyanate group (—SCN). The liquid crystal materials including an isothiocyanate group or a thiocyanate group are prone to deterioration. In a case where the liquid crystal material degrades, the specific resistance further decreases, and the voltage holding rate further decreases. The liquid crystal materials including an isothiocyanate group or a thiocyanate group have strong polarity, and chemical stability is lower compared to the liquid crystal materials currently used in LCD.

Since the isothiocyanate group and the thiocyanate group have strong polarity, it is easy to absorb moisture and may react with metal ions (e.g., Cu ions or Al ions). As DC voltage continues to be applied, an electrical decomposition reaction may occur. The liquid crystal material including an isothiocyanate group or a thiocyanate group absorbs light from the ultraviolet region to near 430 nm and is easily photolyzed. The liquid crystal material including an isothiocyanate group or a thiocyanate group is relatively weak even for heat. As a result, the specific resistance of the liquid crystal material decreases and/or the ionic impurities increase, so the voltage holding rate of the liquid crystal capacitance decreases.

According to the study by the present inventors, it was found that the structure in which the edge of the lower source metal layer S1 is inside the edge of the upper source metal layer S2 when viewed from the normal direction of the dielectric substrate 1 of the TFT substrate 101R of Reference Example 1 is generated due to the manufacturing process of the TFT substrate 101R of Reference Example 1. The manufacturing method of the TFT substrate 101R of Reference Example 1 and the manufacturing method of the TFT substrate 101A of the present embodiment are described later.

Structure of TFT Substrate 101A (Antenna Unit Region U)

The structure of the antenna unit region U of the transmission and/or reception region R1 of the TFT substrate 101A of the present embodiment will be described with reference to FIG. 3(a) and FIG. 4(a).

FIG. 3(a) is a schematic plan view of the antenna unit region U of the transmission and/or reception region R1 of the TFT substrate 101A. FIG. 4(a) is a schematic cross-sectional view of the TFT substrate 101A, showing a cross-section taken along the line A-A' in FIG. 3(a).

As illustrated in FIG. 3(a) and FIG. 4(a), the TFT substrate 101A includes a dielectric substrate 1 and a plurality of antenna unit regions U arrayed on the dielectric substrate 1 and each including TFT 10 and a patch electrode 15 electrically connected to a drain electrode 7D of the TFT 10. The TFT 10 includes a semiconductor layer 5, a gate electrode 3G, a gate insulating layer 4 formed between the gate electrode 3G and the semiconductor layer 5, a source electrode 7S and a drain electrode 7D formed on the semiconductor layer 5 and electrically connected to the semiconductor layer 5, a source contact portion 6S formed between the semiconductor layer 5 and the source electrode 7S, and a drain contact portion 6D formed between the semiconductor layer 5 and the drain electrode 7D. Each of the source electrode 7S and the drain electrode 7D includes a lower source metal layer S1 that includes at least one element selected from the group consisting of Ti, Ta, and W, and an upper source metal layer S2 formed on the lower source metal layer S1 and including Cu or Al.

In the TFT substrate 101A, unlike the TFT substrate 101R of Reference Example 1, when viewed from the normal direction of the dielectric substrate 1, the edge of the lower source metal layer S1 is not inside the edge of the upper source metal layer S2. That is, when viewed from the normal direction of the dielectric substrate 1, the edge of the lower source metal layer S1 is outside the edge of the upper source metal layer S2, or the edge of the lower source metal layer S1 overlaps with the edge of the upper source metal layer S2.

The source metal layer 7 of the TFT substrate 101A does not include a reverse tapered side surface. In other words, the source metal layer 7 includes a tapered or vertical side surface. In the present specification, when viewed from the normal direction of the dielectric substrate 1, a structure in which the edge of the lower source metal layer S1 is outside the edge of the upper source metal layer S2 may be referred to as "tapered" or a "tapered side surface". Since the side surface of the source metal layer 7 is tapered or vertical, the source metal layer 7 can be completely covered by the inorganic layer (here, the interlayer insulating layer 11) formed on the source metal layer 7. As a result, in the scanning antenna 1000A equipped with the TFT substrate 101A, it is possible to suppress the dissolving of metal ions (Cu ions or Al ions) in the liquid crystal layer LC from the source metal layer 7. The scanning antenna 1000A can suppress a deterioration in antenna characteristics.

The structure of the TFT substrate 101A in the antenna unit region U will be described in detail.

As illustrated in FIG. 3(a) and FIG. 4(a), the TFT substrate 101A includes a gate metal layer 3 supported by the dielectric substrate 1, a semiconductor layer 5 formed on the gate metal layer 3, and a gate insulating layer 4 formed between the gate metal layer 3 and the semiconductor layer 5, a source metal layer 7 formed on the semiconductor layer 5, a source contact portion 6S and a drain contact portion 6D formed between the semiconductor layer 5 and the source metal layer 7, and an interlayer insulating layer 11 formed on the source metal layer 7. The interlayer insulating layer 11 is formed to cover the TFT 10. The TFT substrate 101A further includes an upper conductive layer 19 formed on the interlayer insulating layer 11, as described below in the structure of the non-transmission and/or reception region R2 of the TFT substrate 101A.

As illustrated in FIG. 3(a) and FIG. 4(a), the TFT 10 of each antenna unit region U of the TFT substrate 101A is a TFT having a bottom gate structure. In other words, the semiconductor layer 5 is positioned on the gate electrode 3G. The TFT 10 has a top contact structure in which the source electrode 7S and the drain electrode 7D are disposed on the semiconductor layer 5.

The semiconductor layer 5 is disposed overlapping the gate electrode 3G with the gate insulating layer 4 interposed therebetween.

The source contact portion 6S and the drain contact portion 6D are disposed on both sides of a region (channel region) in the semiconductor layer 5 where a channel is formed when viewed from the normal direction of the dielectric substrate 1. Here, the source contact portion 6S and the drain contact portion 6D are formed so as to contact the top surface of the semiconductor layer 5. The semiconductor layer 5 is, for example, an intrinsic amorphous silicon (i-a-Si) layer, and the source contact portion 6S and the drain contact portion 6D are, for example, $n^+$ type amorphous silicon ($n^+$-a-Si) layers. The semiconductor layer 5 may be a crystalline silicon layer (e.g., a polysilicon layer).

The source electrode 7S and the drain electrode 7D are electrically connected to the semiconductor layer 5 via the source contact portion 6S and the drain contact portion 6D, respectively. Here, the source electrode 7S is provided so as to be in contact with the source contact portion 6S, and the drain electrode 7D is provided so as to be in contact with the drain contact portion 6D.

The gate electrode 3G is electrically connected to the gate bus line GL, and supplied with a scanning signal voltage via the gate bus line GL. The source electrode 7S is electrically connected to the source bus line SL, and is supplied with a data signal voltage via the source bus line SL. In this example, the gate electrode 3G and the gate bus line GL are formed of the same conductive film (gate conductive film). Here, the source electrode 7S, the drain electrode 7D, and the source bus line SL are formed of the same conductive film (source conductive film). The gate conductive film and the source conductive film are, for example, metal films.

In the present specification, a layer formed using a gate conductive film and including the gate electrode 3G may be referred to as a "gate metal layer 3," and a layer formed using a source conductive film and including the source electrode 7S may be referred to as a "source metal layer 7." The gate metal layer 3 includes the gate electrode 3G of the TFT 10 and the gate bus line GL, and the source metal layer 7 includes the source electrode 7S and the drain electrode 7D of the TFT 10, and the source bus line SL. The source metal layer 7 includes the lower source metal layer S1 and the upper source metal layer S2.

Here, the patch electrode 15 is included in the source metal layer 7. The patch electrode 15 includes the lower source metal layer S1 and the upper source metal layer S2. The patch electrode 15 is covered by the interlayer insulating layer 11. In this example, the patch electrode 15 includes a Cu layer or an Al layer as a main layer. The upper source metal layer S2 of the patch electrode 15 may be referred to as a "main layer".

The upper source metal layer S2 may have a layered structure of a layer containing Cu or Al (typically a Cu layer or Al layer) and a high melting-point metal containing layer. For example, the high melting-point metal containing layer may be formed on a layer that includes Cu or Al. The "high melting-point metal containing layer" is a layer containing at least one element selected from the group consisting of titanium (Ti), tungsten (W), molybdenum (Mo), tantalum (Ta), and niobium (Nb). The "high melting-point metal containing layer" may have a layered structure. For example, the high melting-point metal containing layer refers to a layer formed of any of Ti, W, Mo, Ta, Nb, an alloy containing these, and a nitride of these, and a solid solution of the above metal(s) or alloy and the nitride.

A performance of the scanning antenna correlates with an electric resistance of the patch electrode 15, and a thickness of the main layer is set so as to obtain a desired resistance. In terms of the electric resistance, there is a possibility that the thickness of the patch electrode 15 can be made thinner in the Cu layer than in the Al layer. The thickness of the main layer included in the patch electrode 15 is configured to be for example 0.3 μm or greater in a case of being formed from an Al layer, and is configured to be for example 0.2 μm or greater in a case of being formed from a Cu layer.

Here, each antenna unit region U includes an auxiliary capacitance electrically connected in parallel with the liquid crystal capacitance. In this example, the auxiliary capacitance is constituted by an auxiliary capacitance electrode 7C electrically connected to the drain electrode 7D, the gate insulating layer 4, and an auxiliary capacitance counter electrode 3C opposite to the auxiliary capacitance electrode 7C with the gate insulating layer 4 interposed therebetween. The auxiliary capacitance counter electrode 3C is included in the gate metal layer 3, and the auxiliary capacitance electrode 7C is included in the source metal layer 7. The gate metal layer 3 further includes a CS bus line (auxiliary capacitance line) CL connected to the auxiliary capacitance counter electrode 3C. The CS bus line CL extends substantially in parallel with the gate bus line GL, for example. In this example, the auxiliary capacitance counter electrode 3C is integrally formed with the CS bus line CL. The width of the auxiliary capacitance counter electrode 3C may be greater than the width of the CS bus line CL. In this example, the auxiliary capacitance electrode 7C extends from the drain electrode 7D. A width of the auxiliary capacitance electrode 7C may be larger than a width of a portion extending from the drain electrode 7D except for the auxiliary capacitance electrode 7C. Note that an arrangement relationship between the auxiliary capacitance and the patch electrode 15 is not limited to the example illustrated in the drawing.

Structure of TFT Substrate 101A (Non-Transmission and/or Reception Region R2)

Figure 4:
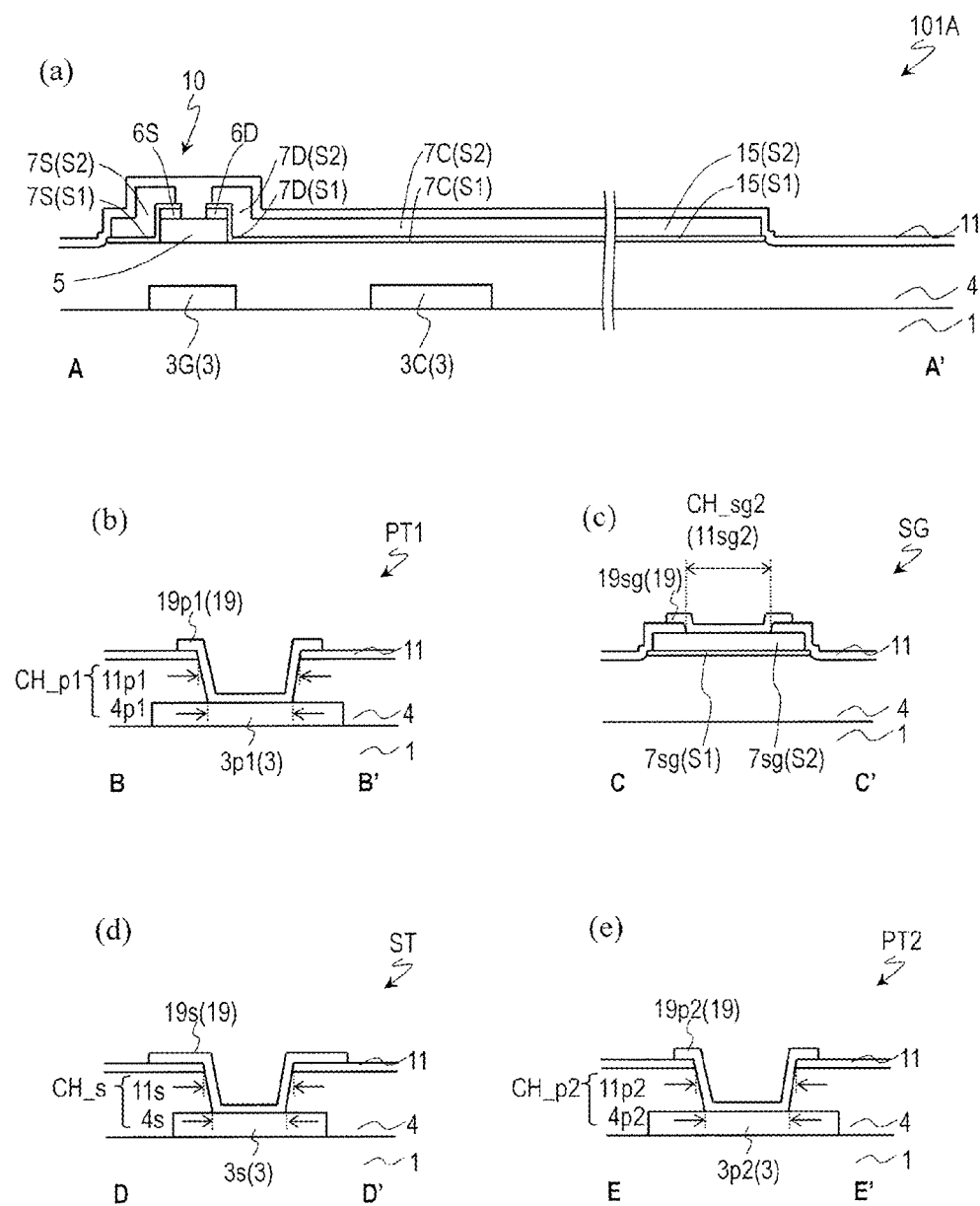
FIGS. 4(a) to 4(e) are schematic cross-sectional views of the TFT substrate 101A.
Figure 5:
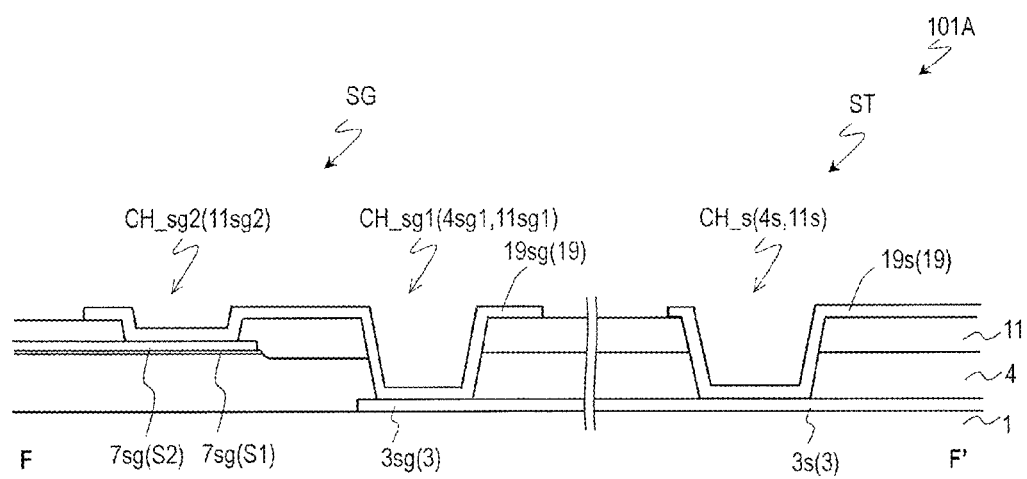
FIG. 5 is a schematic cross-sectional view of the TFT substrate 101A.

Referring to FIGS. 3 to 5, a structure of a non-transmission and/or reception region R2 of the TFT substrate 101A according to the present embodiment will be described. However, the structure of the non-transmission and/or reception region R2 of the TFT substrate 101A is not limited to the illustrated example. The effect of being able to suppress a deteriorated in antenna characteristics described above can be obtained regardless of the structure of the non-transmission and/or reception region R2 outside the seal region Rs. The liquid crystal layer LC is not disposed outside the seal region Rs in the non-transmission and/or reception region R2, and therefore, there is no problem that metal ions are dissolved in the liquid crystal layer LC from the upper source metal layer S2.

FIGS. 3(b) and 3(c) are schematic plan views of the non-transmission and/or reception region R2 of the TFT substrate 101A, and FIGS. 4(b) to 4(e) and FIG. 5 are schematic cross-sectional views of the non-transmission and/or reception region R2 of the TFT substrate 101A.

FIG. 3(b) illustrates the transfer terminal section PT, the gate terminal section GT, and the CS terminal section CT provided in the non-transmission and/or reception region R2, and FIG. 3(c) illustrates the source-gate connection section SG and the source terminal section ST provided in the non-transmission and/or reception region R2.

The transfer terminal section PT includes a first transfer terminal section PT1 located in the seal region Rs and a second transfer terminal section PT2 provided outside the seal region Rs (on a side where the liquid crystal layer is not present). In the illustrated example, the first transfer terminal section PT1 extends along the seal region Rs to surround the transmission and/or reception region R1.

FIG. 4(b) illustrates a cross section of the first transfer terminal section PT1 taken along the line B-B' in FIG. 3(b). FIG. 4(c) illustrates a cross section of the source-gate connection section SG taken along the C-C' line in FIG. 3(c). FIG. 4(d) illustrates a cross section of the source terminal section ST taken along the line D-D' in FIG. 3(c), FIG. 4(e) illustrates a cross section of the second transfer terminal section PT2 taken along the line E-E' in FIG. 3(b), and FIG. 5 illustrates a cross section of the source-gate connection section SG and the source terminal section ST taken along the line F-F' in FIG. 3(c).

In general, the gate terminal section GT and the source terminal section ST are provided for each gate bus line and for each source bus line, respectively. The source-gate connection section SG is provided corresponding to each source bus line, in general. FIG. 3(b) illustrates the CS terminal section CT and the second transfer terminal section PT2 aligned with the gate terminal section GT, but the numbers and arrangements of CS terminal sections CT and second transfer terminal sections PT2 are configured independently from the gate terminal section GT. Typically, the numbers of CS terminal sections CT and second transfer terminal sections PT2 are less than the number of gate terminal sections GT and are adequately configured in consideration of uniformity of voltages of the CS electrode and the slot electrode. The second transfer terminal section PT2 can be omitted in a case where the first transfer terminal section PT1 is formed.

Each CS terminal section CT is provided corresponding to each CS bus line, for example. Each CS terminal section CT may be provided corresponding to a plurality of CS bus lines. For example, in a case where each CS bus line is supplied with the same voltage as the slot voltage, the TFT substrate 101A may include at least one CS terminal section CT. However, in order to decrease a wiring line resistance, the TFT substrate 101A preferably includes a plurality of CS terminal sections CT. Note that the slot voltage is a ground potential, for example. In the case that the CS bus line is supplied with the same voltage as the slot voltage, either the CS terminal section CT or the second transfer terminal section PT2 can be omitted.

Source-Gate Connection Section SG

The TFT substrate 101A includes the source-gate connection section SG in the non-transmission and/or reception region R2 as illustrated in FIG. 3(c). The source-gate connection section SG is provided for each source bus line SL, in general. The source-gate connection section SG electrically connects each source bus line SL to a connection wiring line (also referred to as a "source lower connection wiring line" in some cases) formed in the gate metal layer 3. The lower connection section of the source terminal section ST can be formed of the gate metal layer 3 by providing the source-gate connection section SG as described later. With this configuration, the source terminal section ST of the TFT substrate 101A has excellent reliability.

As illustrated in FIG. 3(c), FIG. 4(c), and FIG. 5, the source-gate connection section SG includes a source lower connection wiring line 3sg, an opening 4sg1 formed in the gate insulating layer 4, a source bus line connection section 7sg, an opening 11sg1 and an opening 11sg2 formed in the interlayer insulating layer 11, and a source bus line upper connection section 19sg.

The source lower connection wiring line 3sg is included in the gate metal layer 3. The source lower connection wiring line 3sg is electrically separate from the gate bus line GL.

The opening 4sg1 formed in the gate insulating layer 4 at least reaches the source lower connection wiring line 3sg.

The source bus line connection section 7sg is included in the source metal layer 7 and electrically connected to the source bus line SL. In this example, the source bus line connection section 7sg extends from the source bus line SL and is formed integrally with the source bus line SL. The source bus line connection section 7sg includes the lower source metal layer S1 and the upper source metal layer S2. A width of the source bus line connection section 7sg may be larger than a width of the source bus line SL.

The opening 11sg1 formed in the interlayer insulating layer 11 overlaps the opening 4sg1 formed in the gate insulating layer 4 when viewed from the normal direction of the dielectric substrate 1. The opening 4sg1 formed in the gate insulating layer 4 and the opening 11sg1 formed in the interlayer insulating layer 11 constitute a contact hole CH_sg1.

The opening 11sg2 formed in the interlayer insulating layer 11 at least reaches the source bus line connection section 7sg. The opening 11sg2 may be referred to as a contact hole CH_sg2.

A source bus line upper connection section 19sg (also simply referred to as an "upper connection section 19sg") is included in the upper conductive layer 19. The upper connection section 19sg is formed on the interlayer insulating layer 11, within the contact hole CH_sg1, and within the contact hole CH_sg2, is connected to the source lower connection wiring line 3sg within the contact hole CH_sg1, and is connected to the source bus line connection section 7sg within the contact hole CH_sg2. For example, here, the upper connection section 19sg is in contact with the source lower connection wiring line 3sg within the opening 4sg1 formed in the gate insulating layer 4, and in contact with the source bus line connection section 7sg within the opening 11sg2 formed in the interlayer insulating layer 11.

A portion of the source lower connection wiring line 3sg exposed by the opening 4sg1 is preferably covered by the upper connection section 19sg. A portion of the source bus line connection section 7sg exposed by the opening 11sg2 is preferably covered by the upper connection section 19sg.

The upper conductive layer 19 includes, for example, a transparent conductive layer (for example, ITO layer). The upper conductive layer 19 may be formed of only a transparent conductive layer, for example. Alternatively, the upper conductive layer 19 may include a first upper conductive layer including a transparent conductive layer and a second upper conductive layer formed under the first upper conductive layer. The second upper conductive layer is formed of one layer or two or more layers selected from the group consisting of a Ti layer, a MoNbNi layer, a MoNb layer, a MoW layer, a W layer and a Ta layer, for example.

In the illustrated example, the contact hole CH_sg2 is formed at a position away from the contact hole CH_sg1. The present embodiment is not limited to the illustrated example, and the contact hole CH_sg1 and the contact hole CH_sg2 may be contiguous to each other (that is, may be formed as a single contact hole). The contact hole CH_sg1 and the contact hole CH_sg2 may be formed as a single contact hole in the same process. Specifically, a single contact hole that at least reaches the source lower connection wiring line 3sg and source bus line connection section 7sg may be formed in the gate insulating layer 4 and interlayer insulating layer 11 to form the upper connection section 19sg within this contact hole and on the interlayer insulating layer 11. At this time, the upper connection section 19sg is preferably formed to cover a portion of the source lower connection wiring line 3sg and source bus line connection section 7sg exposed by the contact hole.

Source Terminal Section ST

The TFT substrate 101A includes the source terminal section ST in the non-transmission and/or reception region R2 as illustrated in FIG. 3(c). The source terminal section ST is provided corresponding to each source bus line SL, in general. Here, the source terminal section ST and the source-gate connection section SG are provided corresponding to each source bus line SL.

The source terminal section ST includes a source terminal lower connection section 3s (also referred to simply as a "lower connection section 3s") connected to the source lower connection wiring line 3sg formed in the source-gate connection section SG, an opening 4s formed in the gate insulating layer 4, an opening 11s formed in the interlayer insulating layer 11, and a source terminal upper connection section 19s (also referred to simply as an "upper connection section 19s") as illustrated in FIG. 3(c), FIG. 4(d), and FIG. 5.

The lower connection section 3s is included in the gate metal layer 3. The lower connection section 3s is electrically connected to the source lower connection wiring line 3sg formed in the source-gate connection section SG. In this example, the lower connection section 3s extends from the source lower connection wiring line 3sg and is formed integrally with the source lower connection wiring line 3sg.

The opening 4s formed in the gate insulating layer 4 at least reaches the lower connection section 3s.

The opening 11s formed in the interlayer insulating layer 11 overlaps the opening 4s formed in the gate insulating layer 4 when viewed from the normal direction of the dielectric substrate 1. The opening 4s formed in the gate insulating layer 4 and the opening 11s formed in the interlayer insulating layer 11 constitute a contact hole CH_s.

The upper connection section 19s is included in the upper conductive layer 19. The upper connection section 19s is formed on the interlayer insulating layer 11 and within the contact hole CH_s, and is connected to the lower connection section 3s within the contact hole CH_s. Here, the upper connection section 19s is in contact with the lower connection section 3s within the opening 4s formed in the gate insulating layer 4.

In this example, the source terminal section ST does not include the conductive portion included in the source metal layer 7.

The source terminal section ST, which includes the lower connection section 3s included in the gate metal layer 3, has excellent reliability.

In the terminal section, particularly, the terminal section provided outside the seal region Rs (opposite to the liquid crystal layer), corrosion may occur due to atmospheric moisture (which may contain impurities). The atmospheric moisture intrudes from the contact hole at least reaching the lower connection section and at least reaches the lower connection section so that corrosion may occur in the lower connection section. From the viewpoint of suppressing the corrosion occurring, the contact hole that at least reaches the lower connection section is preferably deep. In other words, the thickness of the insulating layer where the opening constituting the contact hole is formed is preferably large.

In a process of fabricating a TFT substrate including a glass substrate as a dielectric substrate, broken pieces or chips (cullets) of the glass substrate may cause scratches or disconnection in the lower connection section of the terminal section. For example, a plurality of TFT substrates are fabricated from one mother substrate. The cullet is generated in cutting the mother substrate or in forming scribe lines in the mother substrate, for example. From the viewpoint of preventing the scratches and disconnection in the lower connection section of the terminal section, the contact hole that at least reaches the lower connection section is preferably deep. In other words, the thickness of the insulating layer where the opening constituting the contact hole is formed is preferably large.

In the source terminal section ST of the TFT substrate 101A, since the lower connection section 3s is included in the gate metal layer 3, the contact hole CH_s that at least reaches the lower connection section 3s includes the opening 4s formed in the gate insulating layer 4 and the opening 11s formed in the interlayer insulating layer 11. A depth of the contact hole CH_s is a sum of a thickness of the gate insulating layer 4 and a thickness of the interlayer insulating layer 11. In contrast, in a case that the lower connection section is included in the source metal layer 7, for example, the contact hole that at least reaches the lower connection section includes only an opening formed in the interlayer insulating layer 11, and a depth of the opening is the thickness of the interlayer insulating layer 11 and is smaller than the depth of the contact hole CH_s. Here, the depth of the contact hole and the thickness of the insulating layer are respectively a depth and a thickness in the normal direction of the dielectric substrate 1. The same holds for other contact holes and insulating layers unless otherwise specifically described. In this way, the source terminal section ST of the TFT substrate 101A includes the lower connection section 3s included in the gate metal layer 3, and therefore, has excellent reliability as compared with the case that the lower connection section is included in the source metal layer 7, for example.

The opening 4s formed in the gate insulating layer 4 is formed to expose only a portion of the lower connection section 3s. The opening 4s formed in the gate insulating layer 4 is inside the lower connection section 3s when viewed from the normal direction of the dielectric substrate 1. Therefore, the entire region within the opening 4s has a layered structure including the lower connection section 3s and the upper connection section 19s on the dielectric substrate 1. In the source terminal section ST, a portion outside the lower connection section 3s has a layered structure including the gate insulating layer 4 and the interlayer insulating layer 11. With this configuration, the source terminal section ST of the TFT substrate 101A has excellent reliability. From the viewpoint of obtaining the excellent reliability, the sum of the thickness of the gate insulating layer 4 and the thickness of the interlayer insulating layer 11 is preferably large.

A portion of the lower connection section 3s exposed by the opening 4s is covered by the upper connection section 19s.

Gate Terminal Section GT

The TFT substrate 101A includes the gate terminal section GT in the non-transmission and/or reception region R2 as illustrated in FIG. 3(b). The gate terminal section GT may have the same configuration as the source terminal section ST as illustrated in FIG. 3(b), for example. The gate terminal section GT is provided for each gate bus line GL, in general.

As illustrated in FIG. 3(b), in this example, the gate terminal section GT includes a gate terminal lower connection section 3g (also simply referred to as a "lower connection section 3g"), an opening 4g formed in the gate insulating layer 4, an opening 11g formed in the interlayer insulating layer 11, and a gate terminal upper connection section 19g (also simply referred to as an "upper connection section 19g").

The lower connection section 3g is included in the gate metal layer 3 and electrically connected to the gate bus line GL. In this example, the lower connection section 3g extends from the gate bus line GL and is formed integrally with the gate bus line GL.

The opening 4g formed in the gate insulating layer 4 at least reaches the lower connection section 3g.

The opening 11g formed in the interlayer insulating layer 11 overlaps the opening 4g formed in the gate insulating layer 4 when viewed from the normal direction of the dielectric substrate 1. The opening 4g formed in the gate insulating layer 4 and the opening 11g formed in the interlayer insulating layer 11 constitute a contact hole CH_g.

The upper connection section 19g is included in the upper conductive layer 19. The upper connection section 19g is formed on the interlayer insulating layer 11 and within the contact hole CH_g, and is connected to the lower connection section 3g within the contact hole CH_g. Here, the upper connection section 19g is in contact with the lower connection section 3g within the opening 4g formed in the gate insulating layer 4.

In this example, the gate terminal section GT does not have the conductive portion included in the source metal layer 7.

The gate terminal section GT, which includes the lower connection section 3g included in the gate metal layer 3, has excellent reliability similar to the source terminal section ST.

CS Terminal Section CT

The TFT substrate 101A includes the CS terminal section CT in the non-transmission and/or reception region R2 as illustrated in FIG. 3(b). The CS terminal section CT here has the same configuration as the source terminal section ST and gate terminal section GT as illustrated in FIG. 3(b). The CS terminal section CT may be provided corresponding to each CS bus line CL, for example.

As illustrated in FIG. 3(b), the CS terminal section CT includes a CS terminal lower connection section 3c (also simply referred to as a "lower connection section 3c"), an opening 4c formed in the gate insulating layer 4, an opening 11c formed in the interlayer insulating layer 11, and a CS terminal upper connection section 19c (also simply referred to as an "upper connection section 19c").

The lower connection section 3c is included in the gate metal layer 3. The lower connection section 3c is electrically connected to the CS bus line CL. In this example, the lower connection section 3c extends from the CS bus line CL and is formed integrally with the CS bus line CL.

The opening 4c formed in the gate insulating layer 4 at least reaches the lower connection section 3c.

The opening 11c formed in the interlayer insulating layer 11 overlaps the opening 4c formed in the gate insulating layer 4 when viewed from the normal direction of the dielectric substrate 1. The opening 4c formed in the gate insulating layer 4 and the opening 11c formed in the interlayer insulating layer 11 constitute a contact hole CH_c.

The upper connection section 19c is included in the upper conductive layer 19. The upper connection section 19c is formed on the interlayer insulating layer 11 and within the contact hole CH_c, and is connected to the lower connection section 3c within the contact hole CH_c. Here, the upper connection section 19c is in contact with the lower connection section 3c within the opening 4c formed in the gate insulating layer 4.

In this example, the CS terminal section CT does not have the conductive portion included in the source metal layer 7.

The CS terminal section CT, which includes the lower connection section 3c included in the gate metal layer 3, has excellent reliability similar to the source terminal section ST.

Transfer Terminal Section PT

The TFT substrate 101A includes the first transfer terminal section PT1 in the non-transmission and/or reception region R2 as illustrated in FIG. 3(b). The first transfer terminal section PT1 is provided in the seal region Rs, here (that is, the first transfer terminal section PT1 is provided in the sealing portion surrounding the liquid crystal layer).

The first transfer terminal section PT1 includes the first transfer terminal lower connection section 3p1 (also referred to simply as the "lower connection section 3p1"), the opening 4p1 formed in the gate insulating layer 4, the opening 1p1 formed in the interlayer insulating layer 11, the first transfer terminal upper connection section 19p1 (also referred to simply as the "upper connection section 19p1") as illustrated in FIG. 3(b) and FIG. 4(b).

The lower connection section 3p1 is included in the gate metal layer 3. That is, the lower connection section 3p1 is formed of the same conductive film as that of the gate bus line GL. The lower connection section 3p1 is electrically separate from the gate bus line GL. For example, in a case where the CS bus line CL is supplied with the same voltage as the slot voltage, the lower connection section 3p1 is electrically connected to, for example, the CS bus line CL. As is illustrated, the lower connection section 3p1 may extend from the CS bus line. However, the lower connection section 3p1 is not limited to the illustrated example and may be electrically separate from the CS bus line.

The opening 4p1 formed in the gate insulating layer 4 at least reaches the lower connection section 3p1.

The opening 1p1 formed in the interlayer insulating layer 11 overlaps the opening 4p1 formed in the gate insulating layer 4 when viewed from the normal direction of the dielectric substrate 1. The opening 4p1 formed in the gate insulating layer 4 and the opening 1p1 formed in the interlayer insulating layer 11 constitute a contact hole CH_p1.

The upper connection section 19p1 is included in the upper conductive layer 19. The upper connection section 19p1 is formed on the interlayer insulating layer 11 and within the contact hole CH_p1, and is connected to the lower connection section 3p1 within the contact hole CH_p1. Here, the upper connection section 19p1 is in contact with the lower connection section 3p1 within the opening 4p1 formed in the gate insulating layer 4. The upper connection section 19p1 is connected to a transfer terminal upper connection section on the slot substrate side by a sealing member containing conductive particles, for example (see FIG. 17(b)).

In this example, the first transfer terminal section PT1 does not have the conductive portion included in the source metal layer 7.

In this example, the lower connection section 3p1 is disposed between two gate bus lines GL adjacent to each other. Two lower connection sections 3p1 disposed with the gate bus line GL being interposed therebetween may be electrically connected to each other via a conductive connection section (not illustrated). The conductive connection section electrically connecting two lower connection sections 3p1 may be included, for example, in the source metal layer 7.

Here, one contact hole CH_p1 is provided so that the lower connection section 3p1 is connected to the upper connection section 19p1, but one or more contact holes CH_p1 may be provided to one lower connection section 3p1. A plurality of contact holes may be provided to one lower connection section 3p1. The number of contact holes or the shapes thereof are not limited to the illustrated example.

The second transfer terminal section PT2 is provided outside the seal region Rs (opposite to the transmission and/or reception region R1). Here, as illustrated in FIG. 3(b) and FIG. 4(e), the second transfer terminal section PT2 has the same cross-section structure as the first transfer terminal section PT1. The second transfer terminal section PT2 includes a second transfer terminal lower connection section 3p2 (also referred to simply as a "lower connection section 3p2"), an opening 4p2 formed in the gate insulating layer 4, an opening 11p2 formed in the interlayer insulating layer 11, and a second transfer terminal upper connection section 19p2 (also referred to simply as an "upper connection section 19p2").

The lower connection section 3p2 is included in the gate metal layer 3. Here, the lower connection section 3p2 extends from the first transfer terminal lower connection section 3p1 and is integrally formed with the first transfer terminal lower connection section 3p1.

The opening 4p2 formed in the gate insulating layer 4 at least reaches the lower connection section 3p2.

The opening 11p2 formed in the interlayer insulating layer 11 overlaps the opening 4p2 formed in the gate insulating layer 4 when viewed from the normal direction of the dielectric substrate 1. The opening 4p2 formed in the gate insulating layer 4 and the opening 11p2 formed in the interlayer insulating layer 11 constitute a contact hole CH_p2.

The upper connection section 19p2 is included in the upper conductive layer 19. The upper connection section 19p2 is formed on the interlayer insulating layer 11 and within the contact hole CH_p2, and is connected to the lower connection section 3p2 within the contact hole CH_p2. Here, the upper connection section 19p2 is in contact with the lower connection section 3p2 within the opening 4p2 formed in the gate insulating layer 4.

In the second transfer terminal section PT2 also, the upper connection section 19p2 may be connected to a transfer terminal upper connection section on the slot substrate side by a sealing member containing conductive particles, for example.

In this example, the second transfer terminal section PT2 does not have the conductive portion included in the source metal layer 7.

TFT Substrate 101R of Reference Example 1
(Non-Transmission and/or Reception Region R2)

FIGS. 6(b) and 6(c) are schematic cross-sectional views of the non-transmission and/or reception region R2 of the TFT substrate 101R of Reference Example 1. FIGS. 6(b) and 6(c) illustrate cross-sectional views taken along the line C-C' and the line D-D' in FIG. 3(c), respectively.

As illustrated in FIG. 6(b), unlike the TFT substrate 101A, in the source-gate connection section SG of the TFT substrate 101R of Reference Example 1, the source metal layer 7 has a reverse tapered side surface, and the interlayer insulating layer 11 has a defect 11d. However, as described above, even if the interlayer insulating layer 11 has the defect 11d on the outside of the seal region Rs in the non-transmission and/or reception region R2, the liquid crystal layer LC is not present, so there is no problem that metal ions are dissolved in the liquid crystal layer LC from the upper source metal layer S2.

The D-D' cross section of the TFT substrate 101R of Reference Example 1 illustrated in FIG. 6(c) is the same as the D-D' cross section of the TFT substrate 101A. Other cross sections of the TFT substrate 101R of Reference Example 1 has the same as the TFT substrate 101A, and thus illustration and description are omitted.

First Manufacturing Method of TFT Substrate
101R of Reference Example 1

In a case where the TFT substrate 101R of Reference Example 1 is used, a problem occurs that a metal element (Cu or Al) elutes into the liquid crystal layer from the source metal layer 7 because defects are formed in the inorganic layer covering the source metal layer in the manufacturing method described below. Defects in the inorganic layer are particularly formed due to the process of forming the source contact portion 6S, the drain contact portion 6D, the lower source metal layer S1, and the upper source metal layer S2.

Figure 7:
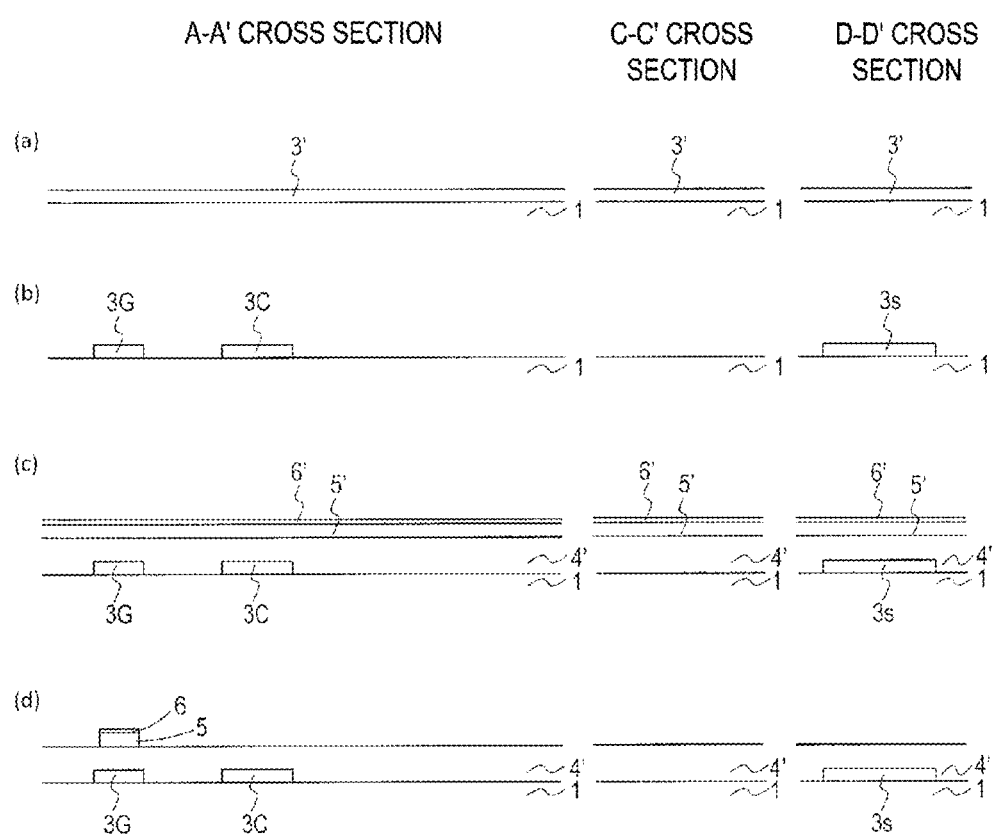
FIGS. 7(a) to 7(d) are schematic cross-sectional views for describing a first manufacturing method of the TFT substrate 101R of Reference Example 1.
Figure 8:
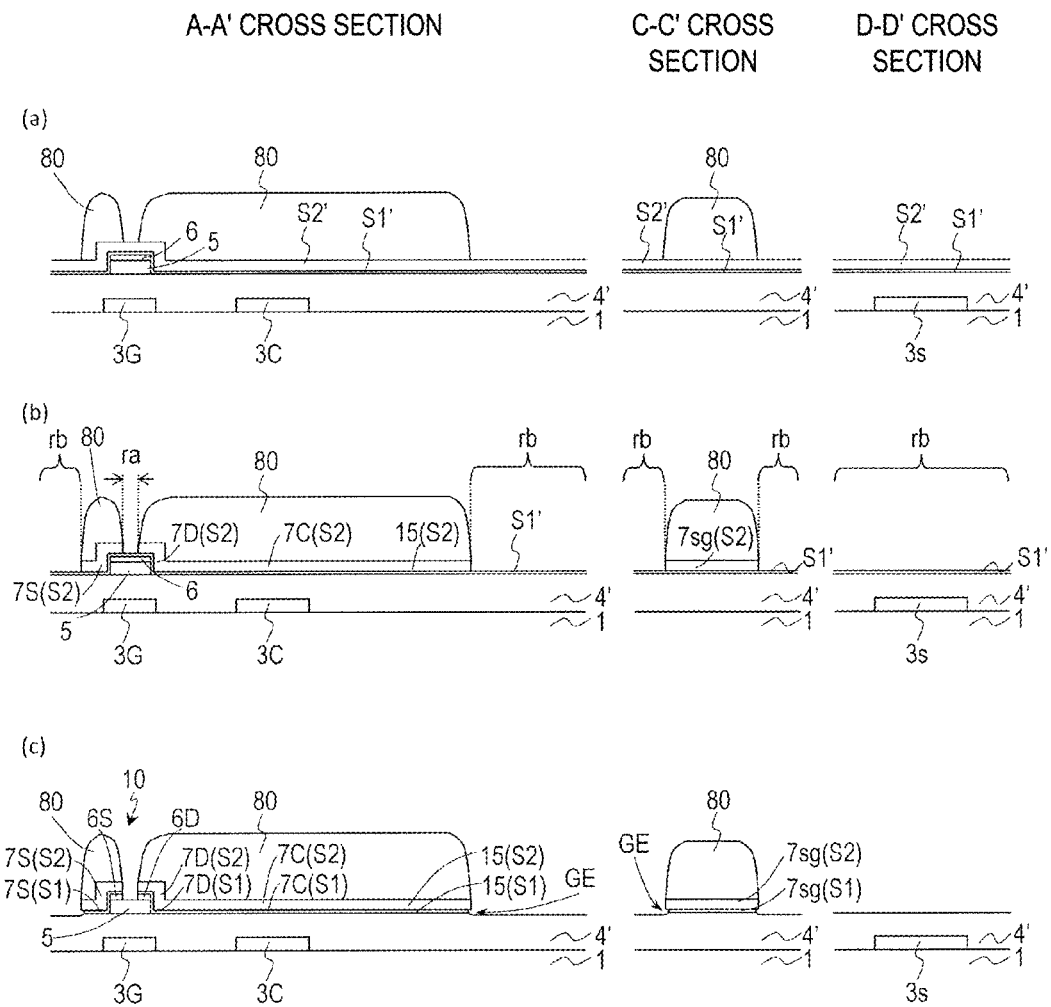
FIGS. 8(a) to 8(c) are schematic cross-sectional views for describing the first manufacturing method of the TFT substrate 101R of Reference Example 1.
Figure 9:
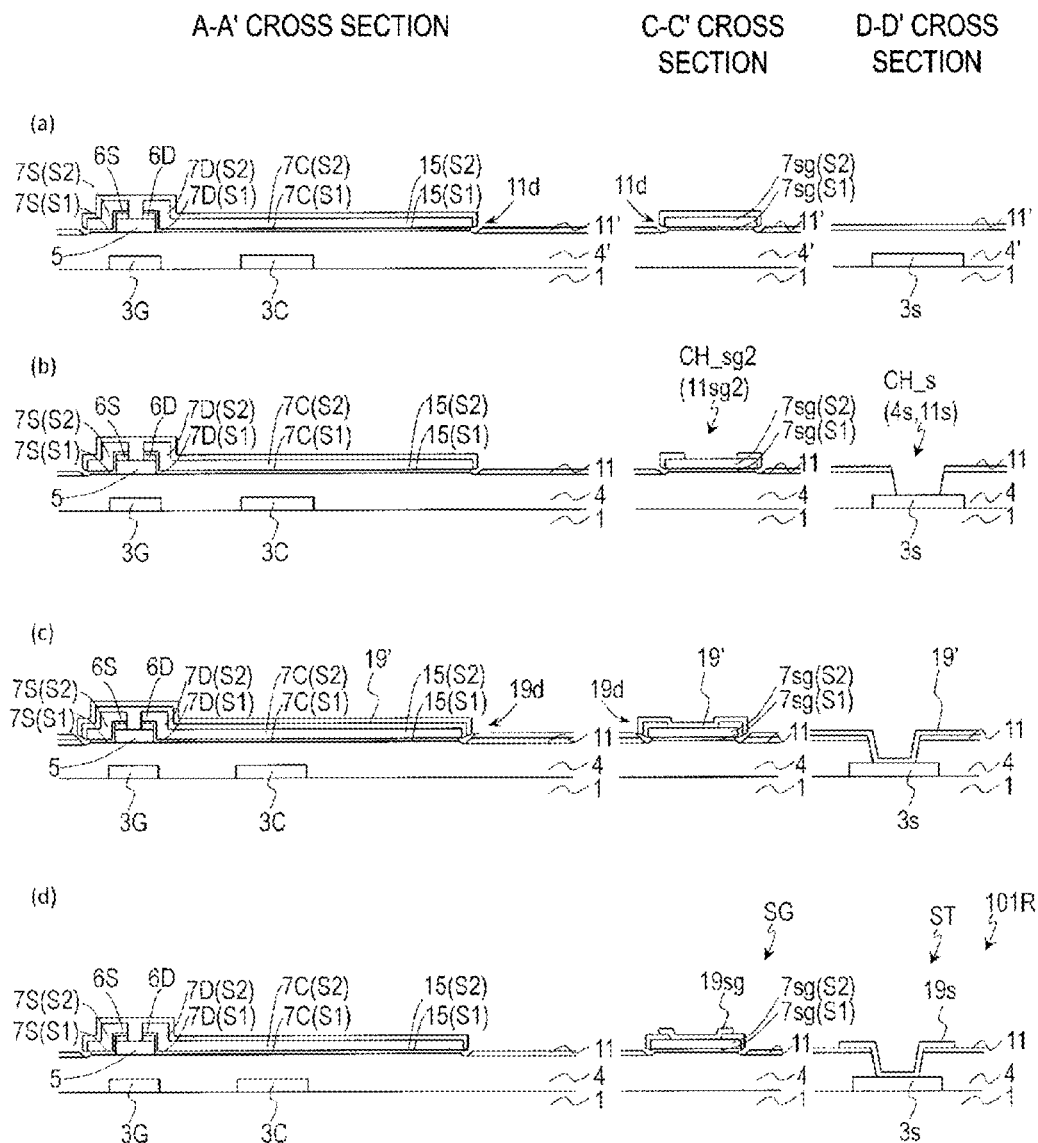
FIGS. 9(a) to 9(d) are schematic cross-sectional views for describing the first manufacturing method of the TFT substrate 101R of Reference Example 1.

A first manufacturing method of the TFT substrate 101R of Reference Example 1 will be described with reference to FIGS. 7 to 9.

FIGS. 7(a) to 7(d), FIGS. 8(a) to 8(c), and FIGS. 9(a) to 9(d) are schematic cross-sectional views for describing the first manufacturing method of the TFT substrate 101R of Reference Example 1. Each of these drawings illustrates a cross section corresponding to FIGS. 6(a) to 6(c) (A-A' cross section, C-C' cross section, and D-D' cross section of the TFT substrate 101R of Reference Example 1).

First, as illustrated in FIG. 7(a), a gate conductive film 3' is formed on the dielectric substrate 1 by a sputtering or the like. Materials of the gate conductive film 3' are not specifically limited, and, for example, a film containing a metal such as aluminum (Al), tungsten (W), molybdenum (Mo), tantalum (Ta), chromium (Cr), titanium (Ti), and copper (Cu), or an alloy thereof or a metal nitride thereof can be appropriately used. Here, as the gate conductive film 3', a layered film (MoN/Al) is formed by layering an Al film (having a thickness of 150 nm, for example) and a MoN film (having a thickness of 100 nm, for example) in this order.

Next, the gate conductive film 3' is patterned to obtain the gate metal layer 3 as illustrated in FIG. 7(b). The gate metal layer 3 includes a gate electrode 3G, a gate bus line GL, an auxiliary capacitance counter electrode 3C, and a CS bus line CL in an antenna unit formation region, and a source lower connection wiring line 3sg in the source-gate connection section formation region, and lower connection sections 3s, 3g, 3c, 3p1, and 3p2 in each of the terminal section formation regions. Here, patterning of the gate conductive film 3' is performed by wet etching.

After that, as illustrated in FIG. 7(c), a gate insulating film 4', an intrinsic amorphous silicon film 5', and an n$^+$ type amorphous silicon film 6' are formed in this order to cover the gate metal layer 3. The gate insulating film 4' can be formed by CVD or the like. As the gate insulating film 4', a silicon oxide ($SiO_2$) film, a silicon nitride ($Si_xN_y$) film, a silicon oxynitride ($SiO_xN_y$; x>y) film, a silicon nitride oxide ($SiN_xO_y$; x>y) film, or the like may be used as appropriate. Here, as the gate insulating film 4', a silicon nitride ($Si_xN_y$) film having a thickness of 350 nm, for example, is formed. The intrinsic amorphous silicon film 5' having a thickness of 120 nm, for example, and the n$^+$ type amorphous silicon film 6' having a thickness of 30 nm, for example, are formed. Alternatively, a crystalline silicon film (for example, a polysilicon film) may be formed as the semiconductor film 5'.

Next, the intrinsic amorphous silicon film 5' and the n$^+$ type amorphous silicon film 6' are patterned to form the island-shaped semiconductor layer 5 and the contact layer 6 as illustrated in FIG. 7(d). Patterning of the intrinsic amorphous silicon film 5' and the n$^+$ type amorphous silicon film 6' is performed, for example, by etching by dry etching, using the same etching mask (photoresist). The contact layer 6 is formed to contact the top surface of the semiconductor layer 5.

Next, as illustrated in FIG. 8(a), a source lower conductive film S1' is formed on the gate insulating film 4' and the contact layer 6 by a sputtering or the like, and a source upper conductive film S2' is formed on the source lower conductive film S1'. Thereafter, a resist layer 80 is formed on the source upper conductive film S2' by using photoresist. The source lower conductive film S1' includes at least one element selected from the group consisting of Ti, Ta, and W. The source upper conductive film S2' includes Cu or Al. Here, a Ti film (having a thickness of 20 nm, for example) is formed as the source lower conductive film S1', and a Cu film (having a thickness of 500 nm, for example) is formed as the source upper conductive film S2'. Alternatively, a Ti film (having a thickness of 20 nm, for example) may be formed as the source lower conductive film S1', and an Al film (having a thickness of 750 nm, for example) and a MoN film (having a thickness of 100 nm, for example) may be formed in this order to form a layered film (MoN/Al) as the source upper conductive film S2'.

Next, as illustrated in FIG. 8(b), the upper source metal layer S2 is formed by etching the source upper conductive film S2'. As illustrated in FIG. 8(c), the lower source metal layer S1 is formed by etching the source lower conductive film S1', and the source contact portion 6S and the drain contact portion 6D are formed by etching the contact layer 6. As a result, the source metal layer 7 including the upper source metal layer S2 and the lower source metal layer S1 is formed.

The source metal layer 7 includes the source electrode 7S, the drain electrode 7D, the source bus line SL, the auxiliary capacitance electrode 7C, and the patch electrode 15 in the antenna unit formation region, and includes the source bus line connection section 7sg in the source-gate connection section formation region. Each of the source electrode 7S, the drain electrode 7D, the source bus line SL, the auxiliary capacitance electrode 7C, the patch electrode 15, and the source bus line connection section 7sg includes the lower source metal layer S1 and the upper source metal layer S2. The source contact portion 6S is formed to connect the semiconductor layer 5 and the source electrode 7S, and the drain contact portion 6D is formed to connect the semiconductor layer 5 and the drain electrode 7D.

First, the upper source metal layer S2 is formed as illustrated in FIG. 8(b) by etching the source upper conductive film S2' by wet etching or dry etching, using the resist layer 80 as an etching mask. In this etching step, an etchant having a large etch selectivity relative to the etching rate of the source lower conductive film S1' is used.

For example, in a case where the Cu film is formed as the source upper conductive film S2', the source upper conductive film S2' is etched by using, for example, a mixed acid aqueous solution. In a case where the Al film and the MoN film are layered in this order to form the layered film (MoN/Al) as the source upper conductive film S2', etching of the source upper conductive film S2' is performed using an aqueous solution containing phosphoric acid, nitric acid, and acetic acid, for example. At this time, the MoN film and the Al film are etched by using the same etchant. No such limitation is intended, and the MoN film and the Al film may be etched by using different kinds of etchant.

Next, the source lower conductive film S1' and the contact layer 6 are etched by dry etching, using the resist layer 80 as an etching mask to form the lower source metal layer S1 and the source contact portion 6S and the drain contact portion 6D separated from each other, as illustrated in FIG. 8(c). Here, etching of the source lower conductive film S1' and the contact layer 6 is performed using, for example, a chlorine based gas.

At a point in time prior to performing this dry etching step, the region exposed from the resist layer 80 includes a region ra including the contact layer 6 and a region rb not including the contact layer 6, as illustrated in FIG. 8(b). Both the region ra and the region rb include the source lower conductive film S1'. In the dry etching step, in the region rb, the source lower conductive film S1' and/or the gate insulating film 4' are overetched by the portion not including the contact layer 6 compared with the region ra. In a case where the etching rate of the etchant used in the dry etching step of the source lower conductive film S1' is higher than the etching rate of the source upper conductive film S2', the edge of the lower source metal layer S1 is inside the edge of the upper source metal layer S2, as illustrated in FIG. 8(c). In other words, the portion of the source lower conductive film S1' under the resist layer 80 serving as an etching mask is also etched (undercut) by side etching. As a result, the side surface of the source metal layer 7 is reverse tapered. As illustrated in FIG. 8(c) for example, the gate insulating film 4' is etched in the region GE along the edge of the lower source metal layer S1.

Note that from the perspective of suppressing process damage to the semiconductor layer 5, the dry etching step is preferably performed under conditions in which the etching rate of the semiconductor layer 5 is low. In a case where etching conditions (for example, etchant) are selected from this perspective, as described above, the side surface of the source metal layer 7 may be reverse tapered.

Here, in the source-gate connection section formation region, the source metal layer 7 is formed such that at least a portion of the source lower connection wiring line 3sg does not overlap the source bus line connection section 7sg. Each terminal section formation region does not include the conductive portion included in the source metal layer 7.

Next, as illustrated in FIG. 9(a), the interlayer insulating film 11' is formed to cover the TFT 10 and the source metal layer 7. The interlayer insulating film 11' is formed by CVD or the like, for example. As the interlayer insulating film 11', a silicon oxide ($SiO_2$) film, a silicon nitride ($Si_xN_y$) film, a silicon oxynitride ($SiO_xN_y$; x>y) film, a silicon nitride oxide ($SiN_xO_y$; x>y) film, or the like may be used as appropriate. In this example, the interlayer insulating film 11' is formed to be in contact with the channel region of the semiconductor layer 5. Here, as the interlayer insulating film 11', a silicon nitride ($Si_xN_y$) film having a thickness of 100 nm, for example, is formed.

At this time, the source metal layer 7 has a reverse tapered side surface, and thus the interlayer insulating film 11' cannot completely cover the side surface of the source metal layer 7. In other words, a defect (for example, a discontinuous portion) 11d is formed in the interlayer insulating film 11'. Note that the defect (discontinuous portion) 11d of the interlayer insulating film 11' can be larger by etching the region GE (see FIG. 8(c)) of the gate insulating film 4' along the edge of the lower source metal layer S1.

Next, as illustrated in FIG. 9(b), the interlayer insulating film 11' and the gate insulating film 4' are etched through a known photolithography process to form the interlayer insulating layer 11 and gate insulating layer 4. Specifically, in the source-gate connection section formation region, the contact hole CH_sg1 at least reaching the source lower connection wiring line 3sg is formed in the gate insulating film 4' and the interlayer insulating film 11', and the opening 11sg2 (contact hole CH_sg2) at least reaching the source bus line connection section 7sg is formed in the interlayer insulating film 11'. In each of the terminal section formation regions, contact holes CH_s, CH_g, CH_c, CH_p1, and CH_p2 that at least reach the lower connection sections 3s, 3g, 3c, 3p1, and 3p2, respectively, are formed in the interlayer insulating film 11' and the gate insulating film 4'.

In this etching step, the interlayer insulating film 11' and the gate insulating film 4' are etched by using the source metal layer 7 as an etch stop.

In the source-gate connection section formation region, the interlayer insulating film 11' and the gate insulating film 4' are collectively etched (for example, etched by using the same etching mask and the same etchant) in the region overlapping the source lower connection wiring line 3sg, and the interlayer insulating film 11' is etched by the source bus line connection section 7sg functioning as an etch stop in the region overlapping the source bus line connection section 7sg. This allows the contact holes CH_sg1 and CH_sg2 to be obtained.

The contact hole CH_sg1 includes the opening 4sg1 formed in the gate insulating layer 4 and the opening 11sg1 formed in the interlayer insulating layer 11. Here, since at least a portion of the source lower connection wiring line 3sg is formed not to overlap the source bus line connection section 7sg, the contact hole CH_sg1 is formed in the gate insulating film 4' and the interlayer insulating film 11'. A side surface of the opening 4sg1 and a side surface of the opening 11sg1 may be aligned on a side surface of the contact hole CH_sg1.

In the present embodiment, the expression that "the side surfaces" of different two or more layers "are aligned" within the contact hole refers to not only a case that the side surfaces exposed in the contact hole in these layers are flush in the vertical direction, but also a case that those side surfaces continuously form an inclined surface such as a tapered shape. Such a configuration can be obtained, for example, by etching these layers by using the same mask or by etching the lower layer by using the upper layer as a mask.

In the source terminal section formation region, the interlayer insulating film 11' and the gate insulating film 4' are collectively etched to form the contact hole CH_s. The contact hole CH_s includes the opening 4s formed in the gate insulating film 4' and the opening 1 is formed in the interlayer insulating film 11'. A side surface of the opening 4s and a side surface of the opening 11s may be aligned on a side surface of the contact hole CH_s.

In the gate terminal section formation region, the interlayer insulating film 11' and the gate insulating film 4' are collectively etched to form the contact hole CH_g. The contact hole CH_g includes the opening 4g formed in the gate insulating film 4' and the opening 11g formed in the interlayer insulating film 11'. A side surface of the opening 4g and a side surface of the opening 11g may be aligned on a side surface of the contact hole CH_g.

In the CS terminal section formation region, the interlayer insulating film 11' and the gate insulating film 4' are collectively etched to form the contact hole CH_c. The contact hole CH_c includes the opening 4c formed in the gate insulating film 4' and the opening 11c formed in the interlayer insulating film 11'. A side surface of the opening 4c and a side surface of the opening 11c may be aligned on a side surface of the contact hole CH_c.

In the first transfer terminal section formation region, the interlayer insulating film 11' and the gate insulating film 4' are collectively etched to form the contact hole CH_p1. The contact hole CH_p1 includes the opening 4p1 formed in the gate insulating film 4' and the opening 11p1 formed in the interlayer insulating film 11'. A side surface of the opening 4p1 and a side surface of the opening 11p1 may be aligned on a side surface of the contact hole CH_p1.

In the second transfer terminal section formation region, the interlayer insulating film 11' and the gate insulating film 4' are collectively etched to form the contact hole CH_p2. The contact hole CH_p2 includes the opening 4p2 formed in the gate insulating film 4' and the opening 11p2 formed in the interlayer insulating film 11'. A side surface of the opening 4p2 and a side surface of the opening 11p2 may be aligned on a side surface of the contact hole CH_p2.

Next, as illustrated in FIG. 9(c), an upper conductive film 19' is formed on the interlayer insulating layer 11, within the contact hole CH_s, within the contact hole CH_g, within the contact hole CH_c, within the contact hole CH_p1, and within the contact hole CH_p2, by a sputtering, for example. The upper conductive film 19' includes a transparent conductive film, for example. An indium tin oxide (ITO) film, an IZO film, a zinc oxide (ZnO) film or the like can be used as the transparent conductive film. Here, an ITO film having a thickness of 70 nm, for example, is used as the upper conductive film 19'. Alternatively, a layered film (ITO/Ti) formed by layering Ti (having a thickness of 50 nm, for example) and ITO (having a thickness of 70 nm, for example) in this order may be used as the upper conductive film 19'. In place of the Ti film, a layered film formed of one film or two or more films selected from the group consisting of a MoNbNi film, a MoNb film, a MoW film, a W film, and a Ta film may be used. Specifically, as the upper conductive film 19', a layered film may be used that is formed by layering a layered film formed of one film or two or more films selected from the group consisting of a Ti film, a MoNbNi film, a MoNb film, a MoW film, a W film, and a Ta film, and an ITO film in this order.

Here, as illustrated in FIG. 9(c), a defect (discontinuous portion) 19d may occur in the upper conductive film 19' due to the defect 11d in the interlayer insulating layer 11. However, this is not a limitation, and defects may not occur in the upper conductive film 19'. Even in a case where the interlayer insulating layer 11 includes the defect 11d, the side surface of the source metal layer 7 exposed to the defect 11d may be completely covered by the upper conductive film 19' formed on the interlayer insulating layer 11. In general, the greater the number of inorganic layers formed on the source metal layer 7 is and/or the greater the sum of the thicknesses of the inorganic layers formed on the source metal layer 7, the more likely the reverse tapered side surface of the source metal layer 7 will be completely covered without exposure.

Next, the upper conductive film 19' is patterned to form the upper conductive layer 19 as illustrated in FIG. 9(d). Specifically, in the source-gate connection section formation region, an upper connection section 19sg connected to the source lower connection wiring line 3sg within the contact hole CH_sg1, and connected to the source bus line connection section 7sg within the contact hole CH_sg2 is formed. An upper connection section 19s that comes into contact with the lower connection section 3s within the contact hole CH_s is formed in the source terminal section formation region, an upper connection section 19g that comes into contact with the lower connection section 3s within the contact hole CH_g is formed in the gate terminal section formation region, an upper connection section 19c that comes into contact with the lower connection section 3c within the contact hole CH_c is formed in the CS terminal section formation region, an upper connection section 19p1 that comes into contact with the lower connection section 3p1 within the contact hole CH_p1 is formed in the first transfer terminal section formation region, and an upper connection section 19p2 that comes into contact with the lower connection section 3p2 within the contact hole CH_p2 is formed in the second transfer terminal section formation region. This provides the antenna unit region U, the source-gate connection section SG, the source terminal section ST, the gate terminal section GT, the CS terminal section CT, the first transfer terminal section PT1, and the second transfer terminal section PT2.

In this way, the TFT substrate 101R of Reference Example 1 is manufactured.

Here, as illustrated in FIG. 9(d), because the upper conductive layer 19 is not formed in the antenna unit region U, the portion of the side surface of the source metal layer 7 having the reverse tapered shape that is exposed to the defect (discontinuous portion) 11d of the interlayer insulating layer 11 is not covered by the upper conductive layer 19. In this manner, in the antenna unit region U of the TFT substrate 101R of Reference Example 1, a location where the lower source metal layer S1 and the upper source metal layer S2 are exposed without being covered by the inorganic layer is generated.

Note that, in the source-gate connection section SG, for example, as illustrated in FIG. 9(d), in a case where the upper connection section 19sg is formed so as not to cover the side surface of the source bus line connection section 7sg, a portion of the side surfaces of the source metal layer 7 having the reverse tapered shape that is exposed to the defect (discontinuous portion) 11d of the interlayer insulating layer 11 is not covered by the upper conductive layer 19.

Second Manufacturing Method of TFT Substrate 101R of Reference Example 1

The TFT substrate 101R of Reference Example 1 is also manufactured by the method described below.

Figure 10:
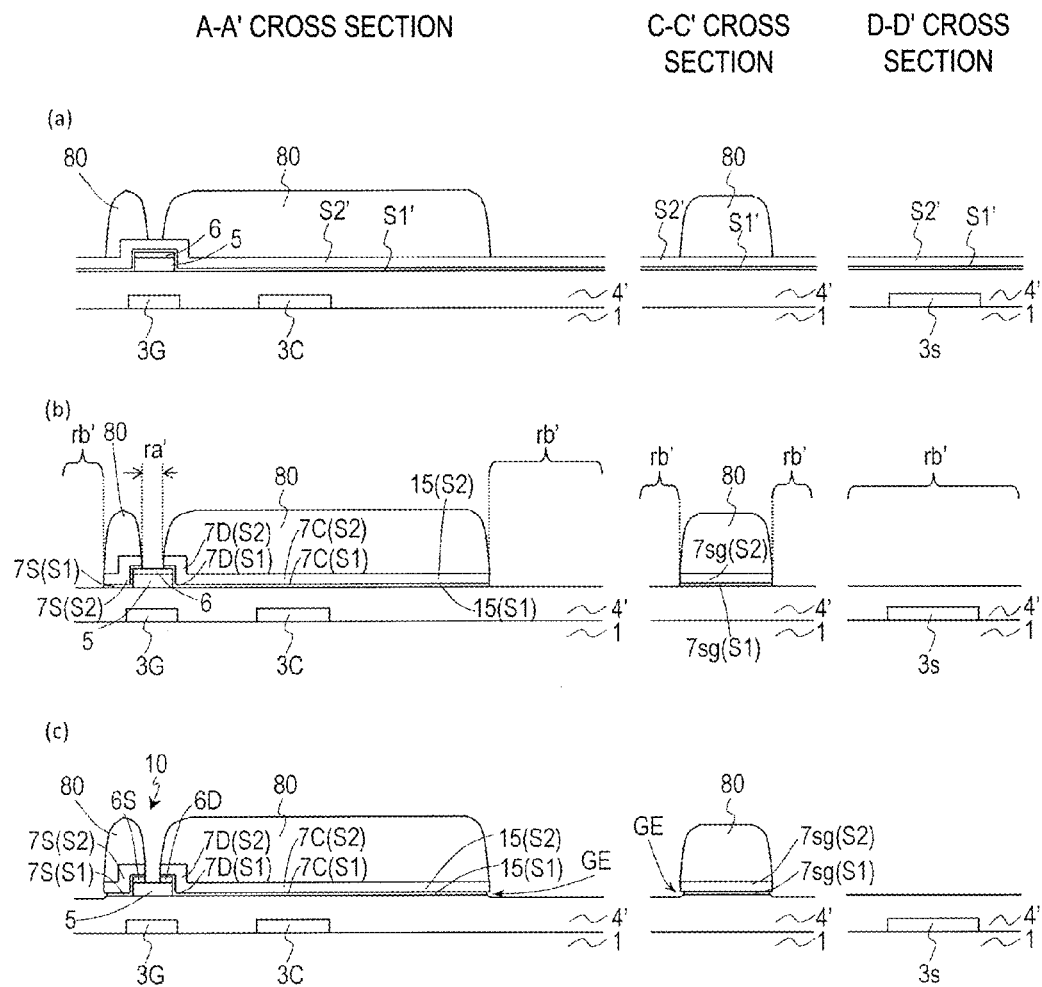
FIGS. 10(a) to 10(c) are schematic cross-sectional views for describing a second manufacturing method of the TFT substrate 101R of Reference Example 1.

A second manufacturing method of the TFT substrate 101R of Reference Example 1 will be described with reference to FIG. 10.

The second manufacturing method of the TFT substrate 101R of Reference Example 1 differs from the first manufacturing method described with reference to FIGS. 7 to 9 in a method for forming the source contact portion 6S, the drain contact portion 6D, the lower source metal layer S1, and the upper source metal layer S2. In the first manufacturing method, the source upper conductive film S2' is etched (wet etching or dry etching), and then the source lower conductive film S1' and the contact layer 6 are etched by dry etching. In contrast, in the second manufacturing method, the source upper conductive film S2' and the source lower conductive film S1' are etched (wet etching or dry etching), and then the contact layer 6 is etched by dry etching.

FIGS. 10(a) to 10(c) are schematic cross-sectional views for describing a second manufacturing method of the TFT substrate 101R of Reference Example 1. Each of these drawings illustrates a cross section corresponding to FIGS. 6(a) to 6(c) (A-A' cross section, C-C' cross section, and D-D' cross section of the TFT substrate 101R of Reference Example 1). The following description mainly describes differences from the first manufacturing method.

First, as illustrated in FIGS. 7(a) to 7(d), the gate metal layer 3, the gate insulating film 4', the island-shaped semiconductor layer 5, and the contact layer 6 are formed on the dielectric substrate 1.

Next, as illustrated in FIG. 10(a), a source lower conductive film S1' is formed on the gate insulating film 4' and the contact layer 6 by a sputtering or the like, and a source upper conductive film S2' is formed on the source lower conductive film S1'. Thereafter, a resist layer 80 is formed on the source upper conductive film S2' by using photoresist. The source lower conductive film S1' and the source upper conductive film S2' may be formed, for example, as illustrated in the first manufacturing method. Alternatively, a Ti film (having a thickness of 100 nm, for example) may be formed as the source lower conductive film S1', and an Al film (having a thickness of 750 nm, for example) and a Ti film (having a thickness of 50 nm, for example) may be formed in this order to form a layered film (Ti/Al) as the source upper conductive film S2'.

Next, as illustrated in FIG. 10(b), the upper source metal layer S2 and the lower source metal layer S1 are formed by etching the source upper conductive film S2' and the source lower conductive film S1' by wet etching or dry etching, using the resist layer 80 as an etching mask. In this etching step, the etching rate of the source lower conductive film S1' is less than or equal to the etching rate of the source upper conductive film S2'. Therefore, when this etching step is completed, the edge of the lower source metal layer S1 does not enter inside of the edge of the upper source metal layer S2. FIG. 10(b) illustrates, for simplicity, an example in which the edge of the lower source metal layer S1 and the edge of the upper source metal layer S2 overlap when viewed from the normal direction of the dielectric substrate 1 when the etching step is completed. However, the disclosure is not limited to the illustrated example, and the edge of the lower source metal layer S1 may be outside the edge of the upper source metal layer S2 when viewed from the normal direction of the dielectric substrate 1 when the etching step is completed.

For example, in a case where a Ti film is formed as the source lower conductive film S1' and a Cu film is formed as the source upper conductive film S2', the source upper conductive film S2' and the source lower conductive film S1' are etched by, for example, wet etching by using a mixed acid aqueous solution. In a case where a Ti film is formed as the source lower conductive film S1' and an Al film and an MoN film are layered in this order to form a layered film (MoN/Al) as the source upper conductive film S2', the source upper conductive film S2' and the source lower conductive film S1' are etched by, for example, wet etching by using a mixed acid aqueous solution. In a case that a Ti film is formed as the source lower conductive film S1' and an Al film and an Ti film are layered in this order to form a layered film (Ti/Al) as the source upper conductive film S2', the source upper conductive film S2' and the source lower conductive film S1' are etched by dry etching by using a chlorine based gas. The layered film of the Al film and the Ti film are not limited to be etched by dry etching, and can be etched by wet etching by using a known etching solution.

Note that etching of the source upper conductive film S2' and the source lower conductive film S1' may be etched by using a plurality of etchant so long as the condition that the etching rate of the source lower conductive film S1' is equal to or less than the etching rate of the source upper conductive film S2' is satisfied. For example, in the example described above, the Ti film and the Al film are etched by using the same etchant, but the disclosure is not limited thereto, and the Ti film and the Al film may be etched by using different kinds of etchant.

Next, as illustrated in FIG. 10(c), the source contact portion 6S and the drain contact portion 6D separated from each other are formed by etching the contact layer 6 by dry etching by using the resist layer 80 as an etching mask. Here, etching of the contact layer 6 is performed using, for example, a chlorine based gas.

At a point in time prior to performing this dry etching step, the region exposed from the resist layer 80 includes a region ra' including the contact layer 6 and a region rb' not including the contact layer 6, as illustrated in FIG. 10(b). The region ra' and the region rb' are different from the regions in the first manufacturing method in that the region ra' and the region rb' do not include the source lower conductive film S1'. In the dry etching step, the side etching of the source lower conductive film S1' and/or the overetching of the gate insulating film 4' occurs in the region rb' by a portion that does not include the contact layer 6 compared with the region ra'. In a case where the etching rate of the etchant used in the dry etching step of the lower source metal layer S1 is higher than the etching rate of the upper source metal layer S2, the lower source metal layer S1 is further etched in the dry etching step. Accordingly, as illustrated in FIG. 10(c), the edge of the lower source metal layer S1 is inserted inside the edge of the upper source metal layer S2. In other words, the portion of the lower source metal layer S1 under the resist layer 80 serving as an etching mask is also etched by side etching. As a result, the side surface of the source metal layer 7 is reverse tapered. As illustrated in FIG. 10(c) for example, the gate insulating film 4' is etched in the region GE along the edge of the lower source metal layer S1.

Note that from the perspective of suppressing process damage to the semiconductor layer 5, the dry etching step is preferably performed under conditions in which the etching rate of the semiconductor layer 5 is low. In a case where etching conditions (for example, etchant) are selected from this perspective, as described above, the side surface of the source metal layer 7 may be reverse tapered.

Thereafter, the TFT substrate 101R of Reference Example 1 is manufactured by performing the same steps as those described with reference to FIGS. 9(a) to 9(c). As described with reference to FIGS. 9(a) to 9(c), the side surface of the source metal layer 7 has the reverse tapered shape, resulting in the defect 11d in the interlayer insulating layer 11. As a result, in the antenna unit region U of the TFT substrate 101R of Reference Example 1, a location where the lower source metal layer S1 and the upper source metal layer S2 are exposed without being covered by the inorganic layer is generated.

First Manufacturing Method of TFT Substrate 101A

The TFT substrate of the present embodiment is manufactured by, for example, the following manufacturing method. According to the manufacturing method illustrated here, the side surface of the source metal layer does not have a reverse tapered shape. Thus, defects are not formed in the inorganic layer covering the source metal layer, so the occurrence of the problem in that the metal element (Cu or Al) elutes from the source metal layer to the liquid crystal layer is suppressed. Note that, in the following description, description may be omitted for steps common to the first and second manufacturing methods of the TFT substrate of Reference Example 1.

Figure 11:
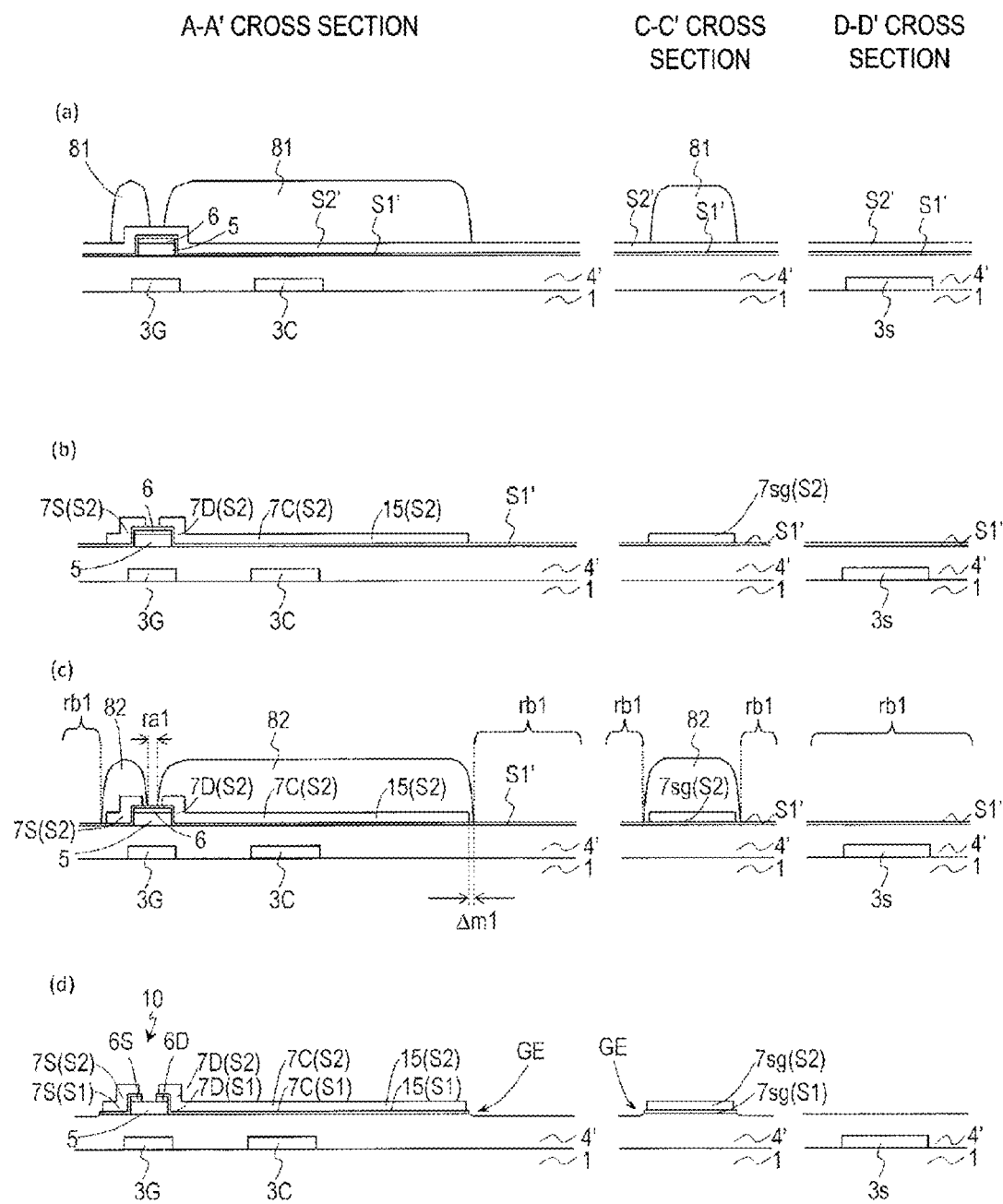
FIGS. 11(a) to 11(d) are schematic cross-sectional views for describing a first manufacturing method of the TFT substrate 101A.
Figure 12:
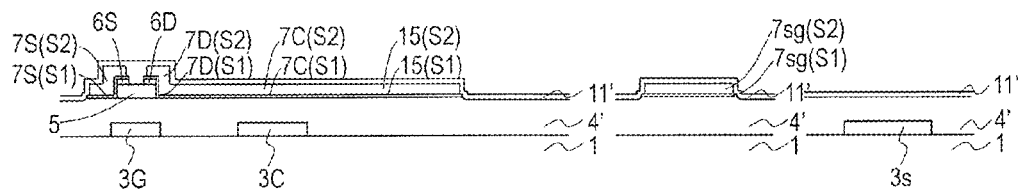
FIGS. 12(a) to 12(d) are schematic cross-sectional views for describing the first manufacturing method of the TFT substrate 101A.
Figure 12:
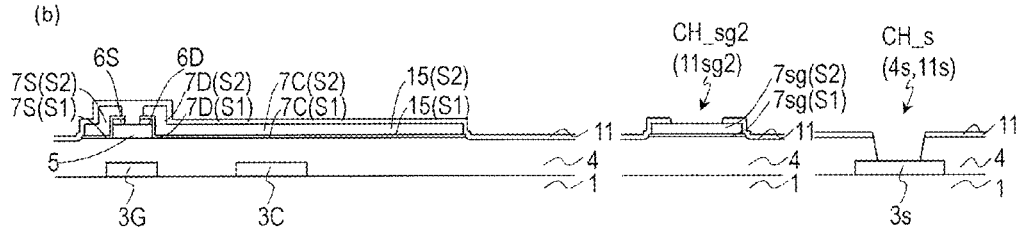
Figure 12:
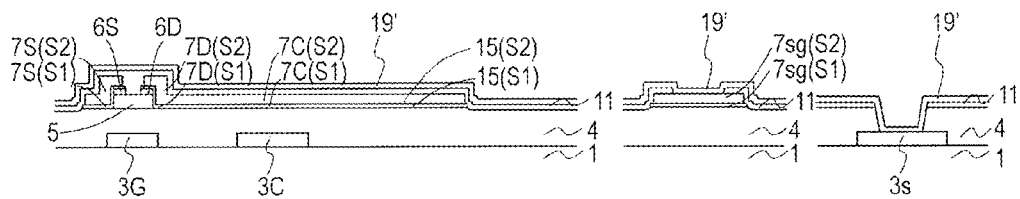
Figure 12:
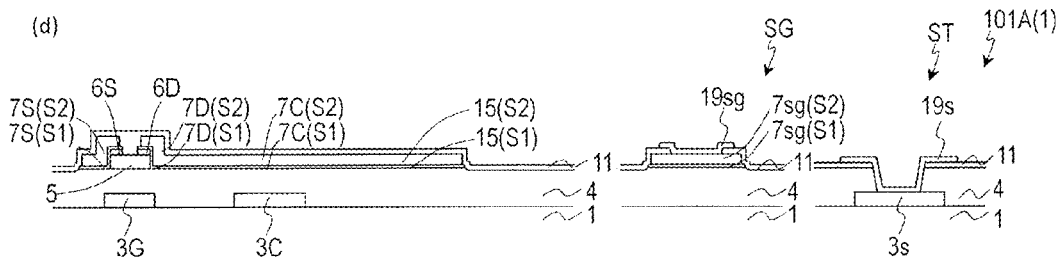

A first manufacturing method of the TFT substrate 101A of the present embodiment will be described with reference to FIG. 11 and FIG. 12. FIGS. 11(a) to 11(d) and FIGS. 12(a) to 12(d) are schematic cross-sectional views for illustrating the first manufacturing method of the TFT substrate 101A. Each of these drawings illustrate a cross section corresponding to FIGS. 4(a), 4(c), and 4(d) (A-A' cross section, C-C' cross section, and D-D' cross section of the TFT substrate 101A). Note that illustrations of the cross sections corresponding to FIGS. 4(b) and 4(e) (B-B' cross section and E-E' cross-section of the TFT substrate 101A) are omitted, but the cross sections are formed in the same manner as the cross section corresponding to FIG. 4(d) (D-D' cross section of the TFT substrate 101A).

First, as illustrated in FIGS. 7(a) to 7(d), the gate metal layer 3, the gate insulating film 4', the island-shaped semiconductor layer 5, and the contact layer 6 are formed on the dielectric substrate 1.

Next, as illustrated in FIG. 11(a), a source lower conductive film S1' is formed on the gate insulating film 4' and the contact layer 6 by a sputtering or the like, and a source upper conductive film S2' is formed on the source lower conductive film S1'. Thereafter, a first resist layer 81 is formed on the source upper conductive film S2' by using photoresist. The source lower conductive film S1' and the source upper conductive film S2' may be formed, for example, as illustrated in the first and second manufacturing methods of the TFT substrate of Reference Example 1.

Next, as illustrated in FIG. 11(b), the upper source metal layer S2 is formed by etching the source upper conductive film S2'. As illustrated in FIGS. 11(c) and 11(d), the lower source metal layer S1 is formed by etching the source lower conductive film S1', and the source contact portion 6S and the drain contact portion 6D are formed by etching the contact layer 6. As a result, the source metal layer 7 including the upper source metal layer S2 and the lower source metal layer S1 is formed.

First, the upper source metal layer S2 is formed as illustrated in FIG. 11(b) by etching the source upper conductive film S2' by wet etching or dry etching, using the first resist layer 81 as an etching mask. In this etching step, an etchant having a large etch selectivity relative to the etching rate of the source lower conductive film S1' is preferably used. For example, the etch selectivity of the etching rate of the source upper conductive film S2' relative to the etching rate of the source lower conductive film S1' is preferably 20 times or greater. The etching of the source upper conductive film S2' may be an underetch or an overetch with respect to the first resist layer 81 serving as an etching mask.

However, the etchant of the source upper conductive film S2' is not limited to this. For example, in a case where a Ti film is formed as the source lower conductive film S1' and an Al film and a Ti film are layered in this order to form a layered film (Ti/Al) as the source upper conductive film S2', the source upper conductive film S2' can be etched, for example, by dry etching by using a chlorine based gas. At this time, the etch selectivity of the etching rate of the source upper conductive film S2' relative to the etching rate of the source lower conductive film S1' is not large (e.g., approximately 1). In such a case, etching of the source upper conductive film S2' may be completed with the edge of the source lower conductive film S1' not entering the inside of the edge of the upper source metal layer S2.

Thereafter, the first resist layer 81 is removed (peeled).

Next, as illustrated in FIG. 11(c), the second resist layer 82 is formed by using photoresist to cover the upper source metal layer S2. The second resist layer 82 is formed covering the upper surface and the side surface of the upper source metal layer S2. At this time, the second resist layer 82 is preferably formed such that the edge of the second resist layer 82 is outside the edge of the upper source metal layer S2 when viewed from the normal direction of the dielectric substrate 1, and the distance $\Delta m1$ of the edge of the second resist layer 82 from the edge of the upper source metal layer S2 is not less than five times the thickness of the source lower conductive film S1', for example.

Next, the source lower conductive film S1' and the contact layer 6 are etched by dry etching, using the second resist layer 82 as an etching mask to form the lower source metal layer S1 and the source contact portion 6S and the drain contact portion 6D separated from each other, as illustrated in FIG. 11(d). Here, etching of the source lower conductive film S1' and the contact layer 6 is performed using, for example, a chlorine based gas. Etching of the source lower conductive film S1' and etching of the contact layer 6 may be performed using the same etchant or may be performed using different kinds of etchant.

At a point in time prior to performing this dry etching step, the region exposed from the second resist layer 82 includes a region ra1 including the contact layer 6 and a region rb1 not including the contact layer 6, as illustrated in FIG. 11(c). Both the region ra1 and the region rb1 include the source lower conductive film S1'. In the dry etching step, in the region rb1, the source lower conductive film S1' and/or the gate insulating film 4' are overetched by the portion not including the contact layer 6 compared with the region ra1. In a case where the etching rate of the etchant used in the dry etching step of the source lower conductive film S1' is higher than the etching rate of the source upper conductive film S2', the portion of the source lower conductive film S1' under the second resist layer 82 serving as an etching mask is also etched (undercut) by side etching. In other words, when viewed from the normal direction of the dielectric substrate 1, the edge of the lower source metal layer S1 enters the inside of the edge of the second resist layer 82.

However, in the manufacturing method according to the present embodiment, the edge of the second resist layer 82 is the outside of the edge of the upper source metal layer S2 by $\Delta m1$, and therefore, as illustrated in FIG. 11(d), the edge of the lower source metal layer S1 does not enter more inside than the edge of the upper source metal layer S2. That is, when viewed from the normal direction of the dielectric substrate 1, as illustrated in FIG. 11(d), the edge of the lower source metal layer S1 is outside the edge of the upper source metal layer S2, or the edge of the lower source metal layer S1 overlaps the edge of the upper source metal layer S2. Therefore, the side surface of the source metal layer 7 is not reverse tapered. In other words, the side surface of the source metal layer 7 is tapered or vertical.

Here, as illustrated in FIG. 11(d) for example, the gate insulating film 4' is etched in the region GE along the edge of the lower source metal layer S1.

Next, as illustrated in FIG. 12(a), the interlayer insulating film 11' is formed to cover the TFT 10 and the source metal layer 7. This step is performed in the same manner as described with reference to FIG. 9(a).

Here, unlike the TFT substrate 101R of Reference Example 1, the side surface of the source metal layer 7 is not reverse tapered, that is, the side surface of the source metal layer 7 is tapered or vertical, and thus defects do not occur in the interlayer insulating film 11'. The source metal layer 7 is completely covered by the interlayer insulating film 11'. As a result, in the TFT substrate according to the present embodiment, as illustrated in FIG. 12(d), in the antenna unit region U, a portion where the source metal layer 7 is exposed without being covered by the inorganic layer does not occur. With the TFT substrate of the present embodiment, a deterioration in antenna characteristics can be suppressed.

Next, as illustrated in FIG. 12(b), the interlayer insulating film 11' and the gate insulating film 4' are etched through a known photolithography process to form the interlayer insulating layer 11 and gate insulating layer 4. This step is performed in the same manner as described with reference to FIG. 9(b).

Next, as illustrated in FIG. 12(c), an upper conductive film 19' is formed on the interlayer insulating layer 11, within the contact hole CH_s, within the contact hole CH_g, within the contact hole CH_c, within the contact hole CH_p1, and within the contact hole CH_p2. This step is performed in the same manner as described with reference to FIG. 9(c).

Next, the upper conductive film 19' is patterned to form the upper conductive layer 19 as illustrated in FIG. 12(d). This step is performed in the same manner as described with reference to FIG. 9(d). This provides the antenna unit region U, the source-gate connection section SG, the source terminal section ST, the gate terminal section GT, the CS terminal section CT, the first transfer terminal section PT1, and the second transfer terminal section PT2.

In this manner, the TFT substrate 101A is manufactured. Note that "(1)" may be assigned to the end of the reference numeral of the TFT substrate to indicate being manufactured by the first manufacturing method.

In the manufacturing method of the TFT substrate according to the present embodiment, the source upper conductive film S2' and the contact layer 6 are etched by using mutually different etching masks. The source upper conductive film S2' is etched by using the first resist layer 81 as an etching mask, and the contact layer 6 is etched by using the second resist layer 82 as an etching mask. Since the second resist layer 82 is formed to cover the upper source metal layer S2, the distance between the source contact portion 6S and the drain contact portion 6D in the channel length direction is smaller than the distance between the upper source metal layer S2 of the source electrode 7S and the upper source metal layer S2 of the drain electrode 7D in the channel length direction. In this example, the channel length of the TFT 10 is defined by the distance between the source contact portion 6S and the drain contact portion 6D in the channel length direction.

As a result, the following advantages are obtained in the TFT substrate 101A of the present embodiment. In general, from the perspective of antenna performance, it is preferable that the thickness of the patch electrode be large. Depending on the configuration of the TFT; however, when a patch electrode having a thickness exceeding, for example, 1 μm is formed in the source metal layer, a problem arises in that the desired patterning accuracy cannot be obtained. For example, there may be a problem that the gap between the source electrode and the drain electrode (corresponding to the channel length of the TFT) cannot be controlled with high accuracy. In the TFT substrate 101A of the present embodiment, while defined by the distance between the source contact portion 6S and the drain contact portion 6D in the channel length direction, even in a case where the thickness of the source metal layer 7 is increased, the occurrence of the problem in that the gap between the source electrode 7S and the drain electrode 7D cannot be controlled with high precision can be suppressed.

Second Manufacturing Method of TFT Substrate 101A

Figure 13:
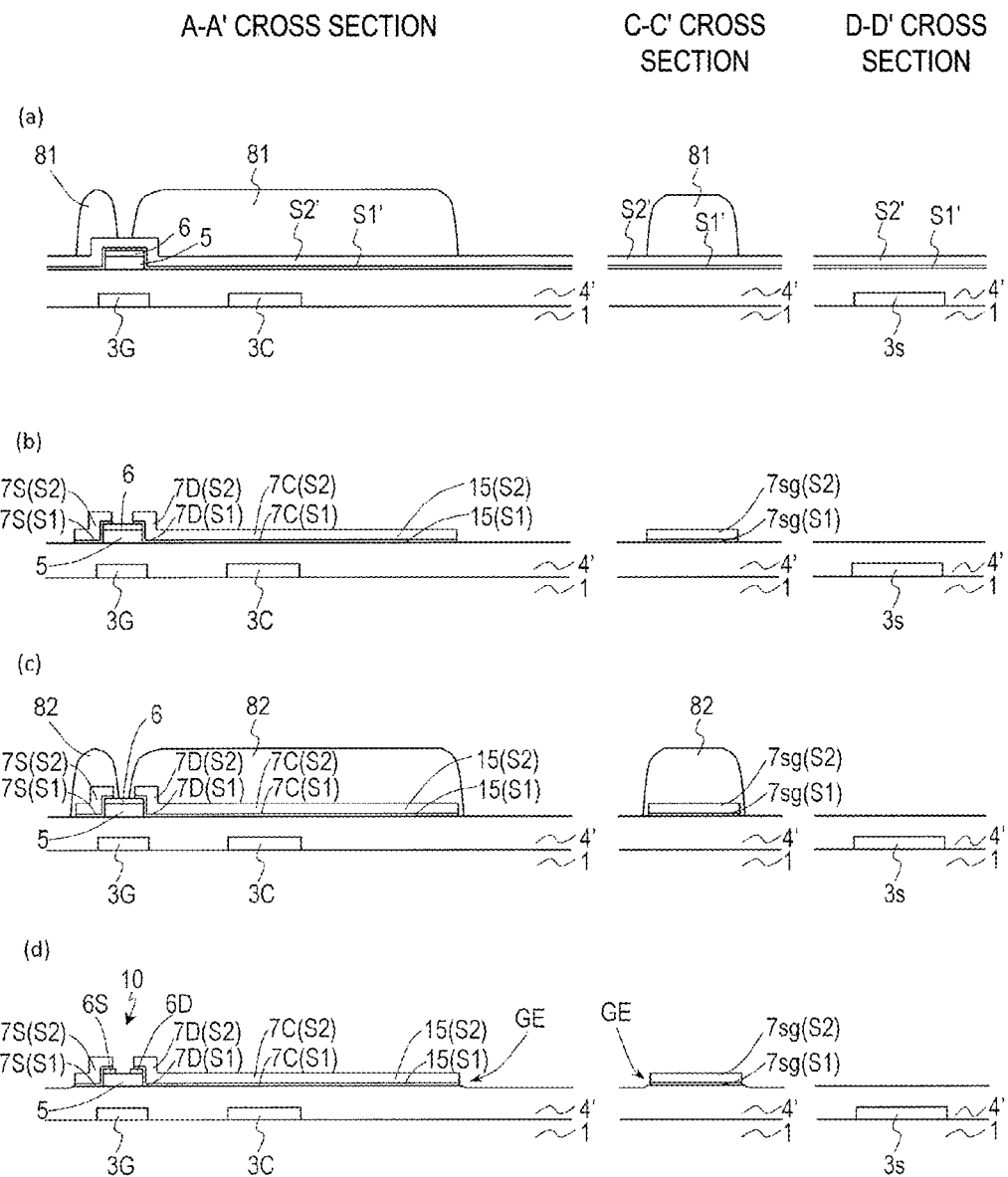
FIGS. 13(a) to 13(d) are schematic cross-sectional views for describing a second manufacturing method of the TFT substrate 101A.
Figure 14:
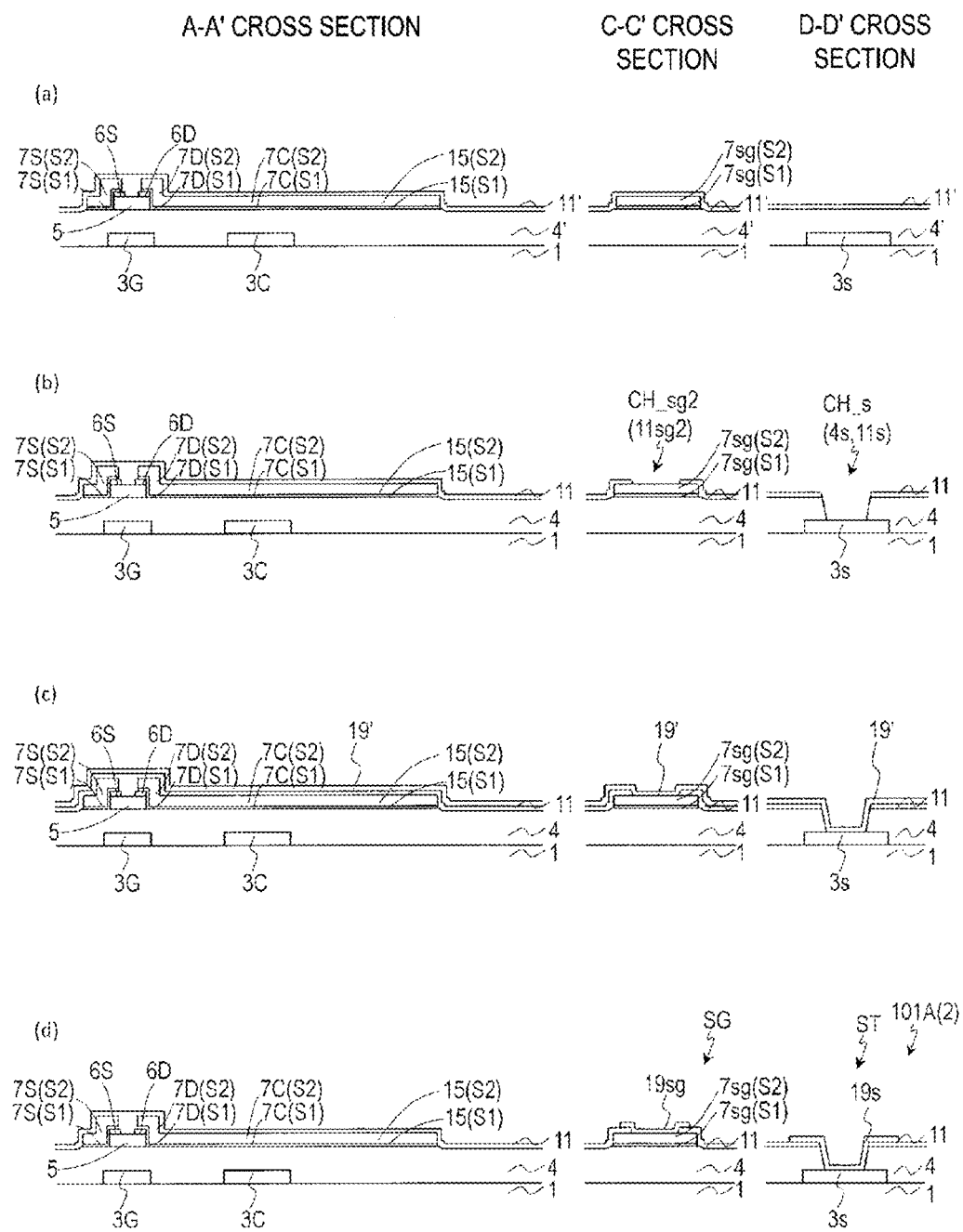
FIGS. 14(a) to 14(d) are schematic cross-sectional views for describing the second manufacturing method of the TFT substrate 101A.

A second manufacturing method for the TFT substrate 101A will be described with reference to FIGS. 13 and 14.

The second manufacturing method of the TFT substrate 101A differs from the first manufacturing method described with reference to FIG. 11 and FIG. 12 in a method for forming the source contact portion 6S, the drain contact portion 6D, the lower source metal layer S1, and the upper source metal layer S2. In the first manufacturing method, the source upper conductive film S2' is etched (wet etching or dry etching) by using the first resist layer 81 as an etching mask, and the source lower conductive film S1' and the contact layer 6 are etched by dry etching by using the second resist layer 82 as an etching mask. In contrast, in the second manufacturing method, the source upper conductive film S2' and the source lower conductive film S1' are etched (wet etching or dry etching) by using the first resist layer 81 as an etching mask, and the contact layer 6 is etched by dry etching by using the second resist layer 82 as an etching mask.

FIGS. 13(a) to 13(d) and FIGS. 14(a) to 14(d) are schematic cross-sectional views for describing the second manufacturing method of the TFT substrate 101A. Each of these drawings illustrate a cross section corresponding to FIGS. 4(a), 4(c), and 4(d) (A-A' cross section, C-C' cross section, and D-D' cross section of the TFT substrate 101A). The following description mainly describes differences from the first manufacturing method.

First, as described with reference to FIGS. 7(a) to 7(d), the gate metal layer 3, the gate insulating film 4', the island-shaped semiconductor layer 5, and the contact layer 6 are formed on the dielectric substrate 1.

Next, as illustrated in FIG. 13(a), a source lower conductive film S1' is formed on the gate insulating film 4' and the contact layer 6 by a sputtering or the like, and a source upper conductive film S2' is formed on the source lower conductive film S1'. Thereafter, a first resist layer 81 is formed on the source upper conductive film S2' by using photoresist.

Next, as illustrated in FIG. 13(b), the upper source metal layer S2 and the lower source metal layer S1 are formed by etching the source upper conductive film S2' and the source lower conductive film S1' by wet etching or dry etching, using the first resist layer 81 as an etching mask. In this etching step, the etching conditions are adjusted so that the etching rate of the source lower conductive film S1' is less than or equal to the etching rate of the source upper conductive film S2'. Accordingly, when this etching step is completed, the upper source metal layer S2 and the lower source metal layer S1 are formed such that the edge of the lower source metal layer S1 do not enter inside the edge of the upper source metal layer S2. At the time of completion of this etching step, the side surface of the source metal layer 7 is not reverse tapered (i.e., the side surface of the source metal layer 7 is tapered or vertical). FIG. 13(b) illustrates, for simplicity, an example in which the edge of the lower source metal layer S1 and the edge of the upper source metal layer S2 overlap when viewed from the normal direction of the dielectric substrate 1 when the etching step is completed. However, the disclosure is not limited to the illustrated example, and the edge of the lower source metal layer S1 may be outside the edge of the upper source metal layer S2 when viewed from the normal direction of the dielectric substrate 1 when the etching step is completed.

The etching of the source upper conductive film S2' and the source lower conductive film S1' may be underetched or may be overetched with respect to the first resist layer 81 serving as an etching mask. Etching of the source upper conductive film S2' and etching of the source lower conductive film S1' may be performed by using the same etchant or may be performed by using different kinds of etchant so long as the condition that the etching rate of the source lower conductive film S1' is less than or equal to the etching rate of the source upper conductive film S2' is satisfied.

Thereafter, the first resist layer 81 is removed (peeled).

Next, as illustrated in FIG. 13(c), the second resist layer 82 is formed to cover the upper source metal layer S2 and the lower source metal layer S1 by using photoresist. The second resist layer 82 is formed covering the upper surface and the side surface of the upper source metal layer S2 and the side surface of the lower source metal layer S1.

Next, as illustrated in FIG. 13(d), the source contact portion 6S and the drain contact portion 6D are formed by etching the contact layer 6 by dry etching, using the second resist layer 82 as an etching mask. Here, etching of the contact layer 6 is performed using, for example, a chlorine based gas.

In this dry etching step, the upper source metal layer S2 and the lower source metal layer S1 are covered by the second resist layer 82, so the upper source metal layer S2 and the lower source metal layer S1 are not etched. Accordingly, the side surface of the source metal layer 7 remains not reverse tapered from the end of etching of the source upper conductive film S2' and the source lower conductive film S1'.

Note that, as described in the first manufacturing method, the gate insulating film 4' can also be etched in the dry etching step. The gate insulating film 4' is etched in the region not covered by the second resist layer 82, where the contact layer 6 is not formed (for example, in the region GE along the edge of the second resist layer 82, as illustrated in FIG. 13(d)).

Next, as illustrated in FIG. 14(a), the interlayer insulating film 11' is formed covering the TFT 10 and the source metal layer 7. This step is performed in the same manner as described with reference to FIG. 12(a).

Here, because the side surface of the source metal layer 7 is not reverse tapered, defects do not occur in the interlayer insulating film 11'. The side surface of the source metal layer 7 is completely covered by the interlayer insulating film 11'. As a result, in the TFT substrate according to the present embodiment, as illustrated in FIG. 14(d), in the antenna unit region U, a portion where the source metal layer 7 is exposed without being covered by the inorganic layer does not occur. With the TFT substrate of the present embodiment, a deterioration in antenna characteristics can be suppressed.

Next, as illustrated in FIG. 14(b), the interlayer insulating film 11' and the gate insulating film 4' are etched through a known photolithography process to form the interlayer insulating layer 11 and gate insulating layer 4. This step is performed in the same manner as described with reference to FIG. 12(b).

Next, as illustrated in FIG. 14(c), an upper conductive film 19' is formed on the interlayer insulating layer 11, within the contact hole CH_s, within the contact hole CH_g, within the contact hole CH_c, within the contact hole CH_p1, and within the contact hole CH_p2. This step is performed in the same manner as described with reference to FIG. 12(c).

Next, the upper conductive film 19' is patterned to form the upper conductive layer 19 as illustrated in FIG. 14(d). This step is performed in the same manner as described with reference to FIG. 12(d).

In this manner, the TFT substrate 101A is manufactured. Note that "(2)" may be assigned to the end of the reference numeral of the TFT substrate to indicate being manufactured by the second manufacturing method.

In the present manufacturing method, the source upper conductive film S2' and the source lower conductive film S1' and the contact layer 6 are formed by using etching masks different from each other. The source upper conductive film S2' and the source lower conductive film S1' are etched by using the first resist layer 81 as an etching mask, and the contact layer 6 is etched by using the second resist layer 82 as an etching mask. Since the second resist layer 82 is formed covering the upper source metal layer S2 and the lower source metal layer S1, the distance between the source contact portion 6S and the drain contact portion 6D in the channel length direction is smaller than the distance between the upper source metal layer S2 of the source electrode 7S and the upper source metal layer S2 of the drain electrode 7D in the channel length direction, and smaller than the distance between the lower source metal layer S1 of the source electrode 7S and the lower source metal layer S1 of the drain electrode 7D in the channel length direction. In this example, the channel length of the TFT 10 is defined by the distance between the source contact portion 6S and the drain contact portion 6D in the channel length direction.

Thus, according to the second manufacturing method of the present embodiment, even in a case where the thickness of the source metal layer 7 is increased, the occurrence of the problem in that the gap between the source electrode 7S and the drain electrode 7D cannot be controlled with high accuracy can be suppressed.

Furthermore, in the second manufacturing method of the present embodiment, the following advantages are obtained. In the etching step of the contact layer 6, a portion of the contact layer 6 located on the region to be the channel region of the semiconductor layer 5 is removed to form a gap portion, and the source contact portion 6S and the drain contact portion 6D are separated. At this time, in the gap portion, the vicinity of the surface of the semiconductor layer 5 can also be etched (overetching). In the first manufacturing method described with reference to FIG. 11 and FIG. 12, since the source lower conductive film S1' and the contact layer 6 are etched by dry etching by using the same etching mask, it may be difficult to control the distribution of the etching amount (the amount of digging of the gap portion) of the semiconductor layer 5 throughout the substrate. In contrast, in the second manufacturing method, an advantage is obtained in which the etching amount of the gap portion can be more easily controlled.

Third Manufacturing Method of TFT Substrate 101A

Figure 15:
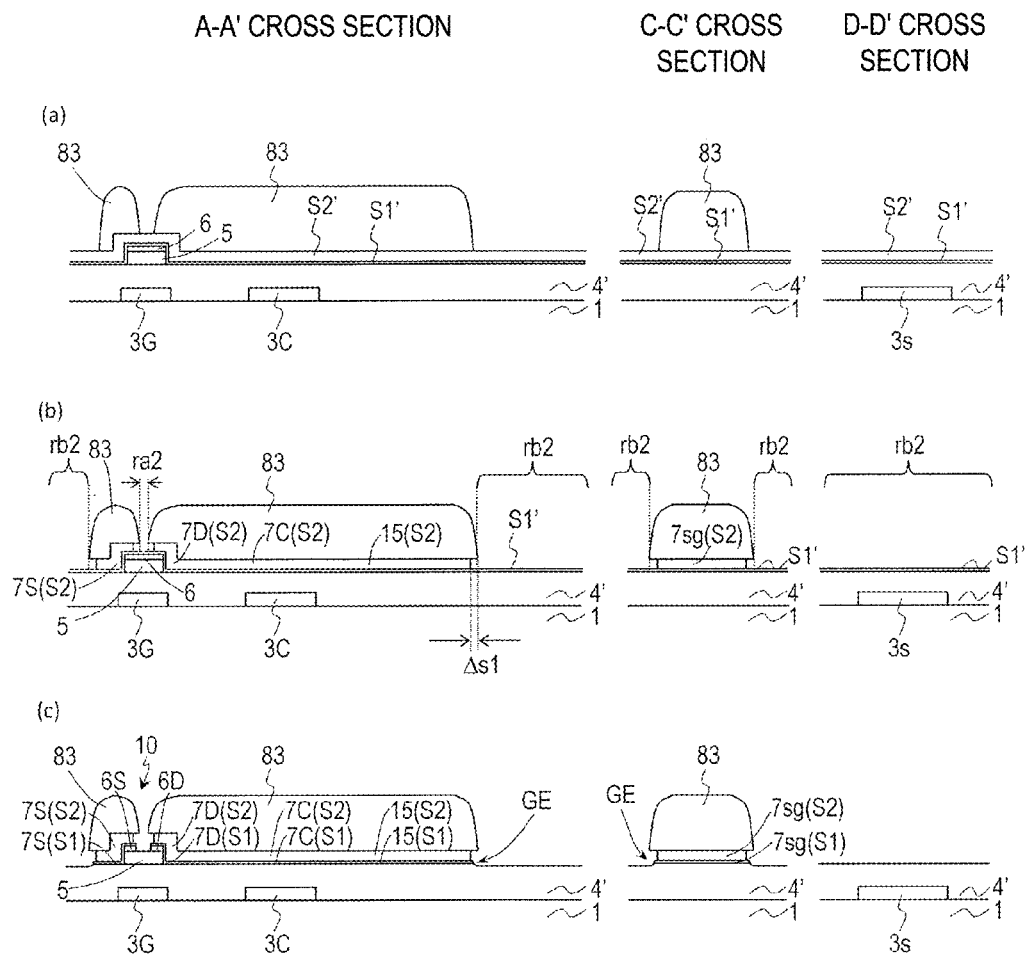
FIGS. 15(a) to 15(c) are schematic cross-sectional views for describing a third manufacturing method of the TFT substrate 101A.

Referring to FIG. 15, a third manufacturing method of the TFT substrate 101A will be described.

The third manufacturing method differs from the first manufacturing method described with reference to FIG. 11 and FIG. 12 in a method for forming the source contact portion 6S, the drain contact portion 6D, the lower source metal layer S1, and the upper source metal layer S2. In the first manufacturing method, two resist layers (the first resist layer 81 and the second resist layer 82) are used as etching masks to etch the source upper conductive film S2', the source lower conductive film S1', and the contact layer 6. In contrast, in the third manufacturing method, the source upper conductive film S2', the source lower conductive film S1', and the contact layer 6 are etched by using the same etching mask.

FIGS. 15(a) to 15(c) are schematic cross-sectional views for describing the third manufacturing method of the TFT substrate 101A. Each of these drawings illustrate a cross section corresponding to FIGS. 4(a), 4(c), and 4(d) (A-A' cross section, C-C' cross section, and D-D' cross section of the TFT substrate 101A). The following description mainly describes differences from the first manufacturing method.

First, as described with reference to FIGS. 7(a) to 7(d), the gate metal layer 3, the gate insulating film 4', the island-shaped semiconductor layer 5, and the contact layer 6 are formed on the dielectric substrate 1.

Next, as illustrated in FIG. 15(a), a source lower conductive film S1' is formed on the gate insulating film 4' and the contact layer 6 by a sputtering or the like, and a source upper conductive film S2' is formed on the source lower conductive film S1'. Thereafter, a resist layer 83 is formed on the source upper conductive film S2' by using photoresist.

Next, as illustrated in FIG. 15(b), the upper source metal layer S2 is formed by etching the source upper conductive film S2' by wet etching or dry etching, using the resist layer 83 as an etching mask. At this time, when viewed from the normal direction of the dielectric substrate 1, the upper source metal layer S2 is formed such that the edge of the upper source metal layer S2 is inside the edge of the resist layer 83, and the distance Δs1 of the edge of the upper source metal layer S2 from the edge of the resist layer 83 is not less than 1.2 times the thickness of the upper source metal layer S2. For example, in a case where the Cu film (having a thickness of 500 nm, for example) is formed as the source upper conductive film S2', the distance Δs1 is 600 nm or greater. Alternatively, in a case where the Al film (having a thickness of 750 nm, for example) and the MoN film (having a thickness of 100 nm, for example) are layered in this order to form a layered film (MoN/Al) as the source upper conductive film S2', the distance Δs1 is 1020 nm or greater.

In the etching process of the source upper conductive film S2', an etchant having a large etch selectivity relative to the etching rate of the source lower conductive film S1' is preferably used. For example, the etch selectivity of the etching rate of the source upper conductive film S2' relative to the etching rate of the source lower conductive film S1' is preferably 20 times or greater.

Next, the source lower conductive film S1' and the contact layer 6 are etched by dry etching, using the resist layer 83 as an etching mask to form the lower source metal layer S1 and the source contact portion 6S and the drain contact portion 6D, as illustrated in FIG. 15(c). Etching of the source lower conductive film S1' and etching of the contact layer 6 may be performed using the same etchant or may be performed using different kinds of etchant.

At a point in time prior to performing this dry etching step, as illustrated in FIG. 15(b), when viewed from the normal direction of the dielectric substrate 1, the region not covered by the resist layer 83 includes the region ra2 including the contact layer 6 and the region rb2 not including the contact layer 6. Both the region ra2 and the region rb2 have the source lower conductive film S1'. In the dry etching step, in the region rb2, the source lower conductive film S1' and/or the gate insulating film 4' are overetched by the portion not including the contact layer 6 compared with the region ra2. In a case where the etching rate of the etchant used in the dry etching step of the source lower conductive film S1' is higher than the etching rate of the source upper conductive film S2', the portion of the source lower conductive film S1' under the resist layer 83 serving as an etching mask is also etched by side etching. In other words, when viewed from the normal direction of the dielectric substrate 1, the edge of the lower source metal layer S1 enters the inside of the edge of the resist layer 83.

However, in the manufacturing method of the present embodiment, the edge of the upper source metal layer S2 is inside of the edge of the resist layer 83 by Δs1, and therefore, as illustrated in FIG. 15(c), the edge of the lower source metal layer S1 is not inside the edge of the upper source metal layer S2. Therefore, the side surface of the source metal layer 7 does not have a reverse tapered shape. For example, as illustrated in FIG. 15(c), the edge of the lower source metal layer S1 is outside the edge of the upper source metal layer S2.

As illustrated in FIG. 15(c) for example, the gate insulating film 4' is etched in the region GE along the edge of the lower source metal layer S1.

Thereafter, the TFT substrate 101A is manufactured by performing the same steps as described with reference to FIGS. 12(a) to 12(d).

In the present manufacturing process, the side surface of the source metal layer 7 is not reverse tapered, that is, the side surface of the source metal layer 7 is tapered or vertical, and thus defects do not occur in the interlayer insulating film 11'. The side surface of the source metal layer 7 is completely covered by the interlayer insulating film 11'. As a result, in the TFT substrate according to the present embodiment, in the antenna unit region U, a portion where the source metal layer 7 is exposed without being covered by the inorganic layer does not occur.

With the TFT substrate of the present embodiment, a deterioration in antenna characteristics can be suppressed.

In the third manufacturing method, the upper source metal layer S2 and the contact layer 6 are formed by using the same etching mask, but in the etching of the source upper conductive film S2', the etching amount is larger by Δs1 (that is, the source upper conductive film S2' is overetched by Δs1). Accordingly, the distance between the source contact portion 6S and the drain contact portion 6D in the channel length direction is smaller than the distance between the upper source metal layer S2 of the source electrode 7S and the upper source metal layer S2 of the drain electrode 7D in the channel length direction.

Thus, according to the third manufacturing method of the present embodiment, even in a case where the thickness of the source metal layer 7 is increased, the occurrence of the problem in that the gap between the source electrode 7S and the drain electrode 7D cannot be controlled with high accuracy can be suppressed.

Fourth Manufacturing Method of TFT Substrate 101A

Figure 16:
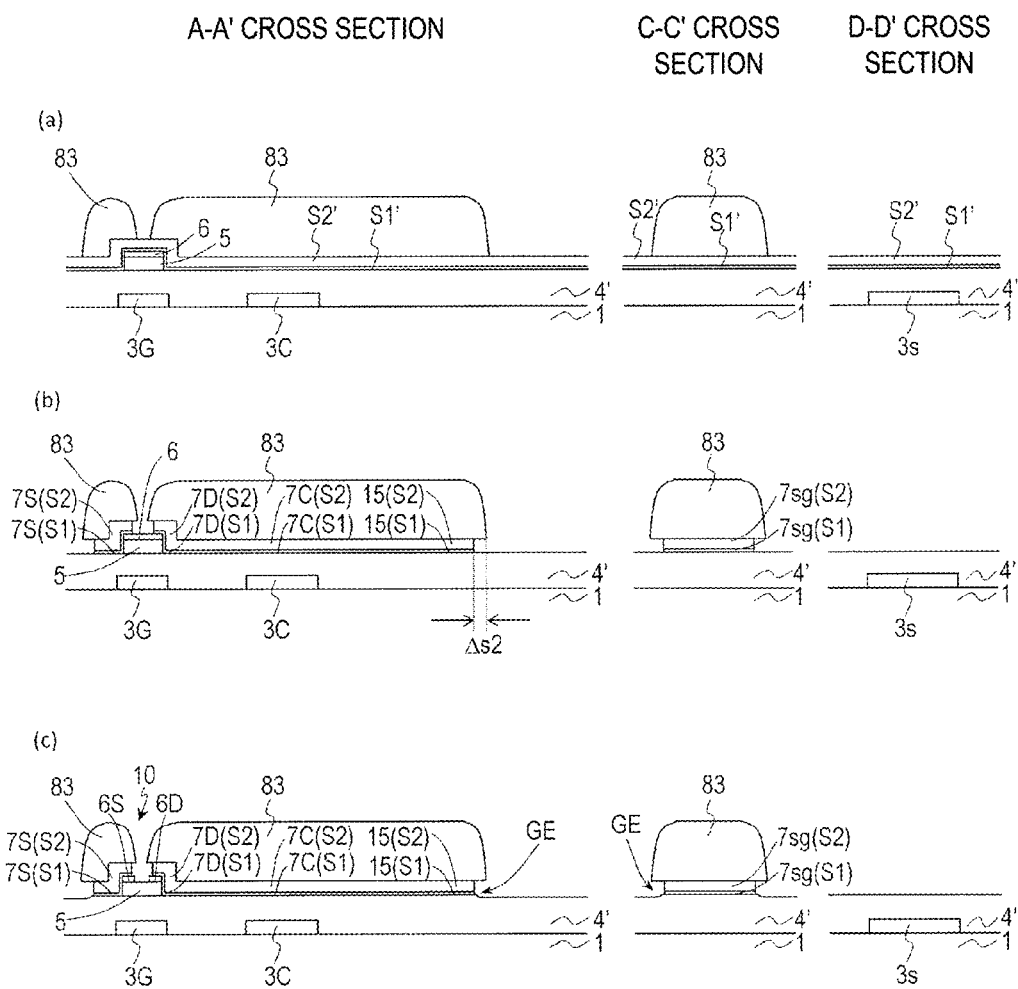
FIGS. 16(a) to 16(c) are schematic cross-sectional views for describing a fourth manufacturing method of the TFT substrate 101A.

Referring to FIG. 16, a fourth manufacturing method of the TFT substrate 101A will be described.

The fourth manufacturing method differs from the third manufacturing method described with reference to FIG. 15 in a method for forming the source contact portion 6S, the drain contact portion 6D, the lower source metal layer S1, and the upper source metal layer S2. In the third manufacturing method, the source upper conductive film S2' is etched by wet etching or dry etching, and then the source lower conductive film S1' and the contact layer 6 are etched by dry etching. In contrast, in the fourth manufacturing method, the source upper conductive film S2' and the source lower conductive film S1' are etched by wet etching or dry etching, and the contact layer 6 is then etched by dry etching.

FIGS. 16(a) to 16(c) are schematic cross-sectional views for describing the fourth manufacturing method of the TFT substrate 101A. Each of these drawings illustrate a cross section corresponding to FIGS. 4(a), 4(c), and 4(d) (A-A' cross section, C-C' cross section, and D-D' cross section of the TFT substrate 101A). The following description mainly describes differences from the third manufacturing method.

First, as described with reference to FIGS. 7(a) to 7(d), the gate metal layer 3, the gate insulating film 4', the island-shaped semiconductor layer 5, and the contact layer 6 are formed on the dielectric substrate 1.

Next, as illustrated in FIG. 16(a), a source lower conductive film S1' is formed on the gate insulating film 4' and the contact layer 6 by a sputtering or the like, and a source upper conductive film S2' is formed on the source lower conductive film S1'. Thereafter, a resist layer 83 is formed on the source upper conductive film S2' by using photoresist.

Next, as illustrated in FIG. 16(b), the upper source metal layer S2 and the lower source metal layer S1 are formed by etching the source upper conductive film S2' and the source lower conductive film S1' by wet etching or dry etching, using the resist layer 83 as an etching mask. At this time, when viewed from the normal direction of the dielectric substrate 1, the lower source metal layer S1 is formed such that the edge of the lower source metal layer S1 is inside the edge of the resist layer 83, and the distance Δs2 of the edge of the lower source metal layer S1 from the edge of the resist layer 83 is not less than 1.8 times the thickness of the upper source metal layer S2. The length determined as the distance Δs2 is greater than the length determined by the third manufacturing method as the distance Δs1 (see FIG. 15(b)).

In this etching step, the etching conditions are adjusted so that the etching rate of the source lower conductive film S1' is less than or equal to the etching rate of the source upper conductive film S2'. Accordingly, when this etching step is completed, the upper source metal layer S2 and the lower source metal layer S1 are formed such that the edges of the lower source metal layer S1 do not enter more inside than the edges of the upper source metal layer S2. At the time of completion of etching step, the side surface of the source metal layer 7 is not reverse tapered (i.e., the side surface of the source metal layer 7 is tapered or vertical). FIG. 15(b) illustrates, for simplicity, an example in which the edge of the lower source metal layer S1 and the edge of the upper source metal layer S2 overlap when viewed from the normal direction of the dielectric substrate 1 when the etching step is completed. However, the disclosure is not limited to the illustrated example, and the edge of the lower source metal layer S1 may be outside the edge of the upper source metal layer S2 when viewed from the normal direction of the dielectric substrate 1 when the etching step is completed.

Etching of the source upper conductive film S2' and etching of the source lower conductive film S1' may be performed by using the same etchant or may be performed by using different kinds of etchant so long as the condition that the etching rate of the source lower conductive film S1' is less than or equal to the etching rate of the source upper conductive film S2' is satisfied.

Note that, in a case where the upper source metal layer S2 is formed as described above, when viewed from the normal direction of the dielectric substrate 1, the upper source metal layer S2 is formed such that the edge of the upper source metal layer S2 is inside the edge of the resist layer 83, and the distance of the edge of the upper source metal layer S2 from the edge of the resist layer 83 is not less than 1.2 times the thickness of the upper source metal layer S2.

Next, as illustrated in FIG. 16(c), the source contact portion 6S and the drain contact portion 6D are formed by etching the contact layer 6 by dry etching, using the resist layer 83 as an etching mask.

In this dry etching step, the edge of the lower source metal layer S1 is inside of the edge of the resist layer 83 by Δs2, so the lower source metal layer S1 is not etched with the resist layer 83 as an obstacle. Therefore, the side surface of the source metal layer 7 remains not having a reverse tapered shape.

Note that, similar to the manufacturing method described above, the gate insulating film 4' may also be etched in the dry etching step. For example, as illustrated in FIG. 16(c), the gate insulating film 4' is etched in the region GE between the edge of the resist layer 83 and the edge of the lower source metal layer S1.

Thereafter, the TFT substrate 101A is manufactured by performing the same steps as described with reference to FIGS. 13(a) to 13(d).

In the fourth manufacturing method of the present embodiment, because the side surface of the source metal layer 7 is not reverse tapered, defects do not occur in the interlayer insulating film 11'. The side surface of the source metal layer 7 is completely covered by the interlayer insulating film 11'. As a result, in the TFT substrate according to the present embodiment, in the antenna unit region U, a portion where the source metal layer 7 is exposed without being covered by the inorganic layer does not occur. With the TFT substrate of the present embodiment, a deterioration in antenna characteristics can be suppressed.

In the present manufacturing method, the lower source metal layer S1 and the contact layer 6 are formed by using the same etching mask, but in the etching of the source lower conductive film S1', the etching amount is larger by Δs2 (in other words, the source lower conductive film S1' is overetched by Δs2). Accordingly, the distance between the source contact portion 6S and the drain contact portion 6D in the channel length direction is less than the distance between the lower source metal layer S1 of the source electrode 7S and the lower source metal layer S1 of the drain electrode 7D in the channel length direction. The edge of the lower source metal layer S1 does not enter inside the edge of the upper source metal layer S2, so the distance between the source contact portion 6S and the drain contact portion 6D in the channel length direction is less than the distance between the upper source metal layer S2 of the source electrode 7S and the upper source metal layer S2 of the drain electrode 7D in the channel length direction.

Thus, according to the fourth manufacturing method of the present embodiment, even when the thickness of the source metal layer 7 is increased, the occurrence of the problem in that the gap between the source electrode 7S and the drain electrode 7D cannot be controlled with high accuracy can be suppressed.

Note that the TFT substrate according to the present embodiment is not limited to the TFT substrate manufactured by any of the manufacturing methods described above.

While the TFT substrate 101A in which the patch electrode 15 is included in the source metal layer 7 has been described as an example, the embodiments of the disclosure are not limited thereto. As described above, the problem of deteriorating the antenna characteristics occurs due to defects generated in the inorganic layer formed on the source metal layer 7 when the side surface of the source metal layer 7 in the antenna unit region U is reverse tapered. The smaller the sum of the thicknesses of the inorganic layer formed on the source metal layer 7, the more likely defects tend to be generated in the inorganic layer (for example, tend to be discontinuous) and the source metal layer 7 is exposed. Therefore, the embodiment of the disclosure is suitably applied to a TFT substrate including a structure in which one inorganic layer covers the side surface of the source metal layer in the antenna unit region. In general, from the perspective of antenna performance, it is preferable that the thickness of the inorganic layer (insulating layer or oxide conductive layer) covering the patch electrode is small. Therefore, because the patch electrode is likely to be covered by one inorganic layer, the TFT substrate 101A in which the patch electrode 15 is included in the source metal layer 7 is illustrated as an embodiment of the disclosure. Since the patch electrode 15 is included in the source metal layer 7, the TFT substrate 101A of the present embodiment has the advantage that the number of manufacturing steps (for example, the number of photomasks) and manufacturing cost can be reduced.

In the antenna unit region, the conductive layer that forms the patch electrode is not limited to this example as long as having a structure in which the side surface of the source metal layer covers one inorganic layer. The patch electrode 15 is not limited to this example, and may be included in the gate metal layer 3, or may be included in a conductive layer different from both the gate metal layer 3 and the source metal layer 7. In this case, the conductive layer including the patch electrode 15 (also referred to as a "patch metal layer") is not limited to the examples described above. The patch metal layer has a layered structure including a low resistance metal layer and a high melting-point metal containing layer under the low resistance metal layer, for example. The layered structure may further include a high melting-point metal containing layer over the low resistance metal layer. The low resistance metal layer of the patch metal layer may be referred to as a "main layer", and the high melting-point metal containing layers under and over the low resistance metal layer may be referred to as a "lower layer" and an "upper layer", respectively. The "high melting-point metal containing layer" is a layer containing at least one element selected from the group consisting of titanium (Ti), tungsten (W), molybdenum (Mo), tantalum (Ta), and niobium (Nb). The "high melting-point metal containing layer" may have a layered structure. For example, the high melting-point metal containing layer refers to a layer formed of any of Ti, W, Mo, Ta, Nb, an alloy containing these, and a nitride of these, and a solid solution of the above metal(s) or alloy and the nitride. The "low resistance metal layer" is a layer containing at least one element selected from the group consisting of copper (Cu), aluminum (Al), silver (Ag), and gold (Au). The "low resistance metal layer" may have a layered structure.

The semiconductor film used in the semiconductor layer 5 is not limited to an amorphous silicon film. For example, an oxide semiconductor layer may be formed as the semiconductor layer 5. In general, it is known that the source contact portion and the drain contact portion need not be provided between the oxide semiconductor layer and the source electrode and the drain electrode, but of course they may also be provided. The embodiments of the disclosure can be applied by providing a source contact portion and drain contact portion between the oxide semiconductor layer and the source electrode and the drain electrode.

Structure of Slot Substrate 201

Next, the structure of the slot substrate 201 will be described concretely with reference to FIGS. 17(a) and 17(b).

Figure 17:
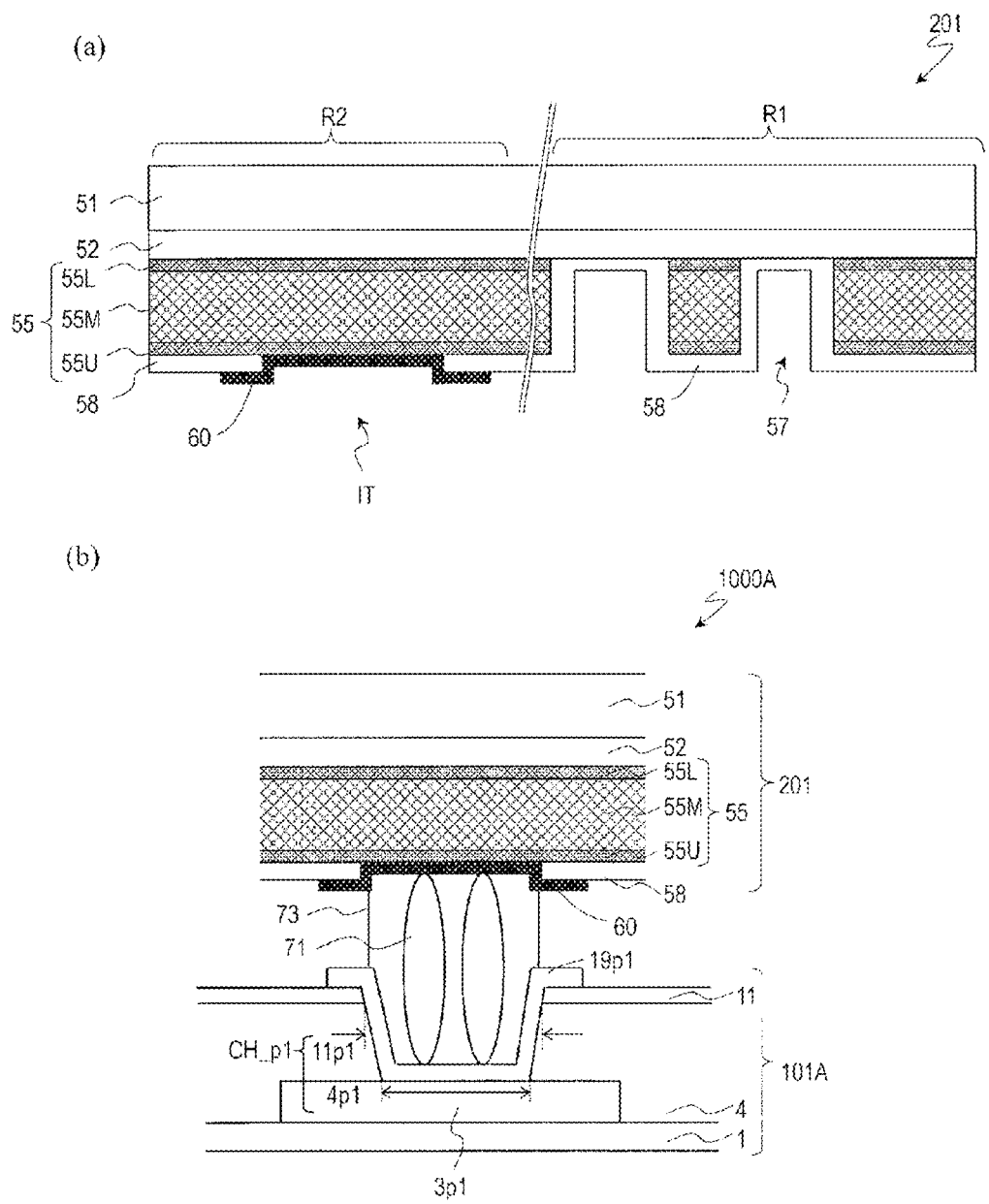
FIG. 17(a) is a cross-sectional view schematically illustrating the slot substrate 201.
FIG. 17(b) is a schematic cross-sectional view for illustrating a transfer section in the TFT substrate 101A and the slot substrate 201.

FIG. 17(a) is a cross-sectional view schematically illustrating the antenna unit region U and the terminal section IT in the slot substrate 201.

The slot substrate 201 includes the dielectric substrate 51 including a front surface and a rear surface, a third insulating layer 52 formed on the front surface of the dielectric substrate 51, the slot electrode 55 formed on the third insulating layer 52, and a fourth insulating layer 58 covering the slot electrode 55. The reflective conductive plate 65 is disposed opposing the rear surface of the dielectric substrate 51 with the dielectric layer (air layer) 54 interposed therebetween. The slot electrode 55 and the reflective conductive plate 65 function as walls of the waveguide 301.

In the transmission and/or reception region R1, a plurality of slots 57 are formed in the slot electrode 55. The slot 57 is an opening that opens through the slot electrode 55. In this example, one slot 57 is disposed in each antenna unit region U.

The fourth insulating layer 58 is formed on the slot electrode 55 and within the slot 57. The material of the fourth insulating layer 58 may be the same as the material of the third insulating layer 52. By covering the slot electrode 55 with the fourth insulating layer 58, the slot electrode 55 and the liquid crystal layer LC are not in direct contact with each other, such that the reliability can be enhanced. In a case where the slot electrode 55 is formed of a Cu layer, Cu may elute into the liquid crystal layer LC in some cases. In addition, in a case where the slot electrode 55 is formed of an Al layer by using a thin film deposition technique, the Al layer may include a void. The fourth insulating layer 58 can prevent the liquid crystal material from entering the void of the Al layer. Note that in a case where the Al layer is formed by bonding an aluminum foil to the dielectric substrate 51 by using an adhesive material and the slot electrode 55 is formed by patterning the Al layer, the problem of voids can be avoided.

The slot electrode 55 includes a main layer 55M such as a Cu layer or an Al layer. The slot electrode 55 may have a layered structure that includes the main layer 55M, as well as an upper layer 55U and a lower layer 55L disposed sandwiching the main layer 55M therebetween. A thickness of the main layer 55M may be set in consideration of the skin effect depending on the material, and may be, for example, greater than or equal to 2 μm and less than or equal to 30 μm. The thickness of the main layer 55M is typically greater than the thickness of the upper layer 55U and the lower layer 55L.

In the illustrated example, the main layer 55M is a Cu layer, and the upper layer 55U and the lower layer 55L are Ti layers. By disposing the lower layer 55L between the main layer 55M and the third insulating layer 52, the adhesion between the slot electrode 55 and the third insulating layer 52 can be improved. In addition, by providing the upper layer 55U, corrosion of the main layer 55M (e.g., the Cu layer) can be suppressed.

Since the reflective conductive plate 65 constitutes the wall of the waveguide 301, it is desirable that the reflective conductive plate 65 has a thickness that is three times or greater than the skin depth, and preferably five times or greater. An aluminum plate, a copper plate, or the like having a thickness of several millimeters manufactured by a cutting out process can be used as the reflective conductive plate 65.

The terminal section IT is provided in the non-transmission and/or reception region R2. The terminal section IT includes the slot electrode 55, the fourth insulating layer 58 covering the slot electrode 55, and an upper connection section 60. The fourth insulating layer 58 includes an opening that at least reaches the slot electrode 55. The upper connection section 60 is in contact with the slot electrode 55 within the opening. In the present embodiment, the terminal section IT is disposed in the seal region Rs, and is connected to the transfer terminal section on the TFT substrate (transfer section) by a seal resin containing conductive particles.

Transfer Section

FIG. 17(b) is a schematic cross-sectional view for illustrating the transfer section connecting the first transfer terminal section PT1 of the TFT substrate 101A and the terminal section IT of the slot substrate 201. In FIG. 17(b), the components similar to those in the foregoing figures are denoted by the same reference numerals.

In the transfer section, the upper connection section 60 of the terminal section IT is electrically connected to the first transfer terminal upper connection section 19p1 of the first transfer terminal section PT1 in the TFT substrate 101A. In the present embodiment, the upper connection section 60 is connected to the upper connection section 19p1 with a resin (sealing resin) 73 (also referred to as a sealing portion 73) including conductive beads 71 interposed therebetween.

Each of the upper connection sections 60 and 19p1 is a transparent conductive layer such as an ITO film or an IZO film, and there is a possibility that an oxide film is formed on the surface thereof. In a case where an oxide film is formed, the electrical connection between the transparent conductive layers cannot be ensured, and the contact resistance may increase. In contrast, in the present embodiment, since these transparent conductive layers are bonded with a resin including conductive beads (for example, Au beads) 71 therebetween, even in a case where a surface oxide film is formed, the conductive beads pierce (penetrate) the surface oxide film, allowing an increase in contact resistance to be suppressed. The conductive beads 71 may penetrate not only the surface oxide film but also the upper connection sections 60 and 19p1 which are the transparent conductive layers, and directly contact the lower connection section 3p1 and the slot electrode 55.

The transfer section may be disposed at both a center portion and a peripheral portion of the scanning antenna 1000A (that is, inside and outside of the donut-shaped transmission and/or reception region R1 when viewed from the normal direction of the scanning antenna 1000A), or alternatively may be disposed at only one of them. The transfer section may be disposed in the seal region Rs in which the liquid crystals are sealed, or may be disposed outside the seal region Rs (opposite to the liquid crystal layer).

Manufacturing Method of Slot Substrate 201

The slot substrate 201 can be manufactured by the following method, for example.

First, the third insulating layer (having a thickness of 200 nm, for example) 52 is formed on the dielectric substrate. A substrate such as a glass substrate or a resin substrate having a high transmittance to electromagnetic waves (the dielectric constant $\varepsilon_M$ and the dielectric loss tan $\delta_M$ are small) can be used as the dielectric substrate. The dielectric substrate is preferably thin in order to suppress the attenuation of the electromagnetic waves. For example, after forming the constituent elements such as the slot electrode 55 on the front surface of the glass substrate by a process to be described later, the glass substrate may be thinned from the rear side. This allows the thickness of the glass substrate to be reduced to 500 μm or less, for example.

In a case where a resin substrate is used as the dielectric substrate, constituent elements such as TFTs may be formed directly on the resin substrate, or may be formed on the resin substrate by a transfer method. In a case of the transfer method, for example, a resin film (for example, a polyimide film) is formed on the glass substrate, and after the constituent elements are formed on the resin film by the process to be described later, the resin film on which the constituent elements are formed is separated from the glass substrate. Generally, the dielectric constant $\varepsilon_M$ and the dielectric loss tan $\delta_M$ of resin are smaller than those of glass. The thickness of the resin substrate is, for example, from 3 μm to 300 μm. Besides polyimide, for example, a liquid crystal polymer can also be used as the resin material.

The third insulating layer 52 is not particularly limited to a specific film, and, for example, a silicon oxide ($SiO_2$) film, a silicon nitride ($SiN_x$) film, a silicon oxynitride ($SiO_xN_y$; x>y) film, a silicon nitride oxide ($SiN_xO_y$; x>y) film, or the like can be used as appropriate.

Next, a metal film is formed on the third insulating layer 52, and this is patterned to obtain the slot electrode 55 including the plurality of slots 57. As the metal film, a Cu film (or Al film) having a thickness of from 2 μm to 5 μm may be used. Here, as the metal film, a layered film formed by layering a Ti (having a thickness of 20 nm, for example) and a Cu (having a thickness of 3000 nm, for example) in this order is used. Note that a layered film may be formed by layering a Ti film, a Cu film, and a Ti film in this order.

After that, the fourth insulating layer (having a thickness of 100 nm or 200 nm, for example) 58 is formed on the slot electrode 55 and within the slot 57. The material of the fourth insulating layer 58 may be the same as the material of the third insulating layer. Subsequently, in the non-transmission and/or reception region R2, an opening that at least reaches the slot electrode 55 is formed in the fourth insulating layer 58.

Next, a transparent conductive film is formed on the fourth insulating layer 58 and within the opening of the fourth insulating layer 58, and is patterned to form the upper connection section 60 in contact with the slot electrode 55 within the opening. In this way, the terminal section IT is obtained.

Material and Structure of TFT 10

In the present embodiment, a TFT including a semiconductor layer 5 as an active layer is used as a switching element disposed in each pixel. The semiconductor layer 5 is not limited to an amorphous silicon layer, and may be a polysilicon layer or an oxide semiconductor layer.

In a case where an oxide semiconductor layer is used, the oxide semiconductor included in the oxide semiconductor layer may be an amorphous oxide semiconductor or a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer may have a layered structure including two or more layers. In a case where the oxide semiconductor layer includes a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In a case where the oxide semiconductor layer has a dual-layer structure including an upper layer and a lower layer, an energy gap of the oxide semiconductor included in the upper layer is preferably greater than an energy gap of the oxide semiconductor included in the lower layer. However, when a difference in the energy gap between these layers is relatively small, the energy gap of the oxide semiconductor in the lower layer may be greater than the energy gap of the oxide semiconductor in the upper layer.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A. The entire contents of the disclosure of JP 2014-007399 A are incorporated herein as reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer can be formed of an oxide semiconductor film including an In—Ga—Zn—O based semiconductor.

The In—Ga—Zn—O based semiconductor may be an amorphous semiconductor, or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein as reference. Since a TFT including an In—Ga—Zn—O based semiconductor layer has high mobility (more than 20 times in comparison with a-Si TFTs) and low leakage current (less than 1/100th in comparison with a-Si TFTs), such a TFT can suitably be used as a driving TFT (for example, a TFT included in a driving circuit provided in the non-transmission and/or reception region) and a TFT provided in each antenna unit region.

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

Second Embodiment

In the previous embodiment, the TFT has a bottom gate structure. That is, the semiconductor layer is located on the gate electrode. The present embodiment differs from the previous embodiment in that the TFT has a top gate structure.

TFT Substrate 102R of Reference Example 2
(Antenna Unit Region U)

Prior to describing the detailed structure of the TFT substrate 102A of the present embodiment, first, the TFT substrate 102R of Reference Example 2 will be described. In a case where the inventors prototyped and drove a scanning antenna equipped with the TFT substrate 102R of Reference Example 2, the antenna characteristics were deteriorated in some cases. Note that, in the following description, descriptions of configurations that are common to the TFT substrate 102A of the present embodiment may be omitted.

Figure 18:
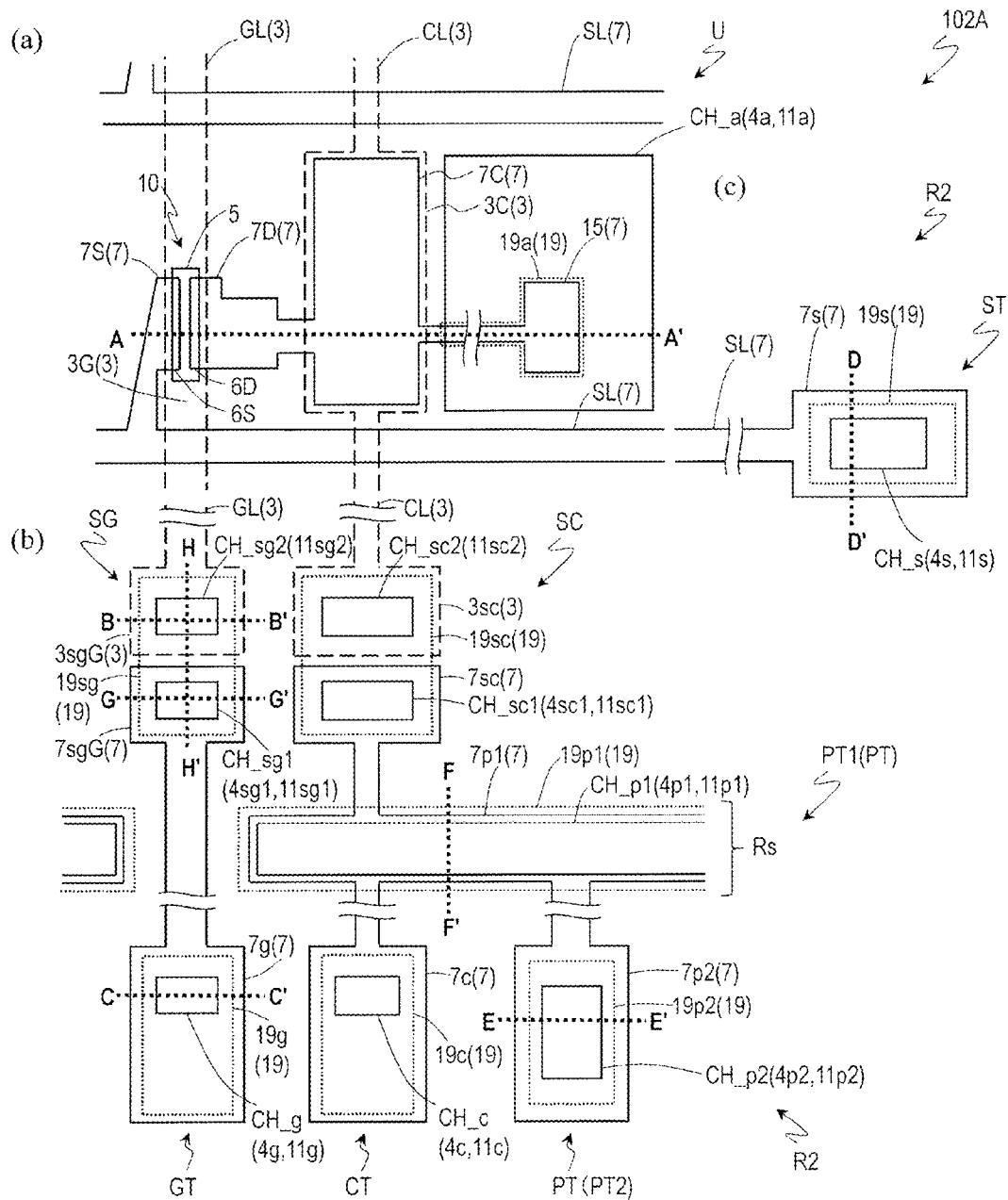
FIG. 18(a) is a schematic plan view of an antenna unit region U of a transmission and/or reception region R1 of a TFT substrate 102A according to a second embodiment of the disclosure.
FIGS. 18(b) and 18(c) are schematic plan views of a non-transmission and/or reception region R2 of the TFT substrate 102A.
Figure 21:
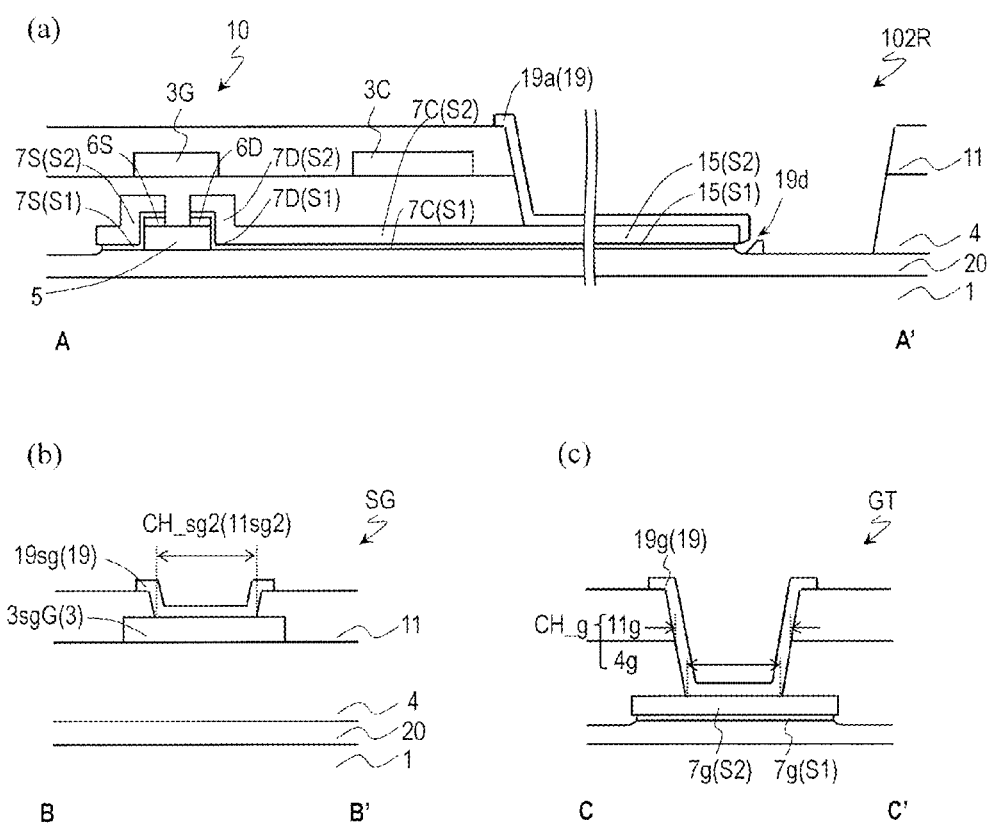
FIGS. 21(a) to 21(c) are schematic cross-sectional views of a TFT substrate 102R of Reference Example 2.

Referring to FIG. 18(*a*) and FIG. 21(*a*), the TFT substrate 102R of Reference Example 2 will be described. FIG. 18(*a*) is a schematic plan view of the antenna unit region U of the transmission and/or reception region R1 of the TFT substrate 102A. Here, a case in which the plan view of the TFT substrate 102R of Reference Example 2 is the same as the plan view of the TFT substrate 102A illustrated in FIG. 18 will be described as an example, so reference may be also made to FIG. 18 in the description of the TFT substrate 102R of Reference Example 2. FIG. 21(*a*) is a schematic cross-sectional view of the antenna unit region U of the TFT substrate 102R of Reference Example 2, and illustrates a cross-sectional view along the line A-A' in FIG. 18. In FIGS. 18 and 21, components common to the previous embodiment are denoted common reference numerals, and the descriptions thereof may be omitted.

As illustrated in FIG. 18(*a*) and FIG. 21(*a*), the TFT substrate 102R of Reference Example 2 differs from the TFT substrate 101R of Reference Example 1 illustrated in FIG.

3(a) and FIG. 6(a) in that the TFT substrate 102R includes the TFT 10 of the top gate structure. The gate electrode 3G is positioned above the source electrode 7S and the drain electrode 7D. In other words, in the TFT substrate 102R of Reference Example 2, the gate metal layer 3 is positioned above the source metal layer 7. The TFT substrate 102R of Reference Example 2 includes a semiconductor layer 5 supported by the dielectric substrate 1, a source metal layer 7 formed on the semiconductor layer 5, a source contact portion 6S and a drain contact portion 6D formed between the semiconductor layer 5 and the source metal layer 7, a gate metal layer 3 formed on the source metal layer 7, and an interlayer insulating layer 11 formed on the gate metal layer 3. The interlayer insulating layer 11 is formed to cover the TFT 10. The TFT substrate 102R of Reference Example 2 further includes an upper conductive layer 19 formed on the interlayer insulating layer 11.

The TFT substrate 102R of Reference Example 2 may further include a base insulating layer 20 between the dielectric substrate 1 and the semiconductor layer 5. The base insulating layer 20 may be formed, for example, on the entire surface of the dielectric substrate 1. Note that the base insulating layer 20 may be omitted.

The contact hole CH_a that at least reaches the patch electrode 15 is formed in the gate insulating layer 4 and the interlayer insulating layer 11.

The gate insulating layer 4 includes an opening 4a that at least reaches the patch electrode 15. The interlayer insulating layer 11 includes the opening 11a overlapping the opening 4a formed in the gate insulating layer 4 when viewed from the normal direction of the dielectric substrate 1. The opening 4a formed in the gate insulating layer 4 and the opening 11a formed in the interlayer insulating layer 11 constitute a contact hole CH_a.

The upper conductive layer 19 includes a patch conductive portion 19a that is connected to the patch electrode 15 within the contact hole CH_a. The patch conductive portion 19a is formed covering the source metal layer 7 (including the patch electrode 15) exposed in the opening 4a.

As illustrated in FIG. 21(a), in the TFT substrate 102R of Reference Example 2, when viewed from the normal direction of the dielectric substrate 1, the edge of the lower source metal layer S1 is inside the edge of the upper source metal layer S2. In other words, the source metal layer 7 includes a reverse tapered side surface. By the side surface of the source metal layer 7 being reverse tapered, defects occur in the inorganic layer formed on the source metal layer 7.

Here, a defect 19d occurs in the upper conductive layer 19 (the patch conductive portion 19a) formed to cover the patch electrode 15 exposed by the contact hole CH_a. Since the upper conductive layer 19 of the TFT substrate 102R of Reference Example 2 includes the defect 19d, the metal ions (Cu ions or Al ions) are dissolved from the source metal layer 7 (in particular, the patch electrode 15) to the liquid crystal layer in the scanning antenna equipped with the TFT substrate 102R of Reference Example 2, the liquid crystal material deteriorates and antenna characteristics are deteriorated.

Note that in the plan view, for simplicity, the edges of the lower source metal layer S1 and the edges of the upper source metal layer S2 may not be distinguished. Similarly, the edges of the source contact portion 6S and the drain contact portion 6D may not be distinguished from the edges of the lower source metal layer S1 and/or the edges of the upper source metal layer S2.

In this example, among the electrodes and the conductive portions included in the source metal layer 7, metal ions are dissolved mainly from the patch electrode 15. The patch electrode 15 is exposed from the gate insulating layer 4 and the interlayer insulating layer 11 by the contact hole CH_a, and is covered with the upper conductive layer 19 (for example, transparent conductive layer). In contrast, besides the patch electrode 15, since the gate insulating layer 4 and the interlayer insulating layer 11 are formed on the source metal layer 7, the sum of the thicknesses of the inorganic layers formed on the source metal layer 7 (here, the sum of the thicknesses of the gate insulating layer 4 and the interlayer insulating layer 11) is larger. Therefore, as described above, the side surface of the source metal layer 7 is likely to be completely covered. For example, even in a case where defects occur in the gate insulating layer 4 formed on the source metal layer 7, the side surfaces of the source metal layer 7 exposed to the defects may be completely covered by the interlayer insulating layer 11 formed on the gate insulating layer 4.

Note that, in the cross-sectional view, for simplicity, the gate insulating layer 4 and/or the interlayer insulating layer 11 may be represented as a flattened layer, but in general, a layer formed by a thin film deposition method (for example, a CVD, a sputtering, or a vacuum vapor deposition method) has a surface that reflects the step of the underlayer.

TFT Substrate 102A (Antenna Unit Region U)

With reference to FIG. 18(a) and FIG. 19(a), the structure of the antenna unit region U of the TFT substrate 102A included in the scanning antenna according to the present embodiment will be described.

FIG. 18(a) is a schematic plan view of the antenna unit region U of the transmission and/or reception region R1 of the TFT substrate 102A. FIG. 19(a) is a schematic cross-sectional view of the TFT substrate 102A, showing a cross-section taken along the line A-A' in FIG. 18(a).

As illustrated in FIG. 18(a) and FIG. 19(a), the TFT substrate 102A differs from the TFT substrate 101A in that the TFT substrate 102A includes the TFT 10 of the top gate structure. The gate electrode 3G is positioned above the source electrode 7S and the drain electrode 7D. In other words, the gate metal layer 3 is positioned above the source metal layer 7.

As illustrated in FIG. 18(a) and FIG. 19(a), in the TFT substrate 102A, unlike the TFT substrate 102R of Reference Example 2, when viewed from the normal direction of the dielectric substrate 1, the edge of the lower source metal layer S1 is not inside the edge of the upper source metal layer S2. That is, when viewed from the normal direction of the dielectric substrate 1, the edge of the lower source metal layer S1 is outside the edge of the upper source metal layer S2, or the edge of the lower source metal layer S1 overlaps with the edge of the upper source metal layer S2.

The source metal layer 7 of the TFT substrate 102A does not have a reverse tapered side surface. In other words, the source metal layer 7 includes a tapered or vertical side surface. Since the side surface of the source metal layer 7 is tapered or vertical, the source metal layer 7 can be completely covered by the inorganic layer (here, the upper conductive layer 19) formed on the source metal layer 7. As a result, in the scanning antenna equipped with the TFT substrate 102A, it is possible to suppress the dissolving of metal ions (Cu ions or Al ions) in the liquid crystal layer LC from the source metal layer 7. The scanning antenna provided with the TFT substrate 102A can suppress a deterioration in antenna characteristics.

Note that the present embodiment is not limited to the illustrated example. For example, the gate insulating layer 4 or the interlayer insulating layer 11 includes an opening that overlaps the patch electrode 15 when viewed from the normal direction of the dielectric substrate 1, and the patch conductive portion 19a may be omitted. In this case, in the antenna unit region U, the side surface of the source metal layer 7 (here, the patch electrode 15) is covered with one inorganic layer (the interlayer insulating layer 11 or the gate insulating layer 4). In such a TFT substrate, a deterioration in antenna characteristics can be suppressed.

Structure of TFT Substrate 102A (Non-Transmission and/or Reception Region R2)

Figure 19:
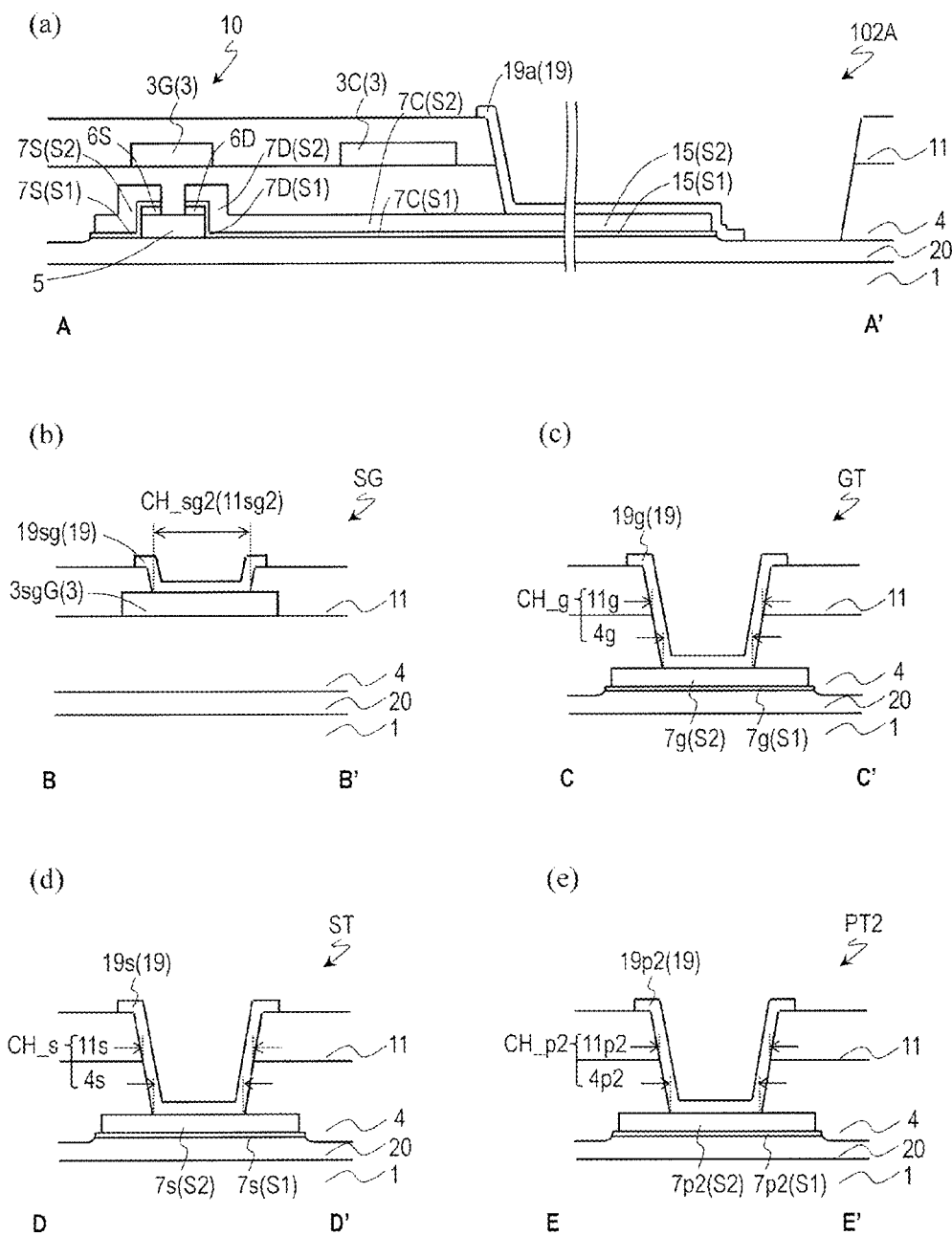
FIGS. 19(a) to 19(e) are schematic cross-sectional views of the TFT substrate 102A.
Figure 20:
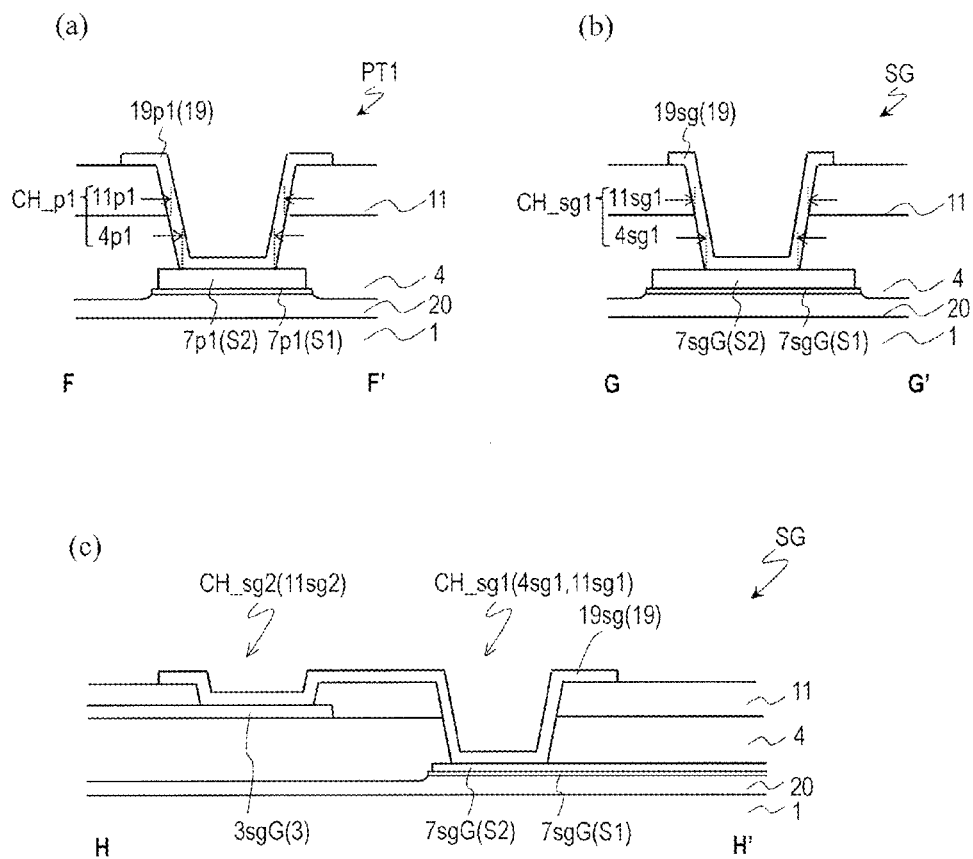
FIGS. 20(a) to 20(c) are schematic cross-sectional views of the TFT substrate 102A.

Referring to FIGS. 18 to 20, a structure of a non-transmission and/or reception region R2 of the TFT substrate 102A according to the present embodiment will be described. However, the structure of the non-transmission and/or reception region R2 of the TFT substrate 102A is not limited to the illustrated example.

FIGS. 18(b) and 18(c) are schematic plan views of the non-transmission and/or reception region R2 of the TFT substrate 102A, and FIGS. 19(b) to 19(e) and FIGS. 20(a) to 20(c) are schematic cross-sectional views of the non-transmission and/or reception region R2 of the TFT substrate 102A.

FIG. 18(b) illustrates the gate terminal section GT, the CS terminal section CT, the transfer terminal section PT, the source-gate connection section SG, and the CS-source connection section SC provided in the non-transmission and/or reception region R2, and FIG. 18(c) illustrates the source terminal section ST provided in the non-transmission and/or reception region R2. FIG. 19(b) illustrates a cross section of the source-gate connection section SG taken along the line B-B' in FIG. 18(b), and FIG. 19(c) illustrates a cross section of the gate terminal section GT taken along the line C-C' in FIG. 18(b), FIG. 19(d) illustrates a cross section of the source terminal section ST taken along the line D-D' in FIG. 18(c), FIG. 19(e) illustrates a cross section of the second transfer terminal section PT2 taken along the line E-E' in FIG. 18(b), FIG. 20(a) illustrates a cross section of the first transfer terminal section PT1 taken along the line F-F' in FIG. 18(b), FIG. 20(b) illustrates a cross section of the source-gate connection section SG taken along the line G-G' in FIG. 18(b), and FIG. 20(c) illustrates a cross section of the source-gate connection section SG taken along the line H-H' in FIG. 18(b).

Source-Gate Connection Section SG

The TFT substrate 102A includes a source-gate connection section SG in the non-transmission and/or reception region R2. The source-gate connection section SG electrically connects each gate bus line GL to a connection wiring line (also referred to as a "gate lower connection wiring line") formed in the source metal layer 7. A lower connection section of the gate terminal section GT can be formed of the source metal layer 7 by providing the source-gate connection section SG. The gate terminal section GT including the lower connection section formed of the source metal layer 7 is excellent in reliability.

As illustrated in FIG. 18(b), FIG. 19(b), FIG. 20(b), and FIG. 20(c), the source-gate connection section SG electrically connects the gate bus line GL and the gate lower connection wiring line 7sgG via the source bus line upper connection section 19sg.

Specifically, the source-gate connection section SG includes a gate lower connection wiring line 7sgG, an opening 4sg1 formed in the gate insulating layer 4, a gate bus line connection section 3sgG connected to the gate bus line GL, an opening 11sg1 and an opening 11sg2 formed in the interlayer insulating layer 11, and an upper connection section 19sg.

The gate lower connection wiring line 7sgG is included in the source metal layer 7, and is electrically separated from the source bus line SL.

The opening 4sg1 formed in the gate insulating layer 4 at least reaches the gate lower connection wiring line 7sgG.

The gate bus line connection section 3sgG is included in the gate metal layer 3 and is connected to the gate bus line GL. In this example, the gate bus line connection section 3sgG extends from the gate bus line GL and is formed integrally with the gate bus line GL. A width of the gate bus line connection section 3sgG may be larger than a width of the gate bus line GL.

The opening 11sg1 formed in the interlayer insulating layer 11 overlaps the opening 4sg1 formed in the gate insulating layer 4 when viewed from the normal direction of the dielectric substrate 1. The opening 4sg1 formed in the gate insulating layer 4 and the opening 11sg1 formed in the interlayer insulating layer 11 constitute a contact hole CH_sg1.

The opening 11sg2 formed in the interlayer insulating layer 11 at least reaches the gate bus line connection section 3sgG. The opening 11sg2 formed in the interlayer insulating layer 11 may be referred to as a contact hole CH_sg2.

The upper connection section 19sg is included in the upper conductive layer 19. The upper connection section 19sg is formed on the interlayer insulating layer 11, within the contact hole CH_sg1, and within the contact hole CH_sg2, is connected to the gate lower connection wiring line 7sgG within the contact hole CH_sg1, and is connected to the gate bus line connection section 3sgG within the contact hole CH_sg2. That is, the upper connection section 19sg is in contact with the gate lower connection wiring line 7sgG within the opening 4sg1 formed in the gate insulating layer 4, and in contact with the gate bus line connection section 3sgG within the opening 11sg2 formed in the interlayer insulating layer 11.

In the illustrated example, the contact hole CH_sg2 is formed at a position away from the contact hole CH_sg1. The present embodiment is not limited to the illustrated example, and the contact hole CH_sg1 and the contact hole CH_sg2 may be contiguous to each other (that is, may be formed as a single contact hole). The contact hole CH_sg1 and the contact hole CH_sg2 may be formed as a single contact hole in the same process. Specifically, a single contact hole that at least reaches the gate lower connection wiring line 7sgG and the gate bus line connection section 3sgG may be formed in the gate insulating layer 4 and interlayer insulating layer 11 to form the upper connection section 19sg within this contact hole and on the interlayer insulating layer 11.

Gate Terminal Section GT

The TFT substrate 102A includes the gate terminal section GT in the non-transmission and/or reception region R2. The gate terminal section GT is generally provided corresponding to the source-gate connection section SG provided for each gate bus line.

As illustrated in FIG. 18(b) and FIG. 19(c), the gate terminal section GT includes a gate terminal lower connection section 7g (also simply referred to as a "lower connection section 7g"), an opening 4g formed in the gate insulating layer 4, an opening 11g formed in the interlayer insulating layer 11, and a gate terminal upper connection section 19g (also simply referred to as an "upper connection section 19g").

The lower connection section 7g is included in the source metal layer 7. The lower connection section 7g is connected to the gate lower connection wiring line 7sgG formed in the source-gate connection section SG. In this example, the lower connection section 7g extends from the gate lower connection wiring line 7sgG and is formed integrally with the gate lower connection wiring line 7sgG.

The opening 4g formed in the gate insulating layer 4 at least reaches the lower connection section 7g.

The opening 11g formed in the interlayer insulating layer 11 overlaps the opening 4g formed in the gate insulating layer 4 when viewed from the normal direction of the dielectric substrate 1. The opening 4g formed in the gate insulating layer 4 and the opening 11g formed in the interlayer insulating layer 11 constitute a contact hole CH_g.

The upper connection section 19g is included in the upper conductive layer 19. The upper connection section 19g is formed on the interlayer insulating layer 11 and within the contact hole CH_g, and is connected to the lower connection section 7g within the contact hole CH_g. In other words, the upper connection section 19g is in contact with the lower connection section 7g within the opening 4g formed in the gate insulating layer 4.

An entirety of the upper connection section 19g may overlap the lower connection section 7g when viewed from the normal direction of the dielectric substrate 1.

The gate terminal section GT does not include a conductive portion included in the gate metal layer 3.

The gate terminal section GT, which includes the lower connection section 7g included in the source metal layer 7, has excellent reliability similarly to each terminal section of the TFT substrate 101A.

Source Terminal Section ST

The source terminal section ST may include the same configuration as the gate terminal section GT as illustrated in FIG. 18(c) and FIG. 19(d). The source terminal section ST is provided for each source bus line, in general.

The source terminal section ST includes a source terminal lower connection section 7s (also simply referred to as a "lower connection section 7s"), an opening 4s formed in the gate insulating layer 4, an opening 11s formed in the interlayer insulating layer 11, and a source terminal upper connection section 19s (also simply referred to as an "upper connection section 19s").

The lower connection section 7s is included in the source metal layer 7 and is connected to the source bus line SL. In this example, the lower connection section 7s extends from the source bus line SL and is formed integrally with the source bus line SL.

The opening 4s formed in the gate insulating layer 4 at least reaches the lower connection section 7s.

The opening 11s formed in the interlayer insulating layer 11 overlaps the opening 4s formed in the gate insulating layer 4 when viewed from the normal direction of the dielectric substrate 1. The opening 4s formed in the gate insulating layer 4 and the opening 11s formed in the interlayer insulating layer 11 constitute a contact hole CH_s.

The upper connection section 19s is included in the upper conductive layer 19. The upper connection section 19s is formed on the interlayer insulating layer 11 and within the contact hole CH_s, and is connected to the lower connection section 7s within the contact hole CH_s. In other words, the upper connection section 19s is in contact with the lower connection section 7s within the opening 4s formed in the gate insulating layer 4.

An entirety of the upper connection section 19s may overlap the lower connection section 7s when viewed from the normal direction of the dielectric substrate 1.

The source terminal section ST does not include a conductive portion included in the gate metal layer 3.

The source terminal section ST, which includes the lower connection section 7s included in the source metal layer 7, has excellent reliability similarly to the gate terminal section GT.

CS Terminal Section CT and CS-Source Connection Section SC

As illustrated in FIG. 18(b), the TFT substrate 102A includes the CS terminal section CT and the CS-source connection section SC in the non-transmission and/or reception region R2. The CS-source connection section SC is provided, for example, for each CS bus line. The CS terminal section CT is provided, for example, corresponding to the CS-source connection section SC provided for each CS bus line. The CS terminal section CT may have the same configuration as the gate terminal section GT as illustrated in FIG. 18(b) although illustration of cross-section structures thereof is omitted. Although the cross-section structure for the CS-source connection section SC is not illustrated, the CS-source connection section SC has the same configuration as the source-gate connection section SG in this example.

Specifically, the CS-source connection section SC includes a CS lower connection wiring line 7sc, an opening 4sc1 formed in the gate insulating layer 4, a CS bus line connection section 3sc connected to the CS bus line CL, an opening 11sc1 and an opening 11sc2 formed in the interlayer insulating layer 11, and a CS upper connection section 19sc.

The CS lower connection wiring line 7sc is included in the source metal layer 7 and is electrically separated from the source bus line SL.

The opening 4sc1 formed in the gate insulating layer 4 at least reaches the CS lower connection wiring line 7sc.

The CS bus line connection section 3sc is included in the gate metal layer 3 and is connected to the CS bus line CL. In this example, the CS bus line connection section 3sc extends from the CS bus line CL and is integrally formed with the CS bus line CL. The width of the CS bus line connection section 3sc may be greater than the width of the CS bus line CL.

The opening 11sc1 formed in the interlayer insulating layer 11 overlaps the opening 4sc1 formed in the gate insulating layer 4 when viewed from the normal direction of the dielectric substrate 1. The opening 4sc1 formed in the gate insulating layer 4 and the opening 11sc1 formed in the interlayer insulating layer 11 constitute a contact hole CH_sc1.

The opening 11sc2 formed in the interlayer insulating layer 11 at least reaches the CS bus line connection section 3sc. The opening 11sc2 formed in the interlayer insulating layer 11 may be referred to as a contact hole CH_sc2.

The CS upper connection section 19sc is included in the upper conductive layer 19. The CS upper connection section 19sc is formed on the interlayer insulating layer 11, within the contact hole CH_sc1, and within the contact hole CH_sc2, is connected to the CS lower connection wiring line 7sc within the contact hole CH_sc1, and is connected to the CS bus line connection section 3sc within the contact hole CH_sc2. In other words, the CS upper connection section 19sc is in contact with the CS lower connection wiring line 7sc within the opening 4sc1 formed in the gate insulating layer 4, and is in contact with the CS bus line connection section 3sc within the opening 11sc2 formed in the interlayer insulating layer 11.

A lower connection section of the CS terminal section CT can be formed of the source metal layer 7 by providing the CS-source connection section SC. With this configuration, the CS terminal section CT of the TFT substrate 102A has excellent reliability.

The CS terminal section CT includes a CS terminal lower connection section 7c (also simply referred to as a "lower connection section 7c"), an opening 4c formed in the gate insulating layer 4, an opening 11c formed in the interlayer insulating layer 11, and a CS terminal upper connection section 19c (also simply referred to as an "upper connection section 19c").

The lower connection section 7c is included in the source metal layer 7. The lower connection section 7c is connected to the CS lower connection wiring line 7sc formed in the CS-source connection section SC. In this example, the lower connection section 7c extends from the CS lower connection wiring line 7sc. In this example, the portion extending from the CS lower connection wiring line 7sc includes a lower connection section 7p1 of the first transfer terminal section PT1, a lower connection section 7p2 of the second transfer terminal section PT2, and a lower connection section 7c described later.

The opening 4c formed in the gate insulating layer 4 at least reaches the lower connection section 7c.

The opening 11c formed in the interlayer insulating layer 11 overlaps the opening 4c formed in the gate insulating layer 4 when viewed from the normal direction of the dielectric substrate 1. The opening 4c formed in the gate insulating layer 4 and the opening 11c formed in the interlayer insulating layer 11 constitute a contact hole CH_c.

The upper connection section 19c is included in the upper conductive layer 19. The upper connection section 19c is formed on the interlayer insulating layer 11 and within the contact hole CH_c, and is connected to the lower connection section 7c within the contact hole CH_c. In other words, the upper connection section 19c is in contact with the lower connection section 7c within the opening 4c formed in the gate insulating layer 4.

An entirety of the upper connection section 19c may overlap the lower connection section 7c when viewed from the normal direction of the dielectric substrate 1.

The CS terminal section CT does not include a conductive portion included in the gate metal layer 3.

The CS terminal section CT, which includes the lower connection section 7c included in the source metal layer 7, has excellent reliability similar to the gate terminal section GT.

In the illustrated example, the source-gate connection section SG and the CS-source connection section SC are provided inside the seal region Rs (liquid crystal layer side). The present embodiment is not limited to this example, and the source-gate connection section SG and/or the CS-source connection section SC may be provided outside the seal region Rs (on the opposite side to the liquid crystal layer).

Transfer Terminal Section PT

The first transfer terminal section PT1 includes the first transfer terminal lower connection section 7p1 (also referred to simply as the "lower connection section 7p1"), the opening 4p1 formed in the gate insulating layer 4, the opening 11p1 formed in the interlayer insulating layer 11, the first transfer terminal upper connection section 19p1 (also referred to simply as the "upper connection section 19p1") as illustrated in FIG. 18(b) and FIG. 20(a).

The lower connection section 7p1 is included in the source metal layer 7. The lower connection section 7p1 is electrically separated from the source bus line SL. The lower connection section 7p1 is electrically connected to the CS bus line CL. In this example, the lower connection section 7p1 is integrally formed with the CS lower connection wiring line 7sc formed in the CS-source connection section SC.

The opening 4p1 formed in the gate insulating layer 4 at least reaches the lower connection section 7p1.

The opening 11p1 formed in the interlayer insulating layer 11 overlaps the opening 4p1 formed in the gate insulating layer 4 when viewed from the normal direction of the dielectric substrate 1. The opening 4p1 formed in the gate insulating layer 4 and the opening 11p1 formed in the interlayer insulating layer 11 constitute a contact hole CH_p1.

The upper connection section 19p1 is included in the upper conductive layer 19. The upper connection section 19p1 is formed on the interlayer insulating layer 11 and within the contact hole CH_p1, and is connected to the lower connection section 7p1 within the contact hole CH_p1. In other words, the upper connection section 19p1 is in contact with the lower connection section 7p1 within the opening 4p1 formed in the gate insulating layer 4. The upper connection section 19p1 is connected to the transfer terminal connection section on the slot substrate side by, for example, a sealing member including conductive particles.

In this example, the first transfer terminal section PT1 does not include a conductive portion included in the gate metal layer 3.

The first transfer terminal section PT1, which includes the lower connection section 7p1 included in the source metal layer 7, has excellent reliability similar to the gate terminal section GT.

In this example, the opening 4p1 formed in the gate insulating layer 4 is formed to expose only a part of the lower connection section 7p1. The opening 4p1 formed in the gate insulating layer 4 is inside the lower connection section 7p1 when viewed from the normal direction of the dielectric substrate 1. Therefore, the entire region within the opening 4p1 has a layered structure including the lower connection section 7p1 and the upper connection section 19p1 on the dielectric substrate 1. In the first transfer terminal section PT1, the entire region not including the lower connection section 7p1 has a layered structure including the gate insulating layer 4 and the interlayer insulating layer 11. With this configuration, the first transfer terminal section PT1 of the TFT substrate 102A has excellent reliability. From the viewpoint of obtaining the effect of excellent reliability, the thicknesses of the gate insulating layer 4 and/or the interlayer insulating layer 11 are preferably large.

A portion in the lower connection section 7p1 that is within the opening 4p1 is covered by the upper connection section 19p1.

An entirety of the upper connection section 19p1 may overlap the lower connection section 7p1 when viewed from the normal direction of the dielectric substrate 1.

In this example, the lower connection section 7p1 is disposed between two gate bus lines GL adjacent to each other. Two lower connection sections 7p1 disposed with the gate bus line GL being interposed therebetween may be electrically connected to each other via a conductive connection section (not illustrated). The conductive connection section may be formed of the gate metal layer 3.

Here, the lower connection section 7p1 is connected to the upper connection section 19p1 through one contact hole CH_p1, but a plurality of contact holes may be provided for one lower connection section 7p1.

The second transfer terminal section PT2 is provided outside the seal region Rs (opposite to the transmission and/or reception region R1). The second transfer terminal section PT2, as illustrated in FIG. 19(e), has similar cross-section structure to the first transfer terminal section PT1 illustrated in FIG. 20(a). In other words, as illustrated in FIG. 19(e), the second transfer terminal section PT2 includes a second transfer terminal lower connection section 7p2 (also referred to simply as a "lower connection section 7p2"), an opening 4p2 formed in the gate insulating layer 4, an opening 11p2 formed in the interlayer insulating layer 11, and a second transfer terminal upper connection section 19p2 (also referred to simply as an "upper connection section 19p2").

The lower connection section 7p2 is included in the source metal layer 7. The lower connection section 7p2 is electrically separate from the source bus line SL. The lower connection section 7p2 is electrically connected to the CS bus line CL. In this example, the lower connection section 7p2 extends from the first transfer terminal lower connection section 7p1 extending from the CS lower connection wiring line 7sc formed in the CS-source connection section SC, and is integrally formed with the lower connection section 7p1.

The opening 4p2 formed in the gate insulating layer 4 at least reaches the lower connection section 7p2.

The opening 11p2 formed in the interlayer insulating layer 11 overlaps the opening 4p2 formed in the gate insulating layer 4 when viewed from the normal direction of the dielectric substrate 1. The opening 4p2 formed in the gate insulating layer 4 and the opening 11p2 formed in the interlayer insulating layer 11 constitute a contact hole CH_p2.

The upper connection section 19p2 is included in the upper conductive layer 19. The upper connection section 19p2 is formed on the interlayer insulating layer 11 and within the contact hole CH_p2, and is connected to the lower connection section 7p2 within the contact hole CH_p2. In other words, the upper connection section 19p2 is in contact with the lower connection section 7p2 within the opening 4p2 formed in the gate insulating layer 4.

In this example, the second transfer terminal section PT2 does not include the conductive portion included in the gate metal layer 3.

The second transfer terminal section PT2, which includes the lower connection section 7p2 included in the source metal layer 7, has excellent reliability similar to the gate terminal section GT.

In the second transfer terminal section PT2 also, the upper connection section 19p2 may be connected to a transfer terminal connection section on the slot substrate side by a sealing member containing conductive particles, for example.

TFT Substrate 102R of Reference Example 2 (Non-Transmission and/or Reception Region R2)

FIGS. 21(b) and 21(c) are schematic cross-sectional views of the non-transmission and/or reception region R2 of the TFT substrate 102R of Reference Example 2. FIGS. 21(b) and 21(c) illustrate cross-sectional views taken along the line B-B' and the line C-C' in FIG. 18(b), respectively.

As illustrated in FIG. 21(c), unlike the TFT substrate 102A, in the gate terminal section GT of the TFT substrate 102R of Reference Example 2, the source metal layer 7 includes a reverse tapered side surface. However, the gate insulating layer 4 and the interlayer insulating layer 11 are formed in the source metal layer 7, and thus the source metal layer 7 is not exposed and is completely covered.

The B-B' cross section of the TFT substrate 102R of Reference Example 2 illustrated in FIG. 21(b) is the same as the B-B' cross section of the TFT substrate 102A. Other cross sections of the TFT substrate 102R of Reference Example 2 has the same as the TFT substrate 102A, and thus illustration and description are omitted.

First Manufacturing Method of TFT Substrate 102R of Reference Example 2

A first manufacturing method of the TFT substrate 102R of Reference Example 2 will be described with reference to FIGS. 22 to 24.

FIGS. 22(a) to 22(e), FIGS. 23(a) to 23(d), and FIGS. 24(a) to 24(c) are schematic cross-sectional views for describing the first manufacturing method of the TFT substrate 102R of Reference Example 2. Each of these drawings illustrates a cross section corresponding to FIGS. 21(a) to 21(c) (A-A' cross section, B-B' cross section, and C-C' cross section of the TFT substrate 102R in Reference Example 2).

First, as illustrated in FIG. 22(a), a base insulating layer 20, an intrinsic amorphous silicon film 5', and a n$^+$ type amorphous silicon film 6' are formed on the dielectric substrate 1 in this order. Here, as the base insulating layer 20, a silicon nitride (SixNy) film having a thickness of 200 nm, for example, is formed. Furthermore, the intrinsic amorphous silicon film 5' having a thickness of 120 nm, for example, and the n$^+$ type amorphous silicon film 6' having a thickness of 30 nm, for example, are formed. Alternatively, a crystalline silicon film (for example, a polysilicon film) may be formed as the semiconductor film 5'.

Next, the intrinsic amorphous silicon film 5' and the n$^+$ type amorphous silicon film 6' are patterned to obtain island-shaped semiconductor layer 5 and the contact layer 6 as illustrated in FIG. 22(b).

Next, as illustrated in FIG. 22(c), the source lower conductive film S1' is formed on the base insulating layer 20 and the contact layer 6 by a sputtering or the like, and the source upper conductive film S2' is formed on the source lower conductive film S1'. Thereafter, a resist layer 80 is formed on the source upper conductive film S2' by using photoresist. The source lower conductive film S1' and the source upper conductive film S2' may be formed as the same as those illustrated in the previous embodiment, for example.

Next, as illustrated in FIG. 22(d), the upper source metal layer S2 is formed by etching the source upper conductive film S2'. As illustrated in FIG. 22(e), the lower source metal layer S1 is formed by etching the source lower conductive film S1', and the source contact portion 6S and the drain contact portion 6D are formed by etching the contact layer 6. As a result, the source metal layer 7 including the upper source metal layer S2 and the lower source metal layer S1 is formed.

First, the upper source metal layer S2 is formed as illustrated in FIG. 22(d) by etching the source upper conductive film S2' by wet etching or dry etching, using the resist layer 80 as an etching mask. In this etching step, an etchant having a large etch selectivity relative to the etching rate of the source lower conductive film S1' is used. As the etchant, for example, the same as that illustrated in the previous embodiments can be used.

Next, the source lower conductive film S1' and the contact layer 6 are etched by dry etching, using the resist layer 80 as an etching mask to form the lower source metal layer S1 and the source contact portion 6S and the drain contact portion 6D separated from each other, as illustrated in FIG. 22(e). Here, etching of the source lower conductive film S1' and the contact layer 6 is performed using, for example, a chlorine based gas.

Figure 22:
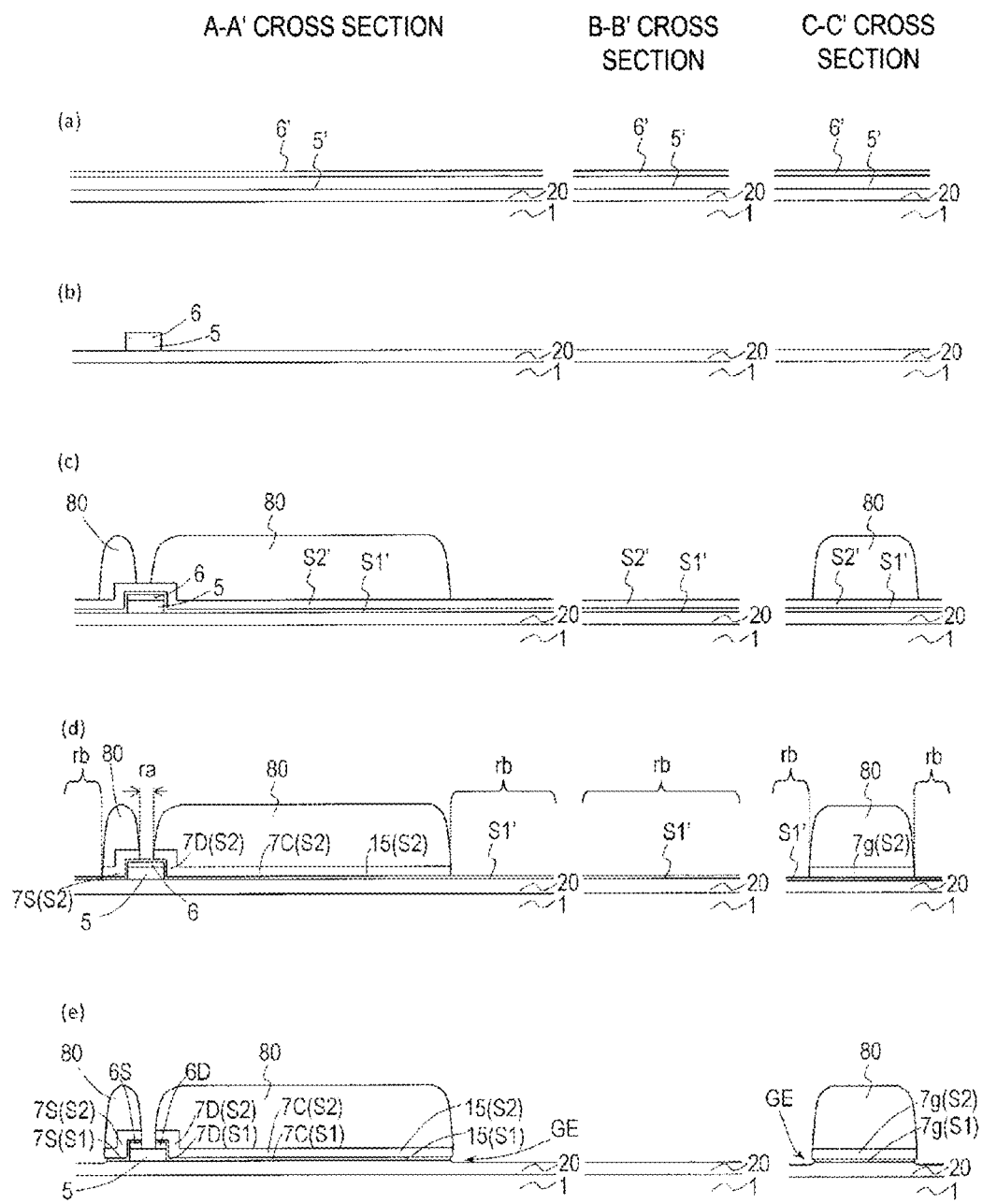
FIGS. 22(a) to 22(e) are schematic cross-sectional views for describing a first manufacturing method of the TFT substrate 102R of Reference Example 2.

At a point in time prior to performing this dry etching step, the region exposed from the resist layer 80 includes a region ra including the contact layer 6 and a region rb not including the contact layer 6, as illustrated in FIG. 22(*d*). Both the region ra and the region rb include the source lower conductive film S1'. In the dry etching step, in the region rb, the source lower conductive film S1' and/or the base insulating layer 20 are overetched by the portion not including the contact layer 6 compared with the region ra. In a case where the etching rate of the etchant used in the dry etching step of the source lower conductive film S1' is higher than the etching rate of the source upper conductive film S2', the edge of the lower source metal layer S1 is inside the edge of the upper source metal layer S2, as illustrated in FIG. 22(*e*). In other words, the portion of the source lower conductive film S1' under the resist layer 80 serving as an etching mask is also etched (undercut) by side etching. As a result, the side surface of the source metal layer 7 is reverse tapered. As illustrated in FIG. 22(*e*), for example, the base insulating layer 20 is etched in the region GE along the edge of the lower source metal layer S1.

Figure 23:
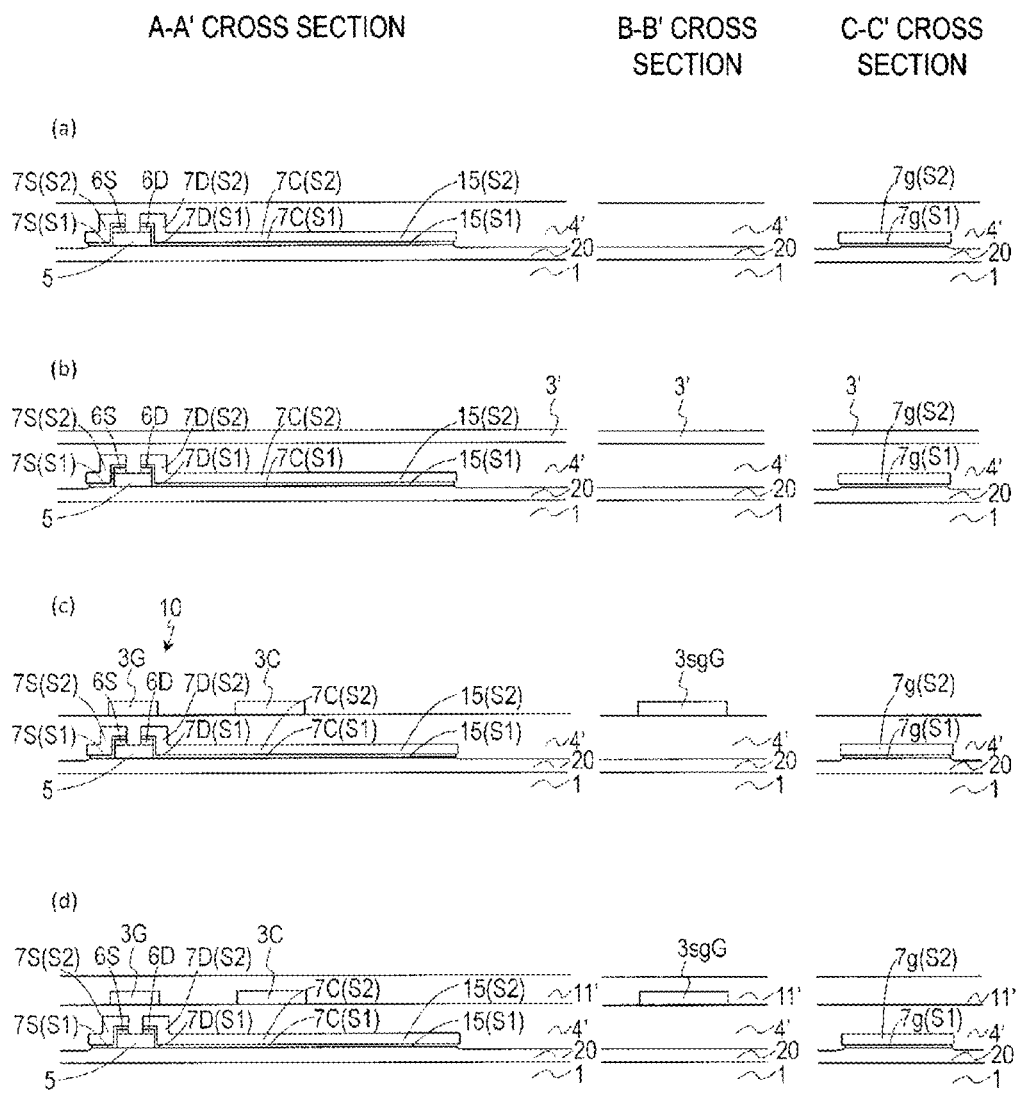
FIGS. 23(a) to 23(d) are schematic cross-sectional views for describing the first manufacturing method of the TFT substrate 102R of Reference Example 2.

Next, as illustrated in FIG. 23(*a*), the gate insulating film 4' is formed covering the source metal layer 7 and the base insulating layer 20. In this example, the gate insulating film 4' is disposed to be in contact with the channel region of the semiconductor layer 5. Here, as the gate insulating film 4', a silicon nitride (SixNy) film having a thickness of 350 nm, for example, is formed. At this time, the source metal layer 7 has a reverse tapered side surface, and thus the gate insulating film 4' cannot completely cover the side surface of the source metal layer 7. In other words, a defect (not illustrated) is formed in the gate insulating film 4'. Note that the defect of the gate insulating film 4' can be larger by etching the region GE (see FIG. 22(*e*)) of the base insulating layer 20 along the edge of the lower source metal layer S1.

Next, as illustrated in FIG. 23(*b*), the gate conductive film 3' is formed on the gate insulating film 4'. Here, as the gate conductive film 3', a layered film (MoN/Al) is formed by layering an Al film (having a thickness of 150 nm, for example) and a MoN film (having a thickness of 100 nm, for example) in this order.

Next, the gate metal layer 3 is obtained by patterning the gate conductive film 3', as illustrated in FIG. 23(*c*). Specifically, formed are a gate electrode 3G including a portion facing the semiconductor layer 5 with the gate insulating film 4' interposed therebetween, a gate bus line GL connected to the gate electrode 3G, an auxiliary capacitance counter electrode 3C including a portion facing the auxiliary capacitance electrode 7C with the gate insulating film 4' interposed therebetween, a CS bus line CL connected to the auxiliary capacitance counter electrode 3C, a gate bus line connection section 3*sg*G in the source-gate connection section formation region, and a CS bus line connection section 3*sc* in the CS-source connection section formation region. Here, patterning of the gate conductive film 3' is performed by wet etching. In this manner, the TFT 10 is obtained.

Here, in the source-gate connection section formation region, at least a portion of the gate lower connection wiring line 7*sg*G is formed not to overlap the gate bus line connection section 3*sg*G. In the CS-source connection section formation region, at least a portion of the CS lower connection wiring line 7*sc* is formed not to overlap the CS bus line connection section 3*sc*. In the antenna unit formation region, the gate metal layer 3 is formed not to overlap the patch electrode 15. Each of the terminal section formation regions does not include a conductive portion included in the gate metal layer 3.

Next, as illustrated in FIG. 23(*d*), the interlayer insulating film 11' is formed covering the TFT 10 and the gate metal layer 3. Here, as the interlayer insulating film 11', a silicon nitride (SixNy) film having a thickness of 300 nm, for example, is formed.

Defects may occur in the interlayer insulating film 11' due to defects in the gate insulating film 4'. However, the disclosure is not limited thereto, and defects may not occur in the interlayer insulating film 11'.

Figure 24:
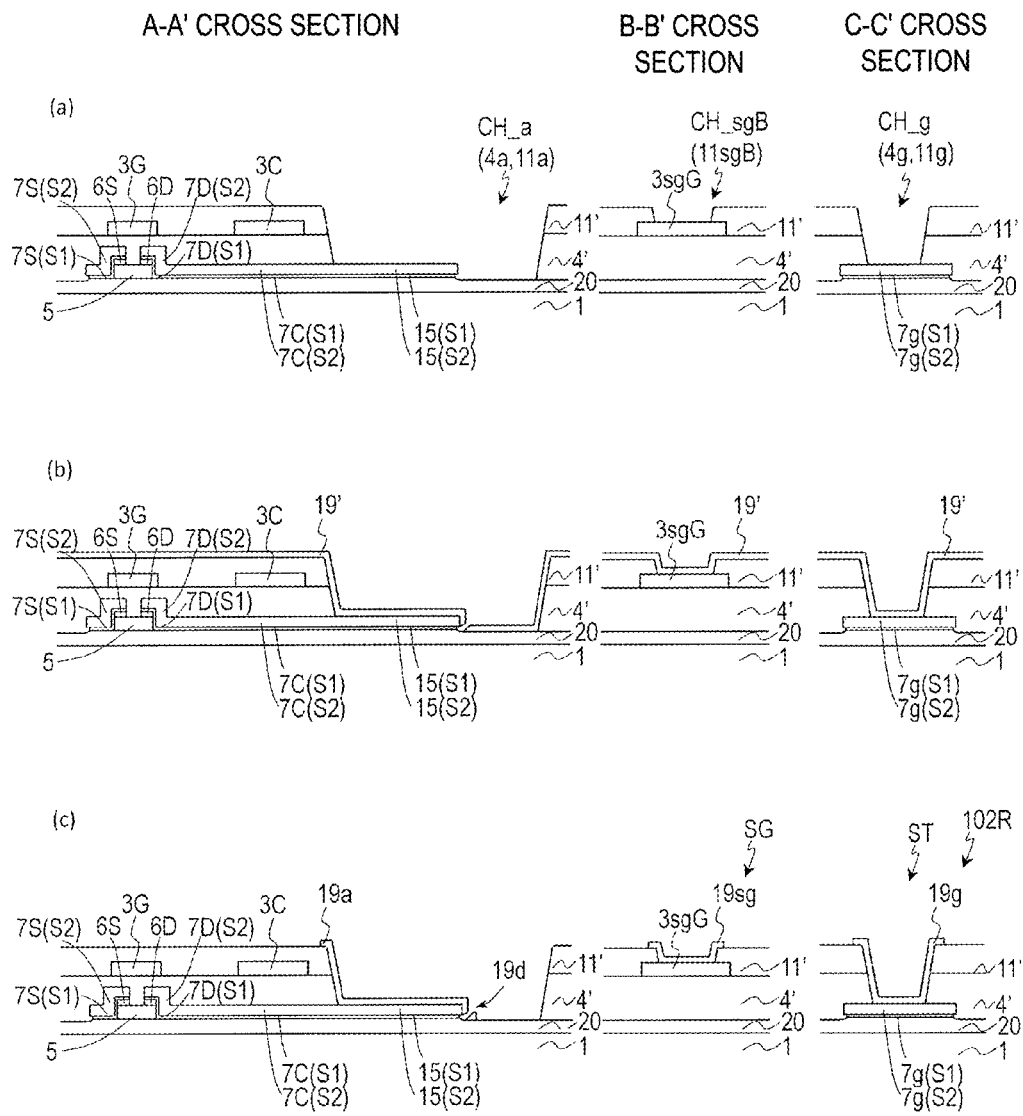
FIGS. 24(a) to 24(c) are schematic cross-sectional views for describing the first manufacturing method of the TFT substrate 102R of Reference Example 2.

Subsequently, the interlayer insulating film 11' and the gate insulating film 4' are etched through a known photolithography process to obtain the interlayer insulating layer 11 and the gate insulating layer 4, as illustrated in FIG. 24(*a*). Specifically, formed are a contact hole CH_a that at least reaches the patch electrode 15 in the antenna unit formation region, a contact hole CH_g that at least reaches the lower connection section 7*g* in the gate terminal section formation region, a contact hole CH_s that at least reaches the lower connection section 7*s* in the source terminal section formation region, a contact hole CH_c that at least reaches the lower connection section 7*c* in the CS terminal section formation region, a contact hole CH_p1 that at least reaches the lower connection section 7*p*1 in the first transfer terminal section formation region, a contact hole CH_p2 that at least reaches the lower connection section 7*p*2 in the second transfer terminal section formation region, a contact hole CH_sg1 that at least reaches the gate lower connection wiring line 7*sg*G and a contact hole CH_sg2 (opening 11*sg*2) that at least reaches the gate bus line connection section 3*sg*G in the source-gate connection section formation region, a contact hole CH_sc1 that at least reaches the CS lower connection wiring line 7*sc* and a contact hole CH_sc2 (opening 11*sc*2) that at least reaches the CS bus line connection section 3*sc* in the CS-source connection section formation region.

In the antenna unit formation region, the contact hole CH_a is formed to expose the side surface of the patch electrode 15. In other words, the reverse tapered side surface of the patch electrode 15 included in the source metal layer 7 is exposed.

In this etching step, the interlayer insulating film 11' and the gate insulating film 4' are etched by using the gate metal layer 3 as an etch stop. For example, in the source-gate connection section formation region, the interlayer insulating film 11' and the gate insulating film 4' are collectively etched in a contact hole CH_sg1 formation region, and the gate bus line connection section 3*sg*G functions as the etch stop to etch only the interlayer insulating film 11' in a contact hole CH_sg2 (opening 11*sg*2) formation region. This allows the contact hole CH_sg1 and the contact hole CH_sg2 (opening 11*sg*2) to be obtained. The contact hole CH_sg1 includes the opening 4*sg*1 that is formed in the gate insulating layer 4 and at least reaches the gate lower connection wiring line 7*sg*G, and the opening 11*sg*1 that is formed in the interlayer insulating layer 11 and overlaps the opening 4*sg*1. Here, at least a portion of the gate lower connection wiring line 7*sg*G is formed not to overlap the gate bus line connection section 3*sg*G, and thus, the contact hole CH_sg1 including the opening 4*sg*1 and the opening 11*sg*1 is formed. A side surface of the opening 4*sg*1 and a side surface of the opening 11*sg*1 may be aligned on a side surface of the contact hole CH_sg1.

The interlayer insulating film 11' and the gate insulating film 4' are collectively etched by using, for example, the same etchant. Here, the interlayer insulating film 11' and the gate insulating film 4' are etched by dry etching by using a fluorine-based gas. The interlayer insulating film 11' and the gate insulating film 4' may be etched by using different kinds of etchant.

In this way, among contact holes formed, the side surface of the opening formed in the interlayer insulating layer 11 and the side surface of the opening formed in the gate insulating layer 4 may be aligned in the contact hole including the opening formed in the interlayer insulating layer 11 and the opening formed in the gate insulating layer 4.

In the CS-source connection section formation region, the interlayer insulating film 11' and the gate insulating film 4' are collectively etched in a contact hole CH_sc1 formation region, and the CS bus line connection section 3*sc* functions as the etch stop to etch only the interlayer insulating film 11' in a contact hole CH_sc2 (opening 11*sc*2) formation region. This allows the contact hole CH_sc1 and the contact hole CH_sc2 (opening 11*sc*2) to be obtained. The contact hole CH_sc1 includes the opening 4*sc*1 that is formed in the gate insulating layer 4 and at least reaches the CS lower connection wiring line 7*sc*, and the opening 11*sc*1 that is formed in the interlayer insulating layer 11 and overlaps the opening 4*sc*1. Here, at least a portion of the CS lower connection wiring line 7*sc* is formed not to overlap the CS bus line connection section 3*sc*, and thus, the contact hole CH_sc1 including the opening 4*sc*1 and the opening 11*sc*1 is formed. The side surface of the opening 4*sc*1 and the side surface of the opening 11*sc*1 may be aligned on the side surface of the contact hole CH_sc1.

In the antenna unit formation region, the gate metal layer 3 is formed not to overlap the patch electrode 15 when viewed from the normal direction of the dielectric substrate 1, and thus, the contact hole CH_a is formed by collectively etching the interlayer insulating film 11' and the gate insulating film 4'. The contact hole CH_a includes the opening 4*a* that is formed in the gate insulating layer 4 and at least reaches the patch electrode 15, and the opening 11*a* that is formed in the interlayer insulating layer 11 and overlaps the opening 4*a*. The side surface of the opening 4*a* and the side surface of the opening 11*a* may be aligned on the side surface of the contact hole CH_a.

In each of the terminal section formation regions, the conductive portion included in the gate metal layer 3 is not formed, so the interlayer insulating film 11' and the gate insulating film 4' are collectively etched.

In the gate terminal section formation region, the conductive portion included in the gate metal layer 3 is not formed, and thus, the contact hole CH_g is formed by collectively etching the interlayer insulating film 11' and the gate insulating film 4'. The contact hole CH_g includes the opening 4*g* that is formed in the gate insulating layer 4 and at least reaches the lower connection section 7*g*, and the opening 11*g* that is formed in the interlayer insulating layer 11 and overlaps the opening 4*g*. A side surface of the opening 4*g* and a side surface of the opening 11*g* may be aligned on a side surface of the contact hole CH_g.

In the source terminal section formation region, the conductive portion included in the gate metal layer 3 is not formed, and thus, the contact hole CH_s is formed by collectively etching the interlayer insulating film 11' and the gate insulating film 4'. The contact hole CH_s includes the opening 4*s* that is formed in the gate insulating layer 4 and at least reaches the lower connection section 7*s*, and the opening 1 is that is formed in the interlayer insulating layer 11 and overlaps the opening 4*s*. A side surface of the opening 4*s* and a side surface of the opening 11*s* may be aligned on a side surface of the contact hole CH_s.

In the CS terminal section formation region, the conductive portion included in the gate metal layer 3 is not formed, and thus, the contact hole CH_c is formed by collectively etching the interlayer insulating film 11' and the gate insulating film 4'. The contact hole CH_c includes the opening 4*c* that is formed in the gate insulating layer 4 and at least reaches the lower connection section 7*c*, and the opening 11*c* that is formed in the interlayer insulating layer 11 and overlaps the opening 4*c*. A side surface of the opening 4*c* and a side surface of the opening 11*c* may be aligned on a side surface of the contact hole CH_c.

In the first transfer terminal section formation region, the conductive portion included in the gate metal layer 3 is not formed, and thus, the contact hole CH_p1 is formed by collectively etching the interlayer insulating film 11' and the gate insulating film 4'. The contact hole CH_p1 includes the opening 4*p*1 that is formed in the gate insulating layer 4 and at least reaches the lower connection section 7*p*1, and the opening 11*p*1 that is formed in the interlayer insulating layer 11 and overlaps the opening 4*p*1. A side surface of the opening 4*p*1 and a side surface of the opening 1*p*1 may be aligned on a side surface of the contact hole CH_p1.

In the second transfer terminal section formation region, the conductive portion included in the gate metal layer 3 is not formed, and thus, the contact hole CH_p2 is formed by collectively etching the interlayer insulating film 11' and the gate insulating film 4'. The contact hole CH_p2 includes the opening 4*p*2 that is formed in the gate insulating layer 4 and at least reaches the lower connection section 7*p*2, and the opening 11*p*2 formed in the interlayer insulating layer 11 and overlaps the opening 4*p*2. A side surface of the opening 4*p*2 and a side surface of the opening 11*p*2 may be aligned on a side surface of the contact hole CH_p2.

Next, as illustrated in FIG. 24(*b*), an upper conductive film 19' is formed on the interlayer insulating layer 11, within the contact hole CH_a, within the contact hole CH_g, within the contact hole CH_s, within the contact hole CH_c, within the contact hole CH_p1, within the contact hole CH_p2, within the contact hole CH_sg1, within the contact hole CH_sg2, within the contact hole CH_sc1, and within the contact hole CH_sc2, for example, by a sputtering. The upper conductive film 19' may be formed as the same as that illustrated in the previous embodiment, for example.

Next, the upper conductive film 19' is patterned to obtain the upper conductive layer 19 as illustrated in FIG. 24(*c*). Specifically, formed are the patch conductive portion 19*a* that covers the patch electrode 15 in the contact hole CH_a in the antenna unit region U, the upper connection section 19*g* connected to the lower connection section 7*g* in the contact hole CH_g in the gate terminal section GT, the upper connection section 19*s* connected to the lower connection section 7*s* in the contact hole CH_s in the source terminal section ST, the upper connection section 19*c* connected to the lower connection section 7*c* in the contact hole CH_c in the CS terminal section CT, the upper connection section 19*p*1 connected to the lower connection section 7*p*1 within the contact hole CH_p1 in the first transfer terminal section PT1, the upper connection section 19*p*2 that contacts the lower connection section 7*p*2 within the contact hole CH_p2 in the second transfer terminal section PT2, the upper connection section 19*sg* connected to the gate lower connection wiring line 7*sg*G in the contact hole CH_sg1 and connected to the gate bus line connection section 3*sg*G in the contact hole CH_sg2 (opening 11*sg*2) in the source-gate connection section SG, the CS upper connection section 19*sc* connected to the CS lower connection wiring line 7*sc* in the contact hole CH_sc1 and connected to the CS bus line connection section 3*sc* in the contact hole CH_sc2 (opening 11*sc*2) in the CS-source connection section SC.

The side surface of the patch electrode 15 is reverse tapered, and thus the patch conductive portion 19*a* cannot completely cover the side surface of the patch electrode 15. That is, the defect 19*d* occurs in the upper conductive layer 19 (patch conductive portion 19*a*). In this manner, in the antenna unit region U of the TFT substrate 102R of Reference Example 2, a location where the source metal layer 7 is exposed without being covered by the inorganic layer is generated.

As a result, the antenna unit region U, the gate terminal section GT, the source terminal section ST, the CS terminal section CT, the first transfer terminal section PT1, the second transfer terminal section PT2, the source-gate connection section SG, and the CS-source connection section SC are obtained.

In this way, the TFT substrate 102R of Reference Example 2 is manufactured.

Second Manufacturing Method of TFT Substrate 102R of Reference Example 2

The TFT substrate 102R of Reference Example 2 is also manufactured by the method described below.

A second manufacturing method of the TFT substrate 102R of Reference Example 2 will be described with reference to FIG. 25.

The second manufacturing method of the TFT substrate 102R of Reference Example 2 differs from the first manufacturing method described with reference to FIGS. 22 to 24 in a method for forming the source contact portion 6S, the drain contact portion 6D, the lower source metal layer S1, and the upper source metal layer S2. In the first manufacturing method, the source upper conductive film S2' is etched (wet etching or dry etching), and then the source lower conductive film S1' and the contact layer 6 are etched by dry etching. In contrast, in the second manufacturing method, the source upper conductive film S2' and the source lower conductive film S1' are etched (wet etching or dry etching), and then the contact layer 6 is etched by dry etching.

Figure 25:
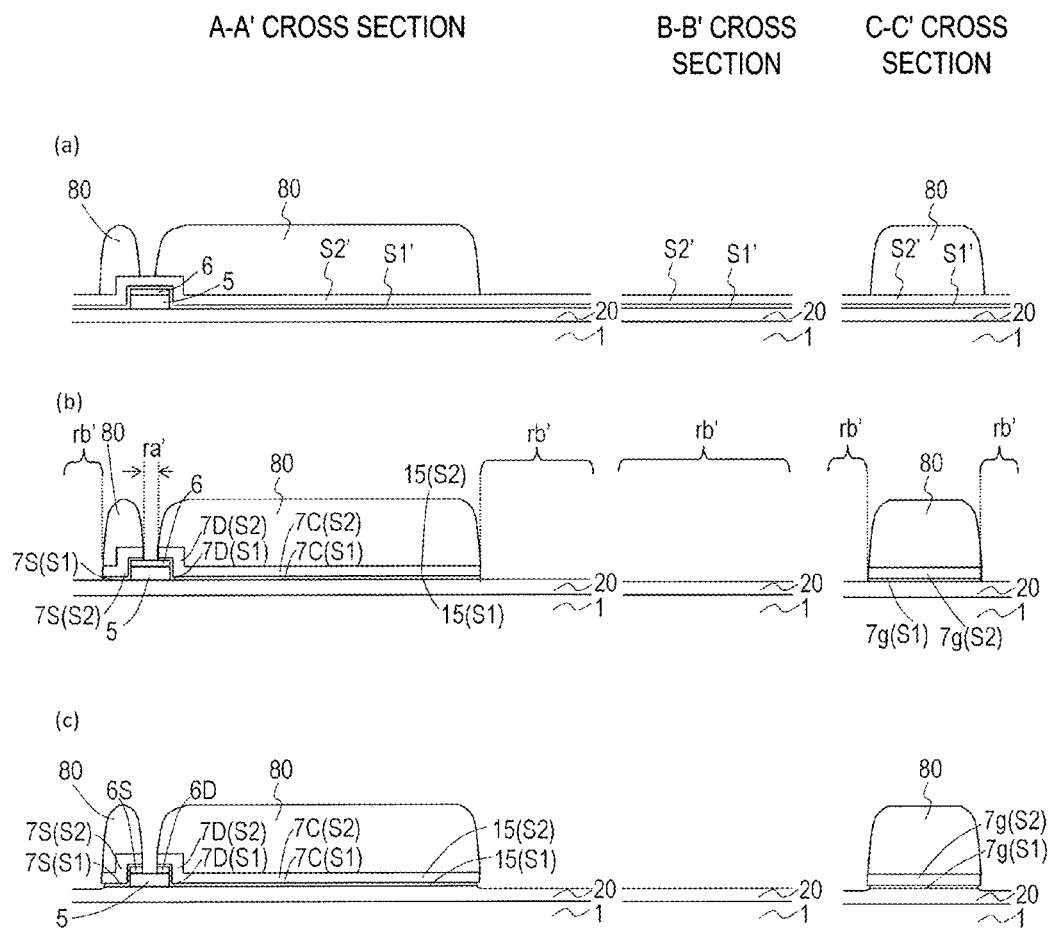
FIGS. 25(a) to 25(c) are schematic cross-sectional views for describing a second manufacturing method of the TFT substrate 102R of Reference Example 2.

FIGS. 25(*a*) to 25(*c*) are schematic cross-sectional views for describing the second manufacturing method of the TFT substrate 102R of Reference Example 2. Each of these drawings illustrates a cross section corresponding to FIGS. 21(*a*) to 21(*c*) (A-A' cross section, B-B' cross section, and C-C' cross section of the TFT substrate 102R in Reference Example 2). The following description mainly describes differences from the first manufacturing method.

First, as illustrated in FIGS. 22(*a*) and 22(*b*), the base insulating layer 20, an island-shaped semiconductor layer 5, and the contact layer 6 are formed on the dielectric substrate 1.

Next, as illustrated in FIG. 25(*a*), the source lower conductive film S1' is formed on the base insulating layer 20 and the contact layer 6 by a sputtering or the like, and the source upper conductive film S2' is formed on the source lower conductive film S1'. Thereafter, a resist layer 80 is formed on the source upper conductive film S2' by using photoresist.

Next, as illustrated in FIG. 25(*b*), the upper source metal layer S2 and the lower source metal layer S1 are formed by etching the source upper conductive film S2' and the source lower conductive film S1' by wet etching or dry etching, using the resist layer 80 as an etching mask. In this etching step, the etching rate of the source lower conductive film S1' is less than or equal to the etching rate of the source upper conductive film S2'. Therefore, when this etching step is completed, the edge of the lower source metal layer S1 does not enter inside of the edge of the upper source metal layer S2.

Next, as illustrated in FIG. 25(*c*), the source contact portion 6S and the drain contact portion 6D separated from each other are formed by etching the contact layer 6 by dry etching by using the resist layer 80 as an etching mask. Here, etching of the contact layer 6 is performed using, for example, a chlorine based gas.

At a point in time prior to performing this dry etching step, the region exposed from the resist layer 80 includes a region ra' including the contact layer 6 and a region rb' not including the contact layer 6, as illustrated in FIG. 25(*b*). The region ra' and the region rb' are different from the first manufacturing method in that they do not have the source lower conductive film S1'. In the dry etching step, the side etching of the source lower conductive film S1' and/or the overetching of the base insulating layer 20 occurs in the region rb' by a portion that does not include the contact layer 6 compared with the region ra'. In a case where the etching rate of the etchant used in the dry etching step of the lower source metal layer S1 is higher than the etching rate of the upper source metal layer S2, the lower source metal layer S1 is further etched in the dry etching step. Accordingly, as illustrated in FIG. 25(*c*), the edge of the lower source metal layer S1 is inserted inside the edge of the upper source metal layer S2. In other words, the portion of the lower source metal layer S1 under the resist layer 80 serving as an etching mask is also etched by side etching. As a result, the side surface of the source metal layer 7 is reverse tapered. As illustrated in FIG. 25(*c*), for example, the base insulating layer 20 is etched in the region GE along the edge of the lower source metal layer S1.

Thereafter, the TFT substrate 102R of Reference Example 2 is manufactured by performing the same steps as those described with reference to FIGS. 23(*a*) to 23(*d*) and FIGS. 24(*a*) to 24(*c*). As described with reference to FIG. 24(*d*), the side surface of the patch electrode 15 included in the source metal layer 7 is reverse tapered, resulting in the defect 19*d* in the upper conductive layer 19 (patch conductive portion 19*a*). As a result, in the antenna unit region U of the TFT substrate 102R of Reference Example 2, a location where the source metal layer 7 is exposed without being covered by the inorganic layer is generated.

First Manufacturing Method of TFT Substrate 102A

The TFT substrate of the present embodiment is manufactured by, for example, the following manufacturing method. According to the manufacturing method illustrated here, the side surface of the source metal layer does not have a reverse tapered shape. Thus, defects are not formed in the inorganic layer covering the source metal layer, and thus, the occurrence of the problem in that the metal element (Cu or Al) elutes from the source metal layer (for example, the patch electrode) into the liquid crystal layer is suppressed. Note that, in the following description, description may be omitted for the steps common to the manufacturing method of the TFT substrate of Reference Example 2.

Note that, the first manufacturing method to the fourth manufacturing method of the present embodiment correspond to the first to fourth manufacturing methods of the TFT substrate 101A of the first embodiment. In other words, among the manufacturing methods of the previous embodiment, the method of forming the source contact portion 6S, the drain contact portion 6D, the lower source metal layer S1, and the upper source metal layer S2 is applied to the manufacturing method of the TFT substrate 102A of the present embodiment. The description of steps common to the manufacturing method of the previous embodiment may be omitted.

Figure 26:
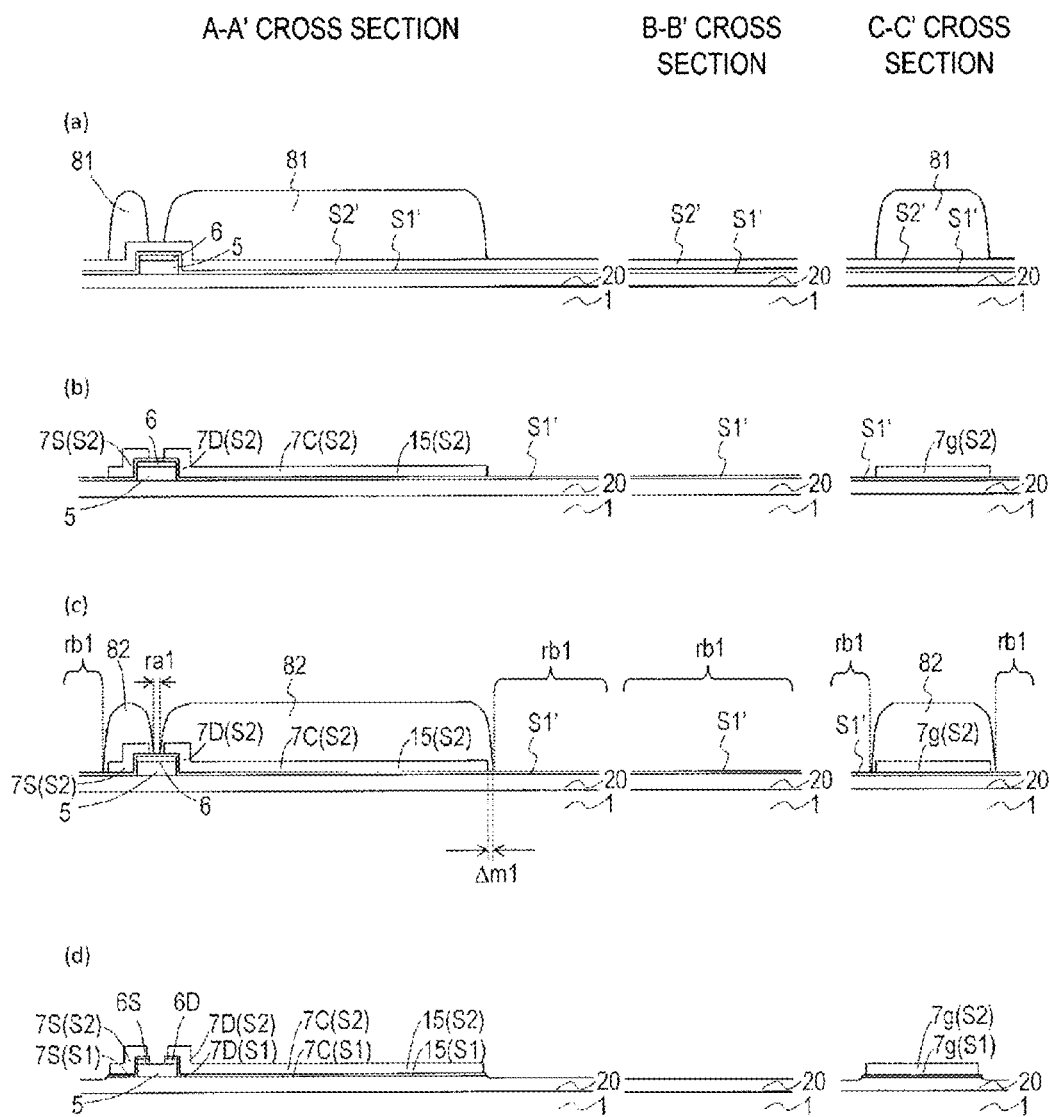
FIGS. 26(a) to 26(d) are schematic cross-sectional views for describing a first manufacturing method of the TFT substrate 102A.
Figure 27:
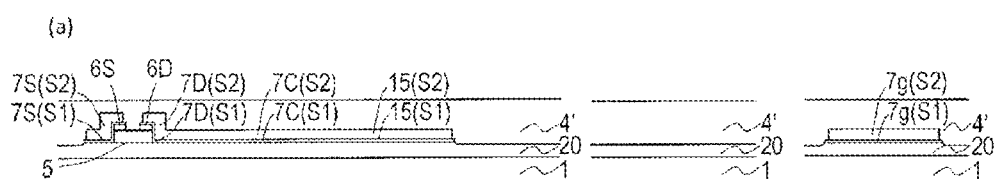
FIGS. 27(a) to 27(d) are schematic cross-sectional views for describing the first manufacturing method of the TFT substrate 102A.
Figure 27:
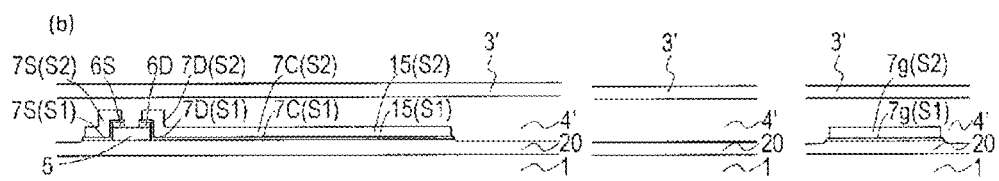
Figure 27:
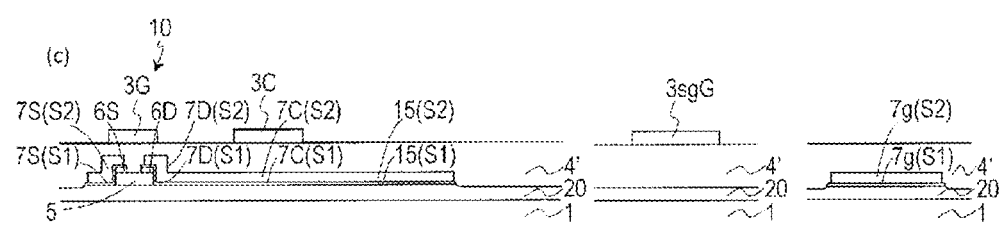
Figure 27:
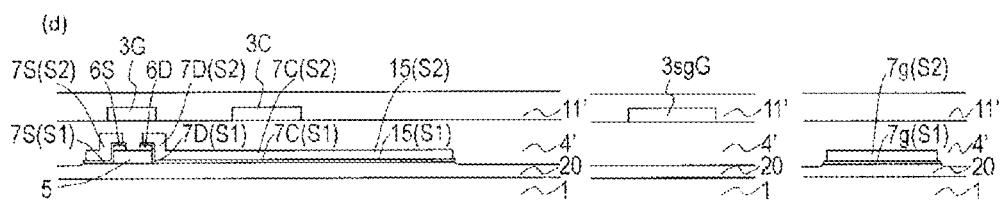
Figure 28:
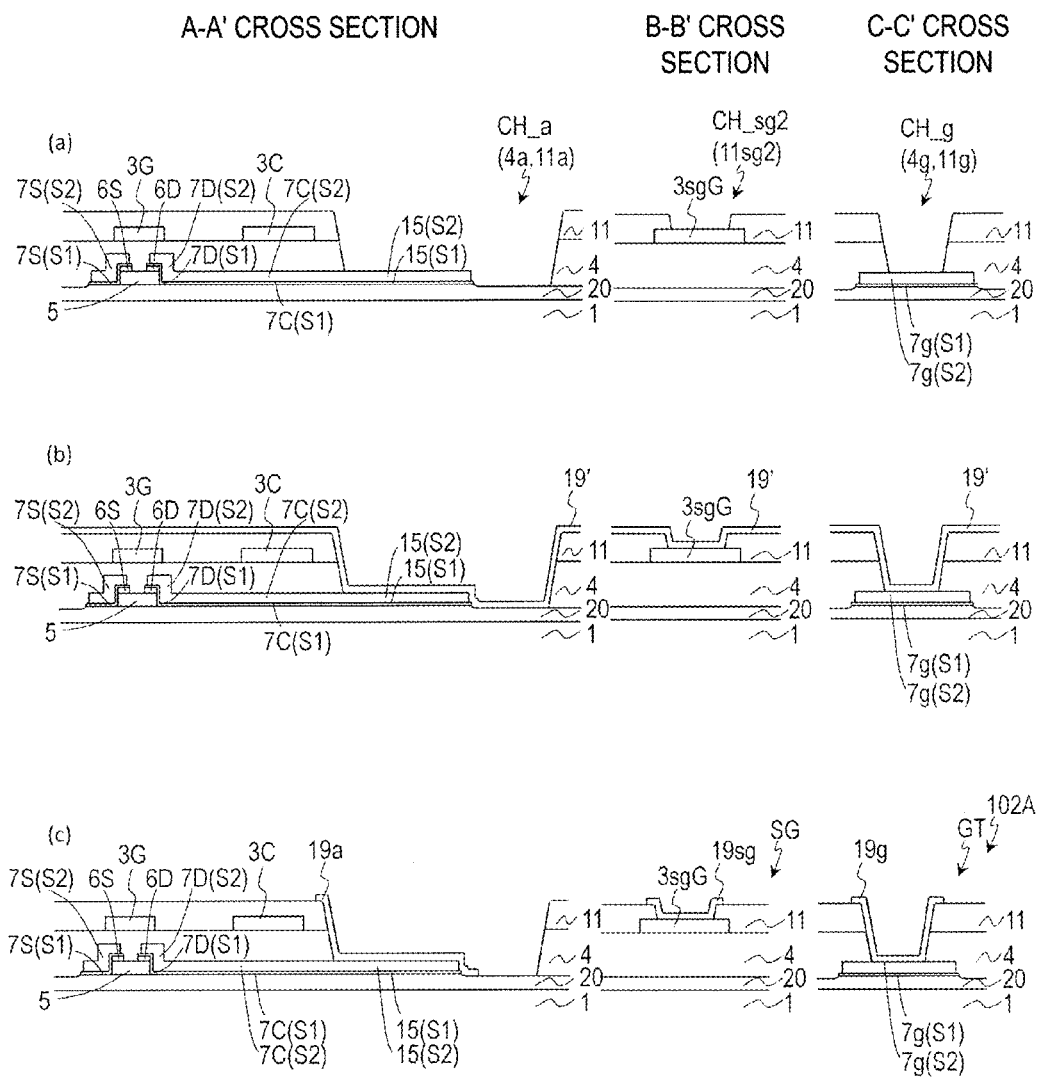
FIGS. 28(a) to 28(c) are schematic cross-sectional views for describing the first manufacturing method of the TFT substrate 102A.

Referring to FIGS. 26 to 28, a first manufacturing method of the TFT substrate 102A of the present embodiment will be described. FIGS. 26(a) to 26(d), FIGS. 27(a) to 27(d), and FIGS. 28(a) to 28(c) are schematic cross-sectional views for describing the first manufacturing method of the TFT substrate 102A. Each of these drawings illustrates a cross section corresponding to FIGS. 19(a) to 19(c) (A-A' cross section, B-B' cross section, and C-C' cross section of the TFT substrate 102A). Note that illustrations of the cross sections corresponding to FIGS. 19(d) and 19(e) and FIGS. 20(a) and 20(b) (D-D' cross section, E-E' cross-section, F-F' cross section, and G-G' cross section of the TFT substrate 101A) are omitted, but the cross sections are formed in the same manner as the cross section corresponding to FIG. 19(c) (C-C' cross section of the TFT substrate 102A).

First, as described with reference to FIGS. 22(a) and 22(b), the base insulating layer 20, the island shaped semiconductor layer 5, and the contact layer 6 are formed on the dielectric substrate 1.

The subsequent steps illustrated in FIGS. 26(a) to 26(d) correspond to the manufacturing process of the TFT substrate 101A described with reference to FIGS. 11(a) to 11(d).

As illustrated in FIG. 26(a), the source lower conductive film S1' is formed on the base insulating layer 20 and the contact layer 6, and the source upper conductive film S2' is formed on the source lower conductive film S1'. Thereafter, the first resist layer 81 is formed on the source upper conductive film S2'.

Next, as illustrated in FIG. 26(b), the upper source metal layer S2 is formed by etching the source upper conductive film S2'. As illustrated in FIGS. 26(c) and 26(d), the lower source metal layer S1 is formed by etching the source lower conductive film S1', and the source contact portion 6S and the drain contact portion 6D are formed by etching the contact layer 6. As a result, the source metal layer 7 including the upper source metal layer S2 and the lower source metal layer S1 is formed.

First, the upper source metal layer S2 is formed as illustrated in FIG. 26(b) by etching the source upper conductive film S2' by wet etching or dry etching, using the first resist layer 81 as an etching mask. In this etching step, an etchant having a large etch selectivity relative to the etching rate of the source lower conductive film S1' is preferably used. For example, the etch selectivity of the etching rate of the source upper conductive film S2' relative to the etching rate of the source lower conductive film S1' is preferably 20 times or greater. The etching of the source upper conductive film S2' may be an underetch or an overetch with respect to the first resist layer 81 serving as an etching mask.

However, the etchant of the source upper conductive film S2' is not limited to this. For example, in a case where a Ti film is formed as the source lower conductive film S1' and an Al film and a Ti film are layered in this order to form a layered film (Ti/Al) as the source upper conductive film S2', the source upper conductive film S2' can be etched, for example, by dry etching by using a chlorine based gas. At this time, the etch selectivity of the etching rate of the source upper conductive film S2' relative to the etching rate of the source lower conductive film S1' is not large (e.g., approximately 1). In such a case, etching of the source upper conductive film S2' may be completed such that the edge of the source lower conductive film S1' does not enter the inside of the edge of the upper source metal layer S2.

Thereafter, the first resist layer 81 is removed (peeled).

Next, as illustrated in FIG. 26(c), the second resist layer 82 is formed by using photoresist to cover the upper source metal layer S2. The second resist layer 82 is formed covering the upper surface and the side surface of the upper source metal layer S2. At this time, the second resist layer 82 is preferably formed such that the edge of the second resist layer 82 is outside the edge of the upper source metal layer S2 when viewed from the normal direction of the dielectric substrate 1, and the distance Δm1 of the edge of the second resist layer 82 from the edge of the upper source metal layer S2 is not less than five times the thickness of the source lower conductive film S1'.

Next, the source lower conductive film S1' and the contact layer 6 are etched by dry etching, using the second resist layer 82 as an etching mask to form the lower source metal layer S1 and the source contact portion 6S and the drain contact portion 6D separated from each other, as illustrated in FIG. 26(d). Etching of the source lower conductive film S1' and etching of the contact layer 6 may be performed using the same etchant or may be performed using different kinds of etchant.

At a point in time prior to performing this dry etching step, the region exposed from the second resist layer 82 includes a region ra1 including the contact layer 6 and a region rb1 not including the contact layer 6, as illustrated in FIG. 26(c). Both the region ra1 and the region rb1 include the source lower conductive film S1'. In the dry etching step, in the region rb1, the source lower conductive film S1' and/or the base insulating layer 20 are overetched by the portion not including the contact layer 6 compared with the region ra1. In a case where the etching rate of the etchant used in the dry etching step of the source lower conductive film S1' is higher than the etching rate of the source upper conductive film S2', the portion of the source lower conductive film S1' under the second resist layer 82 serving as an etching mask is also etched (undercut) by side etching. In other words, when viewed from the normal direction of the dielectric substrate 1, the edge of the lower source metal layer S1 enters the inside of the edge of the second resist layer 82. However, in the manufacturing method according to the present embodiment, the edge of the second resist layer 82 is the outside of the edge of the upper source metal layer S2 by Δm1, and therefore, as illustrated in FIG. 26(d), the edge of the lower source metal layer S1 does not enter more inside than the edge of the upper source metal layer S2. Therefore, the side surface of the source metal layer 7 is not reverse tapered.

Here, as illustrated in FIG. 26(d) for example, the base insulating layer 20 is etched in the region GE along the edge of the lower source metal layer S1.

Next, as illustrated in FIG. 27(a), the gate insulating film 4' is formed covering the source metal layer 7 and the base insulating layer 20.

Next, as illustrated in FIG. 27(b), the gate conductive film 3' is formed on the gate insulating film 4'.

Next, the gate metal layer 3 is obtained by patterning the gate conductive film 3', as illustrated in FIG. 27(c).

Next, as illustrated in FIG. 27(d), the interlayer insulating film 11' is formed covering the TFT 10 and the gate metal layer 3.

Subsequently, the interlayer insulating film 11' and the gate insulating film 4' are etched by a known photolithography process to obtain the interlayer insulating layer 11 and the gate insulating layer 4, as illustrated in FIG. 28(a).

Next, as illustrated in FIG. 28(b), an upper conductive film 19' is formed on the interlayer insulating layer 11, within the contact hole CH_a, within the contact hole CH_g, within the contact hole CH_s, within the contact hole CH_c, within the contact hole CH_p1, within the contact hole CH_p2, within the contact hole CH_sg1, within the contact hole CH_sg2, within the contact hole CH_sc1, and within the contact hole CH_sc2.

Next, the upper conductive film 19' is patterned to obtain the upper conductive layer 19 as illustrated in FIG. 28(*c*).

Here, unlike the TFT substrate 102R of Reference Example 2, since the side surface of the patch electrode 15 does not have a reverse tapered shape, defects do not occur in the upper conductive layer 19 (patch conductive portion 19*a*). As illustrated in FIG. 28(*c*), the patch electrode 15 is completely covered with an upper conductive layer 19. As a result, in the TFT substrate according to the present embodiment, in the antenna unit region U, a portion where the source metal layer 7 is exposed without being covered by the inorganic layer does not occur.

With the TFT substrate of the present embodiment, a deterioration in antenna characteristics can be suppressed.

In this way, the TFT substrate 102A is manufactured.

Second Manufacturing Method of TFT Substrate 102A

Figure 29:
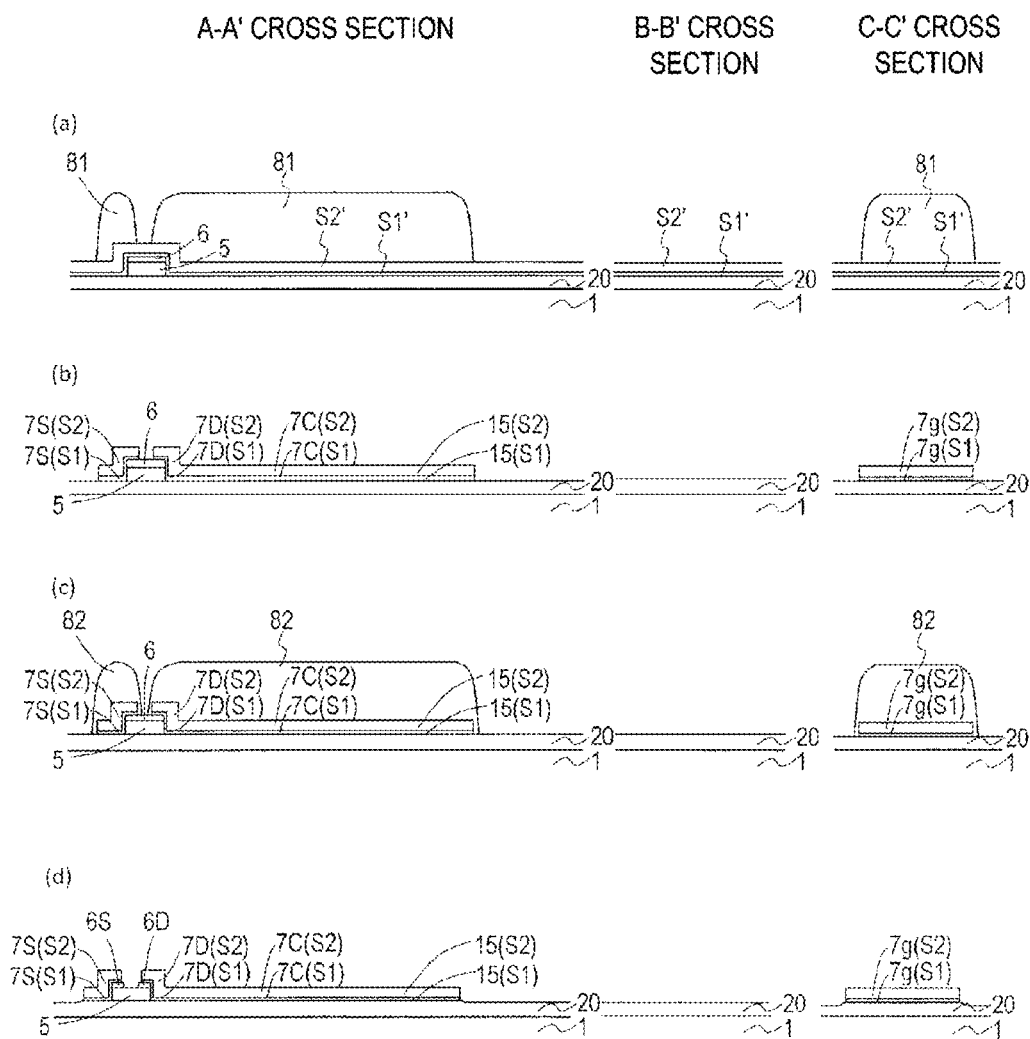
FIGS. 29(a) to 29(d) are schematic cross-sectional views for describing a second manufacturing method of the TFT substrate 102A.

Referring to FIG. 29, a second manufacturing method of the TFT substrate 102A will be described. FIGS. 29(*a*) to 29(*d*) are schematic cross-sectional views for describing the second manufacturing method of the TFT substrate 102A. Each of these drawings illustrates a cross section corresponding to FIGS. 19(*a*) to 19(*c*) (A-A' cross section, B-B' cross section, and C-C' cross section of the TFT substrate 102A).

The second manufacturing method of the TFT substrate 102A differs from the first manufacturing method described with reference to FIGS. 26 to 28 in a method for forming the source contact portion 6S, the drain contact portion 6D, the lower source metal layer S1, and the upper source metal layer S2. In the first manufacturing method, the source upper conductive film S2' is etched (wet etching or dry etching) by using the first resist layer 81 as an etching mask, and the source lower conductive film S1' and the contact layer 6 are etched by dry etching by using the second resist layer 82 as an etching mask. In contrast, in the second manufacturing method, the source upper conductive film S2' and the source lower conductive film S1' are etched (wet etching or dry etching) by using the first resist layer 81 as an etching mask, and the contact layer 6 is etched by dry etching by using the second resist layer 82 as an etching mask.

First, as described with reference to FIGS. 22(*a*) and 22(*b*), the base insulating layer 20, the island shaped semiconductor layer 5, and the contact layer 6 are formed on the dielectric substrate 1.

The subsequent steps illustrated in FIGS. 29(*a*) to 29(*d*) correspond to the manufacturing process of the TFT substrate 101A described with reference to FIGS. 13(*a*) to 13(*d*).

As illustrated in FIG. 29(*a*), the source lower conductive film S1' is formed on the base insulating layer 20 and the contact layer 6, and the source upper conductive film S2' is formed on the source lower conductive film S1'. Thereafter, the first resist layer 81 is formed on the source upper conductive film S2'.

Next, as illustrated in FIG. 29(*b*), the upper source metal layer S2 and the lower source metal layer S1 are formed by etching the source upper conductive film S2' and the source lower conductive film S1' by wet etching or dry etching, using the first resist layer 81 as an etching mask. In this etching step, the etching conditions are adjusted so that the etching rate of the source lower conductive film S1' is less than or equal to the etching rate of the source upper conductive film S2'. Accordingly, when this etching step is completed, the upper source metal layer S2 and the lower source metal layer S1 are formed such that the edge of the lower source metal layer S1 do not enter inside the edge of the upper source metal layer S2. At the time of completion of this etching step, the side surface of the source metal layer 7 is not reverse tapered.

The etching of the source upper conductive film S2' and the source lower conductive film S1' may be underetched or may be overetched with respect to the first resist layer 81 serving as an etching mask. Etching of the source upper conductive film S2' and etching of the source lower conductive film S1' may be performed by using the same etchant or may be performed by using different kinds of etchant so long as the condition that the etching rate of the source lower conductive film S1' is less than or equal to the etching rate of the source upper conductive film S2' is satisfied.

Thereafter, the first resist layer 81 is removed (peeled).

Next, as illustrated in FIG. 29(*c*), the second resist layer 82 is formed to cover the upper source metal layer S2 and the lower source metal layer S1 by using photoresist. The second resist layer 82 is formed covering the upper surface and the side surface of the upper source metal layer S2 and the side surface of the lower source metal layer S1.

Next, as illustrated in FIG. 29(*d*), the source contact portion 6S and the drain contact portion 6D are formed by etching the contact layer 6 by dry etching, using the second resist layer 82 as an etching mask.

In this dry etching step, the upper source metal layer S2 and the lower source metal layer S1 are covered by the second resist layer 82, so the upper source metal layer S2 and the lower source metal layer S1 are not etched. Accordingly, the side surface of the source metal layer 7 remains not reverse tapered from the end of etching of the source upper conductive film S2' and the source lower conductive film S1'.

Note that in this dry etching step, the base insulating layer 20 may also be etched. For example, as illustrated in FIG. 29(*d*), the base insulating layer 20 is etched in the region GE along the edge of the second resist layer 82.

Thereafter, the TFT substrate 102A is manufactured by performing the same steps as described with reference to FIGS. 27(*a*) to 27(*d*) and FIGS. 28(*a*) to 28(*c*).

In the present manufacturing process, because the side surface of the source metal layer 7 is not reverse tapered, defects do not occur in the upper conductive layer 19. The side surface of the source metal layer 7 (e.g., the patch electrode 15) is completely covered with the upper conductive layer 19. As a result, in the TFT substrate according to the present embodiment, in the antenna unit region U, a portion where the source metal layer 7 is exposed without being covered by the inorganic layer does not occur. With the TFT substrate of the present embodiment, a deterioration in antenna characteristics can be suppressed.

Third Manufacturing Method of TFT Substrate 102A

Figure 30:
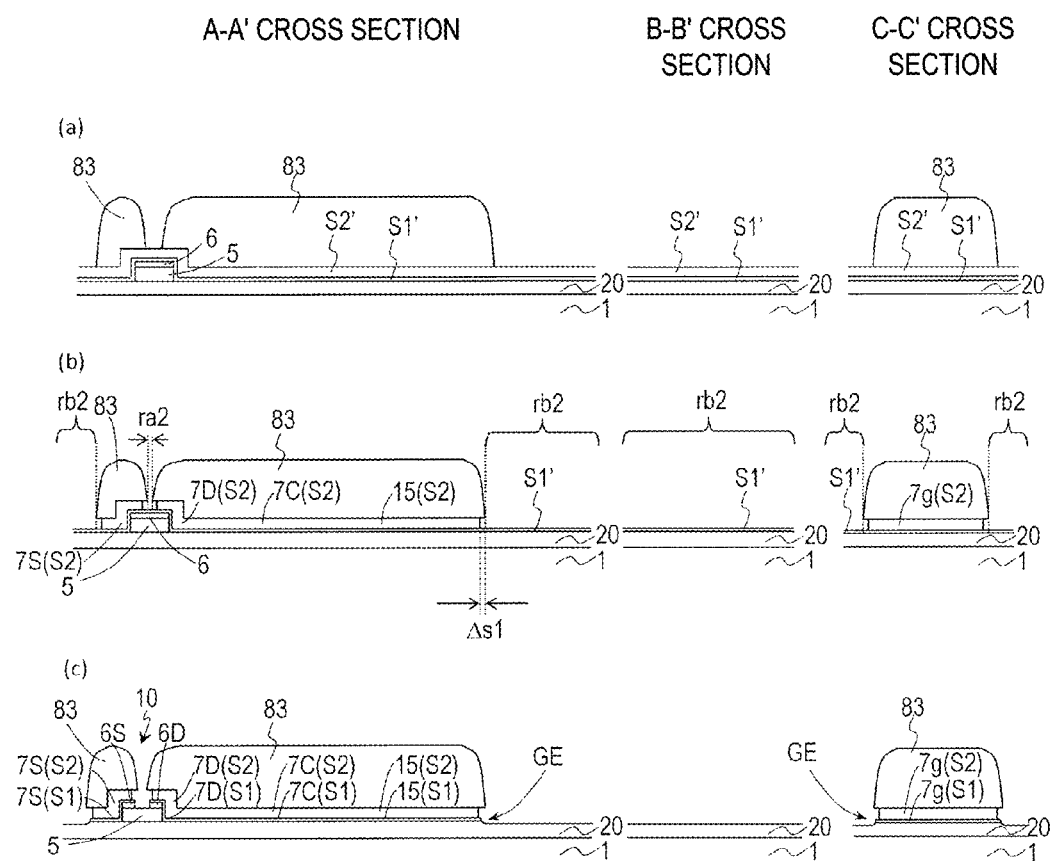
FIGS. 30(a) to 30(c) are schematic cross-sectional views for describing a third manufacturing method of the TFT substrate 102A.

Referring to FIG. 30, a third manufacturing method of the TFT substrate 102A will be described. FIGS. 30(*a*) to 30(*c*) are schematic cross-sectional views for describing the third manufacturing method of the TFT substrate 102A. Each of these drawings illustrates a cross section corresponding to FIGS. 19(*a*) to 19(*c*) (A-A' cross section, B-B' cross section, and C-C' cross section of the TFT substrate 102A).

The third manufacturing method differs from the first manufacturing method described with reference to FIGS. 26 to 28 in a method for forming the source contact portion 6S, the drain contact portion 6D, the lower source metal layer S1, and the upper source metal layer S2. In the first manufacturing method, two resist layers (the first resist layer 81 and the second resist layer 82) are used as etching masks to etch the source upper conductive film S2', the source lower conductive film S1', and the contact layer 6. In contrast, in the third manufacturing method, the source upper conductive film S2', the source lower conductive film S1', and the contact layer 6 are etched by using the same etching mask.

First, as described with reference to FIGS. 22(a) and 22(b), the base insulating layer 20, the island shaped semiconductor layer 5, and the contact layer 6 are formed on the dielectric substrate 1.

The subsequent steps illustrated in FIGS. 30(a) to 30(c) correspond to the manufacturing process of the TFT substrate 101A described with reference to FIGS. 15(a) to 15(c).

As illustrated in FIG. 30(a), the source lower conductive film S1' is formed on the base insulating layer 20 and the contact layer 6, and the source upper conductive film S2' is formed on the source lower conductive film S1'. Thereafter, a resist layer 83 is formed on the source upper conductive film S2'.

Next, as illustrated in FIG. 30(b), the upper source metal layer S2 is formed by etching the source upper conductive film S2' by wet etching or dry etching, using the resist layer 83 as an etching mask. At this time, when viewed from the normal direction of the dielectric substrate 1, the upper source metal layer S2 is formed such that the edge of the upper source metal layer S2 is inside the edge of the resist layer 83, and the distance Δs1 of the edge of the upper source metal layer S2 from the edge of the resist layer 83 is not less than 1.2 times the thickness of the upper source metal layer S2.

In the etching process of the source upper conductive film 52', an etchant having a large etch selectivity relative to the etching rate of the source lower conductive film S1' is preferably used. For example, the etch selectivity of the etching rate of the source upper conductive film S2' relative to the etching rate of the source lower conductive film S1' is preferably 20 times or greater.

Next, the source lower conductive film S1' and the contact layer 6 are etched by dry etching, using the resist layer 83 as an etching mask to form the lower source metal layer S1 and the source contact portion 6S and the drain contact portion 6D, as illustrated in FIG. 30(c). Etching of the source lower conductive film S1' and etching of the contact layer 6 may be performed using the same etchant or may be performed using different kinds of etchant.

At a point in time prior to performing this dry etching step, as illustrated in FIG. 30(b), when viewed from the normal direction of the dielectric substrate 1, the region not covered by the resist layer 83 includes the region ra2 including the contact layer 6 and the region rb2 not including the contact layer 6. Both the region ra2 and the region rb2 have the source lower conductive film S1'. In the dry etching step, in the region rb2, the source lower conductive film S1' and/or the base insulating layer 20 are overetched by the portion not including the contact layer 6 compared with the region ra2. In a case where the etching rate of the etchant used in the dry etching step of the source lower conductive film S1' is higher than the etching rate of the source upper conductive film S2', the portion of the source lower conductive film S1' under the resist layer 83 serving as an etching mask is also etched by side etching. In other words, when viewed from the normal direction of the dielectric substrate 1, the edge of the lower source metal layer S1 enters the inside of the edge of the resist layer 83.

However, in the manufacturing method of the present embodiment, the edge of the upper source metal layer S2 is the inside of the edge of the resist layer 83 by Δs1, and therefore, as illustrated in FIG. 30(c), the edge of the lower source metal layer S1 does not enter more inside than the edge of the upper source metal layer S2. Therefore, the side surface of the source metal layer 7 does not have a reverse tapered shape.

Here, as illustrated in FIG. 30(c) for example, the base insulating layer 20 is etched in the region GE along the edge of the lower source metal layer S1.

Thereafter, the TFT substrate 102A is manufactured by performing the same steps as described with reference to FIGS. 27(a) to 27(d) and FIGS. 28(a) to 28(c).

In the present manufacturing process, because the side surface of the source metal layer 7 is not reverse tapered, defects do not occur in the upper conductive layer 19. The side surface of the source metal layer 7 (e.g., the patch electrode 15) is completely covered with the upper conductive layer 19. As a result, in the TFT substrate according to the present embodiment, in the antenna unit region U, a portion where the source metal layer 7 is exposed without being covered by the inorganic layer does not occur. With the TFT substrate of the present embodiment, a deterioration in antenna characteristics can be suppressed.

Fourth Manufacturing Method of TFT Substrate 102A

Figure 31:
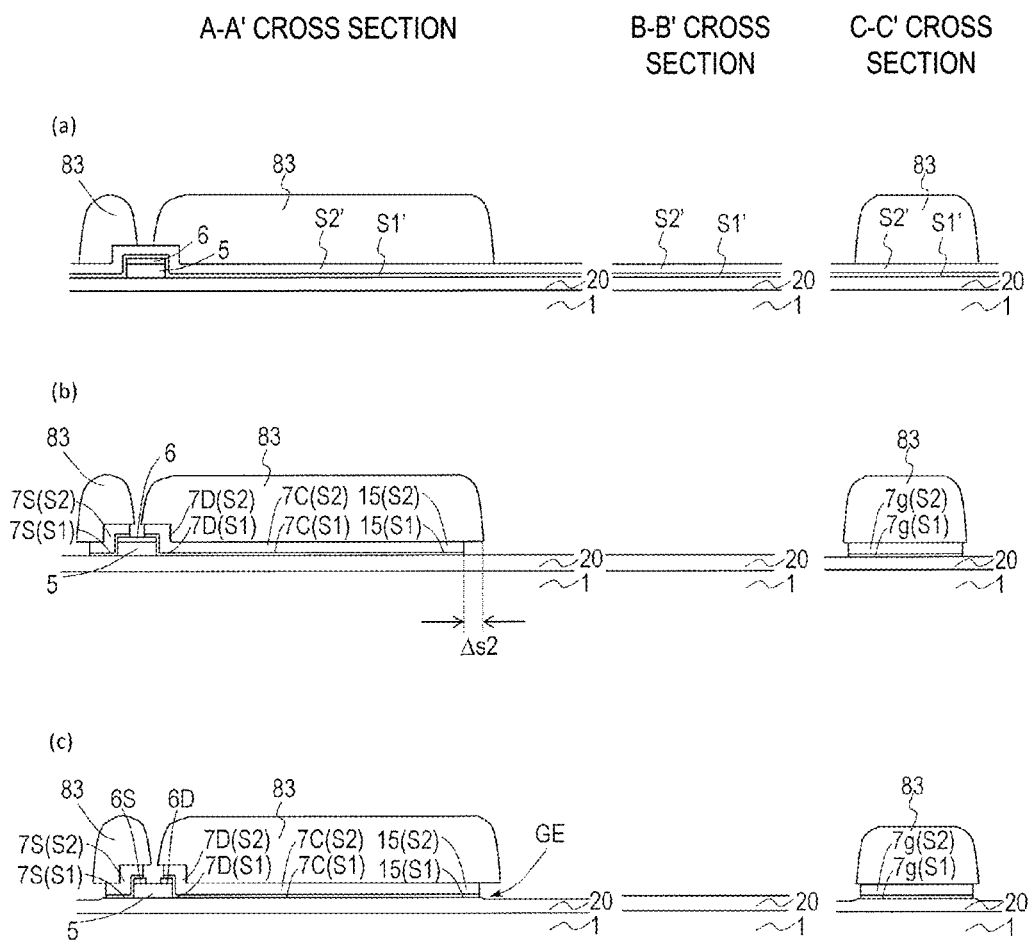
FIGS. 31(a) to 31(c) are schematic cross-sectional views for describing a fourth manufacturing method of the TFT substrate 102A.

Referring to FIG. 31, a fourth manufacturing method of the TFT substrate 102A will be described. FIGS. 31(a) to 31(c) are schematic cross-sectional views for describing the fourth manufacturing method of the TFT substrate 102A. Each of these drawings illustrates a cross section corresponding to FIGS. 19(a) to 19(c) (A-A' cross section, B-B' cross section, and C-C' cross section of the TFT substrate 102A).

The fourth manufacturing method differs from the third manufacturing method described with reference to FIG. 30 in a method for forming the source contact portion 6S, the drain contact portion 6D, the lower source metal layer S1, and the upper source metal layer S2. In the third manufacturing method, the source upper conductive film S2' is etched by wet etching or dry etching, and then the source lower conductive film S1' and the contact layer 6 are etched by dry etching. In contrast, in the fourth manufacturing method, the source upper conductive film S2' and the source lower conductive film S1' are etched by wet etching or dry etching, and the contact layer 6 is then etched by dry etching.

First, as described with reference to FIGS. 22(a) and 22(b), the base insulating layer 20, the island shaped semiconductor layer 5, and the contact layer 6 are formed on the dielectric substrate 1.

The subsequent steps illustrated in FIGS. 31(a) to 31(c) correspond to the manufacturing process of the TFT substrate 101A described with reference to FIGS. 16(a) to 16(c).

As illustrated in FIG. 31(a), the source lower conductive film S11' is formed on the base insulating layer 20 and the contact layer 6, and the source upper conductive film S2' is formed on the source lower conductive film S1'. Thereafter, a resist layer 83 is formed on the source upper conductive film S2'.

Next, as illustrated in FIG. 31(b), the upper source metal layer S2 and the lower source metal layer S1 are formed by etching the source upper conductive film S2' and the source lower conductive film S1' by wet etching or dry etching, using the resist layer 83 as an etching mask. At this time, when viewed from the normal direction of the dielectric substrate 1, the lower source metal layer S1 is formed such that the edge of the lower source metal layer S1 is inside the edge of the resist layer 83, and the distance Δs2 of the edge of the lower source metal layer S1 from the edge of the resist layer 83 is not less than 1.8 times the thickness of the upper source metal layer S2. The length determined as the distance Δs2 is greater than the length determined by the third manufacturing method as the distance Δs1 (see FIG. 30(b)).

In this etching step, the etching conditions are adjusted so that the etching rate of the source lower conductive film S1' is less than or equal to the etching rate of the source upper conductive film S2'. Accordingly, when this etching step is completed, the upper source metal layer S2 and the lower source metal layer S1 are formed such that the edges of the lower source metal layer S1 do not enter more inside than the edges of the upper source metal layer S2. At the time of completion of etching step, the side surface of the source metal layer 7 is not reverse tapered.

Etching of the source upper conductive film S2' and etching of the source lower conductive film S1' may be performed by using the same etchant or may be performed by using different kinds of etchant so long as the condition that the etching rate of the source lower conductive film S1' is less than or equal to the etching rate of the source upper conductive film S2' is satisfied.

Note that, when the upper source metal layer S2 is formed as described above, when viewed from the normal direction of the dielectric substrate 1, the upper source metal layer S2 is formed such that the edge of the upper source metal layer S2 is inside the edge of the resist layer 83, and the distance of the edge of the upper source metal layer S2 from the edge of the resist layer 83 is not less than 1.2 times the thickness of the upper source metal layer S2.

Next, as illustrated in FIG. 31(c), the source contact portion 6S and the drain contact portion 6D are formed by etching the contact layer 6 by dry etching, using the resist layer 83 as an etching mask.

In this dry etching step, the edge of the lower source metal layer S1 is inside of the edge of the resist layer 83 by Δs2, so the lower source metal layer S1 is not etched with the resist layer 83 as an obstacle. Therefore, the side surface of the source metal layer 7 remains not having a reverse tapered shape.

Note that in this dry etching step, the base insulating layer 20 may also be etched. For example, as illustrated in FIG. 31(c), the base insulating layer 20 is etched in the region GE between the edge of the resist layer 83 and the edge of the lower source metal layer S1.

Thereafter, the TFT substrate 102A is manufactured by performing the same steps as described with reference to FIGS. 27(a) to 27(d) and FIGS. 28(a) to 28(c).

In the present manufacturing process, because the side surface of the source metal layer 7 is not reverse tapered, defects do not occur in the upper conductive layer 19. The side surface of the source metal layer 7 (e.g., the patch electrode 15) is completely covered with the upper conductive layer 19. As a result, in the TFT substrate according to the present embodiment, in the antenna unit region U, a portion where the source metal layer 7 is exposed without being covered by the inorganic layer does not occur. With the TFT substrate of the present embodiment, a deterioration in antenna characteristics can be suppressed.

According to the first to fourth manufacturing methods of the present embodiment, similar to in the previous embodiment, even when the thickness of the source metal layer 7 is increased, the occurrence of the problem in that the gap between the source electrode 7S and the drain electrode 7D cannot be controlled with high accuracy can be suppressed. In the TFT substrate according to the present embodiment, the distance between the source contact portion 6S and the drain contact portion 6D in the channel length direction is smaller than the distance between the upper source metal layer S2 of the source electrode 7S and the upper source metal layer S2 of the drain electrode 7D in the channel length direction. Furthermore, in the TFT substrate manufactured by the second or fourth manufacturing method of the present embodiment, the distance between the source contact portion 6S and the drain contact portion 6D in the channel length direction is smaller than the distance between the lower source metal layer S1 of the source electrode 7S and the lower source metal layer S1 of the drain electrode 7D in the channel length direction.

Example of Antenna Unit Array and Connection of Gate Bus Line and Source Bus Line In the scanning antenna according to the embodiments of the disclosure, the antenna units are arrayed concentrically, for example.

For example, in a case where the antenna units are arrayed in m concentric circles, one gate bus line is provided for each circle, for example, such that a total of m gate bus lines is provided. For example, assuming that the outer diameter of the transmission and/or reception region R1 is 800 mm, m is 200, for example. Assuming that the innermost gate bus line is the first one, n (30, for example) antenna units are connected to the first gate bus line and nx (620, for example) antenna units are connected to the m-th gate bus line.

In such an array, the number of antenna units connected to each gate bus line is different. In addition, although m antenna units are connected to n source bus lines that are also connected to the antenna units constituting the innermost circle, among nx source bus lines connected to nx antenna units that constitute the outermost circle, the number of antenna units connected to other source bus lines is less than m.

In this way, the array of antenna units in the scanning antenna is different from the array of pixels (dots) in the LCD panel, and the number of connected antenna units differs depending on the gate bus line and/or source bus line. Accordingly, in a case where the capacitances (liquid crystal capacitances+auxiliary capacitances) of all the antenna units are set to be the same, depending on the gate bus line and/or the source bus line, the electrical loads of the antenna units connected thereto differ. In such a case, there is a problem where variations occur in the writing of the voltage to the antenna unit.

Accordingly, to prevent this, the capacitance value of the auxiliary capacitance is preferably adjusted, or the number of antenna units connected to the gate bus line and/or the source bus line is preferably adjusted, for example, to make the electrical loads of the antenna units connected to the gate bus lines and the source bus lines substantially the same.

The scanning antenna according to the embodiments of the disclosure is housed in a plastic housing as necessary, for example. It is preferable to use a material having a small dielectric constant $\varepsilon_M$ that does not affect microwave transmission and/or reception in the housing. In addition, the housing may include a through-hole provided in a portion thereof corresponding to the transmission and/or reception region R1. Furthermore, the housing may include a light blocking structure such that the liquid crystal material is not exposed to light. The light blocking structure is, for example, provided so as to block light that propagates through the dielectric substrate 1 and/or 51 from the side surface of the dielectric substrate 1 of the TFT substrate 101A and/or the side surface of the dielectric substrate 51 of the slot substrate 201 and is incident upon the liquid crystal layer. A liquid crystal material having a large dielectric anisotropy $\Delta\varepsilon_M$ may be prone to photodegradation, and as such it is preferable to shield not only ultraviolet rays but also short-wavelength blue light from among visible light.

By using a light-blocking tape such as a black adhesive tape, for example, the light blocking structure can be easily formed in necessary locations.

INDUSTRIAL APPLICABILITY

Embodiments according to the disclosure are used in scanning antennas for satellite communication or satellite broadcasting that are mounted on mobile bodies (ships, aircraft, and automobiles, for example) or the manufacture thereof.

REFERENCE SIGNS LIST

1 Dielectric substrate
3 Gate metal layer
3C Auxiliary capacitance counter electrode
3G Gate electrode
3c, 3g, 3p1, 3p2, 3s Lower connection section
3sc CS bus line connection section
3sg Source lower connection wiring line
3sgG Gate bus line connection section
4 Gate insulating layer
4a, 4c, 4g, 4p1, 4p2, 4s Opening
4sc1, 4sg1 Opening
5 Semiconductor layer
6D Drain contact portion
6S Source contact portion
7 Source metal layer
7C Auxiliary capacitance electrode
7D Drain electrode
7S Source electrode
7c, 7g, 7p1, 7p2, 7s Lower connection section
7sc CS lower connection wiring line
7sg Source bus line connection section
7sgG Gate lower connection wiring line
11 Interlayer insulating layer
11d Defect
11a, 11c, 11g, 11p1, 11p2 Opening
11s, 11sc1, 11sc2, 11sg1, 11sg2 Opening
15 Patch electrode
19 Upper conductive layer
19a Patch conductive portion
19c, 19g, 19p1, 19p2, 19s Upper connection section
19sc, 19sg Upper connection section
20 Base insulating layer
51 Dielectric substrate
52 Third insulating layer
54 Dielectric layer (air layer)
55 Slot electrode
55L Lower layer
55M Main layer
55U Upper layer
57 Slot
58 Fourth insulating layer
60 Upper connection section
65 Reflective conductive plate
70 Power feed device
71 Conductive beads
72 Power feed pin
73 Sealing portion
80, 81, 82, 83 Resist Layer
101A, 102A TFT substrate
101R, 102R TFT substrate
201 Slot substrate
301 Waveguide
1000A Scanning antenna CH_a, CH_c, CH_g Contact hole
CH_p1, CH_p2, CH_s, CH_sc1, CH_sc2 Contact hole
CH_sg1, CH_sg2 Contact hole
CL CS bus line
CT CS terminal section
GD Gate driver
GL Gate bus line
GT Gate terminal section
IT Terminal section
LC Liquid crystal layer
PT Transfer terminal section
PT1 First transfer terminal section
PT2 Second transfer terminal section
R1 Transmission and/or reception region
R2 Non-transmission and/or reception region
R2a First non-transmission and/or reception region
R2b Second non-transmission and/or reception region
Rs Seal region
S1 Lower source metal layer
S2 Upper source metal layer
SC CS-source connection section
SD Source driver
SG Source-gate connection section
SL Source bus line
ST Source terminal section
U Antenna unit, antenna unit region

The invention claimed is:

1. A manufacturing method of a TFT substrate, the TFT substrate including
a dielectric substrate, and a plurality of antenna unit regions arrayed on the dielectric substrate, each of the plurality of antenna unit regions including a TFT and a patch electrode electrically connected to a drain electrode of the TFT,
each of a source electrode and the drain electrode of the TFT including a lower source metal layer including at least one element selected from the group consisting of Ti, Ta, and W, and an upper source metal layer formed on the lower source metal layer and including Cu or Al, the manufacturing method of the TFT substrate comprising the steps of:
(a) forming a semiconductor layer of the TFT and a contact layer in contact with a top surface of the semiconductor layer on the dielectric substrate;
(b) forming a lower conductive film including at least one element selected from the group consisting of Ti, Ta, and W on the contact layer;
(c) forming an upper conductive film including Cu or Al on the lower conductive film;
(d) forming a first resist layer on the upper conductive film;
(e) forming the upper source metal layer by etching the upper conductive film with the first resist layer as an etching mask;
(f) forming the lower source metal layer by etching the lower conductive film;
(g) removing the first resist layer and forming a second resist layer covering the upper source metal layer after the step (e); and
(h) forming a source contact portion connecting the semiconductor layer and the source electrode, and a drain contact portion connecting the semiconductor layer and the drain electrode by etching the contact layer by dry etching with the second resist layer as an etching mask.

2. The manufacturing method of the TFT substrate according to claim 1,
wherein the step (e) and the step (f) include the step of forming the upper source metal layer and the lower source metal layer such that the edge of the lower source metal layer does not enter inside the edge of the upper source metal layer when viewed from the normal direction of the dielectric substrate.

3. The manufacturing method of the TFT substrate according to claim 1,
wherein the patch electrode includes the lower source metal layer and the upper source metal layer.

4. The manufacturing method of the TFT substrate according to claim 1,
wherein the step (f) includes the step of forming the lower source metal layer by etching the lower conductive film with the second resist layer as an etching mask after the step (g).

5. The manufacturing method of the TFT substrate according to claim 4,
wherein the step (g) includes the step of forming the second resist layer such that an edge of the second resist layer is outside an edge of the upper source metal layer when viewed from a normal direction of the dielectric substrate, and a distance of the edge of the second resist layer from the edge of the upper source metal layer is not less than five times a thickness of the lower conductive film.

6. The manufacturing method of the TFT substrate according to claim 1,
wherein the step (f) includes the step of forming the lower source metal layer by etching the lower conductive film with the first resist layer as an etching mask prior to the step (g), and
the step (g) includes the step of forming the second resist layer covering the upper source metal layer and the lower source metal layer after the step (e) and the step (f).

7. The manufacturing method of the TFT substrate according to claim 6,
wherein an etching rate of the lower conductive film in the step (f) is less than or equal to an etching rate of the upper conductive film in the step (e).

8. A manufacturing method of a TFT substrate, the TFT substrate including
a dielectric substrate, and a plurality of antenna unit regions arrayed on the dielectric substrate, each of the plurality of antenna unit regions including a TFT and a patch electrode electrically connected to a drain electrode of the TFT,
each of a source electrode and the drain electrode of the TFT including a lower source metal layer including at least one element selected from the group consisting of Ti, Ta, and W, and an upper source metal layer formed on the lower source metal layer and including Cu or Al, the manufacturing method of the TFT substrate comprising the steps of:
(a) forming a semiconductor layer of the TFT and a contact layer in contact with a top surface of the semiconductor layer on the dielectric substrate;
(b) forming a lower conductive film including at least one element selected from the group consisting of Ti, Ta, and W on the contact layer;
(c) forming an upper conductive film including Cu or Al on the lower conductive film;
(d) forming a resist layer on the upper conductive film;
(e) forming the upper source metal layer by etching the upper conductive film with the resist layer as an etching mask such that an edge of the upper source metal layer is inside an edge of the resist layer when viewed from a normal direction of the dielectric substrate, and a distance of the edge of the upper source metal layer from the edge of the resist layer is not less than 1.2 times a thickness of the upper source metal layer;
(f) forming the lower source metal layer by etching the lower conductive film with the resist layer as an etching mask; and
(g) forming a source contact portion connecting the semiconductor layer and the source electrode, and a drain contact portion connecting the semiconductor layer and the drain electrode by etching the contact layer by dry etching with the resist layer as an etching mask after the step (e).

9. The manufacturing method of the TFT substrate according to claim 8,
wherein the step (f) includes the step of etching the lower conductive film by using a same etchant as an etchant of the contact layer in the step (g).

10. The manufacturing method of the TFT substrate according to claim 8,
wherein the step (f) includes the step of etching the lower conductive film by using a same etchant as an etchant of the upper conductive film in the step (e).

11. The manufacturing method of the TFT substrate according to claim 8,
wherein the step (e) and the step (f) include the step of forming the upper source metal layer and the lower source metal layer such that the edge of the lower source metal layer does not enter inside the edge of the upper source metal layer when viewed from the normal direction of the dielectric substrate.

12. The manufacturing method of the TFT substrate according to claim 8,
wherein an etching rate of the lower conductive film in the step (f) is less than or equal to an etching rate of the upper conductive film in the step (e).

13. The manufacturing method of the TFT substrate according to claim 12,
wherein the step (f) includes the step of forming the lower source metal layer such that the edge of the lower source metal layer is inside the edge of the resist layer when viewed from the normal direction of the dielectric substrate, and the distance of the edge of the lower source metal layer from the edge of the resist layer is not less than 1.8 times a thickness of the upper source metal layer.

14. A TFT substrate comprising:
a dielectric substrate; and
a plurality of antenna unit regions arrayed on the dielectric substrate, each of the plurality of antenna unit regions including a TFT and a patch electrode electrically connected to a drain electrode of the TFT,
the TFT including:
a semiconductor layer;
a gate electrode;
a gate insulating layer formed between the gate electrode and the semiconductor layer;
a source electrode and the drain electrode formed on the semiconductor layer and electrically connected to the semiconductor layer;
a source contact portion formed between the semiconductor layer and the source electrode; and a drain contact portion formed between the semiconductor layer and the drain electrode, wherein each of the source electrode and the drain electrode includes a lower source metal layer including at least one element selected from the group consisting of Ti, Ta, and W, and an upper source metal layer formed on the lower source metal layer and including Cu or Al, an edge of the lower source metal layer is not inside an edge of the upper source metal layer when viewed from a normal direction of the dielectric substrate, and the patch electrode includes the lower source metal layer and the upper source metal layer.

15. The TFT substrate according to claim 14, further comprising an interlayer insulating layer covering the TFT, wherein the semiconductor layer is located on the gate electrode, and the patch electrode is covered by the interlayer insulating layer.

16. The TFT substrate according to claim 14, further comprising an interlayer insulating layer covering the TFT, wherein the gate electrode is located on the source electrode and the drain electrode, and the gate insulating layer and/or the interlayer insulating layer include an opening overlapping the patch electrode when viewed from the normal direction of the dielectric substrate.

17. The TFT substrate according to claim 16, further comprising an upper conductive layer formed on the interlayer insulating layer, wherein the gate insulating layer includes a first opening at least reaching the patch electrode, the interlayer insulating layer includes a second opening overlapping the first opening when viewed from the normal direction of the dielectric substrate, and the upper conductive layer includes a patch conductive portion covering the patch electrode exposed in the first opening.

18. A scanning antenna comprising:

a TFT substrate, including:

a dielectric substrate; and a plurality of antenna unit regions arrayed on the dielectric substrate, each of the plurality of antenna unit regions including a TFT and a patch electrode electrically connected to a drain electrode of the TFT, the TFT including:

a semiconductor layer;

a gate electrode;

a gate insulating layer formed between the gate electrode and the semiconductor layer;

a source electrode and the drain electrode formed on the semiconductor layer and electrically connected to the semiconductor layer;

a source contact portion formed between the semiconductor layer and the source electrode; and a drain contact portion formed between the semiconductor layer and the drain electrode, each of the source electrode and the drain electrode includes a lower source metal layer including at least one element selected from the group consisting of Ti, Ta, and W, and an upper source metal layer formed on the lower source metal layer and including Cu or Al, and an edge of the lower source metal layer is not inside an edge of the upper source metal layer when viewed from a normal direction of the dielectric substrate;

a slot substrate disposed to face the TFT substrate;

a liquid crystal layer provided between the TFT substrate and the slot substrate; and a reflective conductive plate disposed to face a surface of the slot substrate on a side opposite to the liquid crystal layer with a dielectric layer interposed between the reflective conductive plate and the surface, wherein the slot substrate includes another dielectric substrate and a slot electrode formed on a surface of the another dielectric substrate on a side of the liquid crystal layer, and the slot electrode includes a plurality of slots, each of the plurality of slots being arranged corresponding to the patch electrode of each of the plurality of antenna unit regions of the TFT substrate.

* * * * *